US011422102B2

(12) United States Patent
Christophersen

(10) Patent No.: US 11,422,102 B2
(45) Date of Patent: Aug. 23, 2022

(54) MULTISPECTRAL IMPEDANCE MEASUREMENTS ACROSS STRINGS OF INTERCONNECTED CELLS

(71) Applicant: Dynexus Technology, Inc., Loveland, CO (US)

(72) Inventor: Jon P. Christophersen, Moscow, ID (US)

(73) Assignee: Dynexus Technology, Inc., Loveland, CO (US)

( * ) Notice: Subject to any disclaimer, the term of this patent is extended or adjusted under 35 U.S.C. 154(b) by 0 days.

(21) Appl. No.: 17/144,704

(22) Filed: Jan. 8, 2021

(65) Prior Publication Data

US 2021/0215628 A1 Jul. 15, 2021

Related U.S. Application Data

(60) Provisional application No. 62/959,711, filed on Jan. 10, 2020.

(51) Int. Cl.
*G01N 27/02* (2006.01)
*G01R 31/385* (2019.01)
(Continued)

(52) U.S. Cl.
CPC ......... *G01N 27/026* (2013.01); *G01N 27/416* (2013.01); *G01R 31/367* (2019.01); *G01R 31/385* (2019.01)

(58) Field of Classification Search
CPC .. G01N 27/026; G01N 27/416; G01R 31/385; G01R 31/367
(Continued)

(56) References Cited

U.S. PATENT DOCUMENTS 4,498,044 A 2/1985 Horn
4,697,134 A 9/1987 Burkum et al.
(Continued)

FOREIGN PATENT DOCUMENTS

EP 2447728 B1 6/2013
JP 2000-009817 A 1/2000
(Continued)

OTHER PUBLICATIONS

Dung et al. ILP-Based Algorithm for Lithium-Ion Battery Charging Profile. IEEE, 2010, pp. 2286-2291.
(Continued)

*Primary Examiner* — Patrick Assouad
*Assistant Examiner* — Trung Q Nguyen
(74) *Attorney, Agent, or Firm* — Craig R. Miles; CR Miles P.C.

(57) ABSTRACT

An in-line rapid impedance measurement device and methods of performing in-line rapid impedance spectroscopy including a switch network operable under a switching algorithm useful to rapidly perform targeted impedance measurements to assess state of health, defect or failure of battery packs or modules having a plurality of electrochemical cells interconnected in series or parallel and to isolate individual cells within a pack or module to distinguish between non-repeatable anomalous impedance measurements from repeatable deviant impedance measurements and identify the source of deviant impedance measurements.

7 Claims, 23 Drawing Sheets

(51) Int. Cl.
*G01R 31/367* (2019.01)
*G01N 27/416* (2006.01)

(58) Field of Classification Search
USPC ............... 324/691, 430, 434; 320/117–127
See application file for complete search history.

(56) References Cited

U.S. PATENT DOCUMENTS

| | | | |
|---|---|---|---|
| 5,061,890 A | 10/1991 | Longini | |
| 5,261,007 A | 11/1993 | Hirsch | |
| 5,281,920 A | 1/1994 | Wurst | |
| 5,349,535 A | 9/1994 | Gupta | |
| 5,406,496 A | 4/1995 | Quinn | |
| 5,457,377 A | 10/1995 | Jonsson | |
| 5,512,832 A | 4/1996 | Russel et al. | |
| 5,747,456 A | 5/1998 | Chorev et al. | |
| 5,773,978 A | 6/1998 | Becker | |
| 5,821,757 A | 10/1998 | Alvarez et al. | |
| 5,946,482 A | 8/1999 | Barford et al. | |
| 5,969,625 A | 10/1999 | Russo | |
| 6,002,238 A | 12/1999 | Champlin | |
| 6,072,299 A | 6/2000 | Kurle et al. | |
| 6,160,382 A | 12/2000 | Yoon et al. | |
| 6,208,147 B1 | 3/2001 | Yoon et al. | |
| 6,222,369 B1 | 4/2001 | Champlin | |
| 6,249,186 B1 | 6/2001 | Ebihara et al. | |
| 6,262,563 B1 | 7/2001 | Champlin | |
| 6,307,378 B1 | 10/2001 | Kozlowski | |
| 6,313,607 B1 | 11/2001 | Champlin | |
| 6,330,933 B1 | 12/2001 | Boeckman et al. | |
| 6,340,889 B1 | 1/2002 | Sakurai | |
| 6,359,419 B1 | 3/2002 | Verbrugge et al. | |
| 6,417,669 B1 | 7/2002 | Champlin | |
| 6,472,847 B2 | 10/2002 | Lundberg | |
| 6,481,289 B2 | 11/2002 | Dixon et al. | |
| 6,519,539 B1 | 2/2003 | Freeman et al. | |
| 6,532,425 B1 | 3/2003 | Boost et al. | |
| 6,542,077 B2 | 4/2003 | Joao | |
| 6,556,001 B1 | 4/2003 | Wiegand et al. | |
| 6,639,385 B2 | 10/2003 | Verbrugge et al. | |
| 6,646,419 B1 | 11/2003 | Uing | |
| 6,653,817 B2 | 11/2003 | Tate, Jr. et al. | |
| 6,691,095 B2 | 2/2004 | Singh et al. | |
| 6,693,439 B1 | 2/2004 | Liu et al. | |
| 6,778,913 B2 | 8/2004 | Tinnemeyer | |
| 6,816,797 B2 | 11/2004 | Freeman et al. | |
| 6,832,171 B2 | 12/2004 | Barsoukov et al. | |
| 6,839,597 B2 | 1/2005 | Hattori et al. | |
| 6,876,174 B1 | 4/2005 | Samittier Marti et al. | |
| 6,922,058 B2 | 6/2005 | Potempa | |
| 7,019,542 B2 | 3/2006 | Tinnemeyer | |
| 7,051,008 B2 | 5/2006 | Singh et al. | |
| 7,065,474 B2 | 6/2006 | Petchenev et al. | |
| 7,072,871 B1 | 7/2006 | Tinnemeyer | |
| 7,113,853 B2 | 9/2006 | Hecklinger | |
| 7,259,572 B2 | 8/2007 | Houldsworth et al. | |
| 7,349,816 B2 | 3/2008 | Quint et al. | |
| 7,395,163 B1 | 7/2008 | Morrison et al. | |
| 7,567,057 B2 | 7/2009 | Elder et al. | |
| 7,598,700 B2 | 10/2009 | Elder et al. | |
| 7,616,003 B2 | 11/2009 | Satoh et al. | |
| 7,675,293 B2 | 3/2010 | Christophersen et al. | |
| 7,688,036 B2 | 3/2010 | Yarger et al. | |
| 7,688,074 B2 | 3/2010 | Cox et al. | |
| 7,698,078 B2 | 4/2010 | Kelty et al. | |
| 7,898,263 B2 | 3/2011 | Ishida et al. | |
| 7,928,735 B2 | 4/2011 | Huang et al. | |
| 8,035,396 B2 | 10/2011 | Kim | |
| 8,150,643 B1 | 4/2012 | Morrison et al. | |
| 8,193,771 B2 | 6/2012 | Coccio | |
| 8,332,342 B1 | 12/2012 | Saha et al. | |
| 8,352,204 B2 | 1/2013 | Morrison et al. | |
| 8,368,357 B2 | 2/2013 | Ghantous et al. | |
| 8,410,783 B2 | 4/2013 | Staton | |
| 8,415,926 B2 | 4/2013 | Bhardwaj et al. | |
| 8,427,112 B2 | 4/2013 | Ghantous et al. | |
| 8,447,544 B2 | 5/2013 | Hsu et al. | |
| 8,467,984 B2 | 6/2013 | Gering | |
| 8,487,628 B2 | 7/2013 | Sciarretta et al. | |
| 8,513,921 B2 | 8/2013 | Berkowitz et al. | |
| 8,521,497 B2 | 8/2013 | Gering | |
| 8,532,945 B2 | 9/2013 | Sciarretta et al. | |
| 8,548,762 B2 | 10/2013 | Prada et al. | |
| 8,582,675 B1 | 11/2013 | Harris | |
| 8,598,849 B2 | 12/2013 | Bhardwaj et al. | |
| 8,638,070 B2 | 1/2014 | Maluf et al. | |
| 8,648,602 B2 | 2/2014 | van Lammeren | |
| 8,680,868 B2 | 3/2014 | van Lammeren et al. | |
| 8,710,847 B2 | 4/2014 | Marvin et al. | |
| 8,725,456 B1 | 5/2014 | Saha et al. | |
| 8,738,310 B2 | 5/2014 | Swanton | |
| 8,738,311 B2 | 5/2014 | Wu | |
| 8,762,109 B2 | 6/2014 | Christophersen et al. | |
| 8,773,145 B2 | 7/2014 | Phlippoteau et al. | |
| 8,791,669 B2 | 7/2014 | Ghantous et al. | |
| 8,831,897 B2 | 9/2014 | McHardy | |
| 8,838,401 B2 | 9/2014 | Kelly | |
| 8,849,598 B2 | 9/2014 | Mingant et al. | |
| 8,868,363 B2 | 10/2014 | Morrison et al. | |
| 8,878,549 B2 | 11/2014 | Nakanishi et al. | |
| 8,889,309 B2 | 11/2014 | Manabe et al. | |
| 8,901,886 B2 | 12/2014 | Berkowitz et al. | |
| 8,907,631 B1 | 12/2014 | Gurries et al. | |
| 8,907,675 B2 | 12/2014 | Phlippoteau et al. | |
| 8,952,823 B2 | 2/2015 | Xie et al. | |
| 8,970,178 B2 | 3/2015 | Berkowitz et al. | |
| 8,975,874 B2 | 3/2015 | Berkowitz et al. | |
| 9,030,173 B2 | 5/2015 | McHardy et al. | |
| 9,035,621 B2 | 5/2015 | Berkowitz et al. | |
| 9,035,623 B1 | 5/2015 | Berkowitz et al. | |
| 9,063,018 B1 | 6/2015 | Ghantous et al. | |
| 9,121,910 B2 | 9/2015 | Maluf et al. | |
| 9,142,994 B2 | 9/2015 | Berkowitz et al. | |
| 9,207,285 B1 | 12/2015 | Swanton et al. | |
| 9,244,130 B2 | 1/2016 | Morrison et al. | |
| 9,252,465 B2 | 2/2016 | Hariharan | |
| 9,312,577 B2 | 4/2016 | Jamison | |
| 9,373,972 B2 | 6/2016 | Ghantous et al. | |
| 9,385,555 B2 | 7/2016 | Ghantous et al. | |
| 9,461,492 B1 | 10/2016 | Berkowitz et al. | |
| 9,465,077 B2 | 10/2016 | Love et al. | |
| 9,519,031 B2 | 12/2016 | Jamison | |
| 9,669,723 B2 | 6/2017 | Sugeno et al. | |
| 9,851,414 B2 | 12/2017 | Morrison et al. | |
| 10,189,354 B2 | 1/2019 | Brochhaus | |
| 10,345,384 B2 | 7/2019 | Christophersen et al. | |
| 10,379,168 B2 | 8/2019 | Christophersen et al. | |
| 2001/0035756 A1 | 11/2001 | Kozlowski | |
| 2002/0065621 A1 | 5/2002 | Jungerman | |
| 2003/0184307 A1 | 10/2003 | Kozlowski et al. | |
| 2003/0206021 A1 | 11/2003 | Laletin et al. | |
| 2004/0095249 A1 | 5/2004 | Zaccaria | |
| 2004/0162683 A1 | 8/2004 | Verbrugge et al. | |
| 2005/0086070 A1 | 4/2005 | Engelman | |
| 2005/0127908 A1 | 6/2005 | Schlicker et al. | |
| 2005/0182584 A1 | 8/2005 | Plusquellic | |
| 2006/0111854 A1 | 5/2006 | Plett | |
| 2006/0111870 A1 | 5/2006 | Plett | |
| 2006/0170397 A1 | 8/2006 | Srinivasan et al. | |
| 2006/0186890 A1 | 8/2006 | Iwane et al. | |
| 2006/0284617 A1 | 12/2006 | Kozlowski et al. | |
| 2006/0284618 A1 | 12/2006 | Cho et al. | |
| 2007/0172708 A1 | 7/2007 | Takebe et al. | |
| 2007/0182371 A1 | 8/2007 | Boebel | |
| 2007/0182576 A1 | 8/2007 | Proska et al. | |
| 2007/0257681 A1 | 11/2007 | Christophersen et al. | |
| 2008/0303528 A1 | 12/2008 | Kim | |
| 2009/0076752 A1 | 3/2009 | Wang et al. | |
| 2009/0278037 A1 | 11/2009 | Grothe, Jr. | |
| 2010/0010762 A1 | 1/2010 | Seki | |
| 2010/0121511 A1* | 5/2010 | Onnerud | B60L 58/15 701/22 |
| 2010/0121588 A1 | 5/2010 | Elder et al. | |
| 2010/0201320 A1 | 8/2010 | Coe et al. | |

(56) References Cited

U.S. PATENT DOCUMENTS

| | | |
|---|---|---|
| 2010/0207772 A1 | 8/2010 | Yamamoto |
| 2010/0274510 A1 | 10/2010 | Morrison et al. |
| 2010/0332165 A1 | 12/2010 | Morrison et al. |
| 2011/0018543 A1 | 1/2011 | Bos et al. |
| 2011/0077879 A1 | 3/2011 | Paryani |
| 2011/0077880 A1 | 3/2011 | Gering |
| 2011/0082621 A1 | 4/2011 | Berkobin et al. |
| 2011/0169452 A1 | 7/2011 | Cooper et al. |
| 2011/0270559 A1 | 11/2011 | Christophersen et al. |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0217985 A1 | 8/2012 | Amanuma |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0135110 A1 | 5/2013 | Xie et al. |
| 2013/0141109 A1 | 6/2013 | Love et al. |
| 2013/0229156 A1 | 9/2013 | Brandon et al. |
| 2013/0245973 A1 | 9/2013 | Ross, Jr. et al. |
| 2013/0267943 A1 | 10/2013 | Hancock |
| 2014/0125284 A1 | 5/2014 | Qahouq |
| 2014/0188414 A1 | 7/2014 | Jeong et al. |
| 2014/0358462 A1 | 12/2014 | Christophersen et al. |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2015/0280290 A1 | 10/2015 | Saha et al. |
| 2016/0157014 A1 | 6/2016 | Van Schyndel et al. |
| 2016/0157015 A1 | 6/2016 | Van Schyndel |
| 2016/0274060 A1 | 9/2016 | Denenberg et al. |
| 2017/0254859 A1 | 9/2017 | Christophersen et al. |
| 2018/0143257 A1 | 5/2018 | Garcia et al. |
| 2019/0214937 A1 | 7/2019 | Schmidt |

FOREIGN PATENT DOCUMENTS

| | | |
|---|---|---|
| JP | 2003-090869 A | 3/2003 |
| JP | 2003-223918 A | 8/2003 |
| JP | 2007-085772 A | 4/2007 |
| JP | 2011-174925 A | 9/2011 |
| JP | 2012-078287 A | 4/2012 |
| JP | 2013-517755 A | 5/2013 |
| JP | 014-106119 A | 6/2014 |
| JP | 2015-078992 A | 4/2015 |
| WO | 2004/106946 A2 | 12/2004 |
| WO | 2010/144834 A2 | 12/2010 |
| WO | 2010/144857 A2 | 12/2010 |
| WO | 2011/041094 A1 | 4/2011 |
| WO | 2011/140123 A1 | 11/2011 |
| WO | 2011/140131 A1 | 11/2011 |
| WO | WO 2012/025706 A1 | 3/2012 |
| WO | 2013/085996 A1 | 6/2013 |
| WO | 2014/070831 A1 | 5/2014 |
| WO | 2015/029647 A1 | 3/2015 |
| WO | 2016/012922 A1 | 1/2016 |
| WO | WO 2017/003917 A1 | 1/2017 |
| WO | 2020/223630 | 11/2020 |
| WO | 2020/223651 | 11/2020 |

OTHER PUBLICATIONS

Farmann et al. Critical review of on-board capacity estimation techniques for lithium-ion batteries in electric and hybrid electric vehicles. Journal of Power Sources, May 2015, 281:114-130.

Goebel et al. Prognostics in Battery Health Management. IEEE Instrumentation & Measurement Magazine, Sep. 2008, 11(4):33-40.

Gopalakrishnan et al. Electrochemical impedance spectroscopy characterization and parameterization of lithium nickel manganese cobalt oxide pouch cells: dependency analysis of temperature and state of charge. Ionics 25(1), Jan. 2019 (published online Jun. 2018, Springer, Germany), 14 pages.

Gould et al. New Battery Model and State-of-Health Determination Through Subspace Parameter Estimation and State-Observer Techniques. IEEE Transactions on Vehicular Technology, Oct. 2009, 58(8):3905-3916.

Guha et al. Remaining Useful Life Estimation of Lithium-Ion Batteries based on the Internal Resistance Growth Model. Indian Control Conference (ICC), Jan. 2017, pp. 33-38.

Hariprakash et al. Monitoring sealed automotive lead-acid batteries by sparse-impedance spectroscopy. Proc. Indian Acad. Sci. (Chem. Sci.), Oct. 2003, 115(5):465-472.

Hariprakash et al. On-line monitoring of lead-acid batteries by galvanostatic non-destructive technique. Journal of Power Sources, Oct. 2004, 137(1):128-133.

Harting et al. State-of-Health Diagnosis of Lithium-Ion Batteries Using Nonlinear Frequency Response Analysis. Journal of the Electrochemical Society, Jan. 2019, 166(2):A277-A285.

Hill et al. Steady State Frequency Response Utilizing an Enhanced Chirp Test Signal. 2019 IEEE Aerospace Conference, Mar. 2019, pp. 1-8.

Hlavac et al. VRLA Battery Monitoring Using Conductance Technology. IEEE, 12-3 (1995) pp. 284-291.

Howey et al. On-line measurement of battery impedance using motor controller excitation. IEEE Transactions on Vehicular Technology, Jul. 2014, 63(6):2557-2566.

Huang et al. An Online Battery Impedance Measurement Method Using DC-DC Power Converter Control. IEEE Transactions on Industrial Electronics, Nov. 2014, 61(11):5987-5995.

Karden et al. A method for measurement of interpretation of impedance spectra for industrial batteries. Journal of Power Sources, Jan. 2000, 85(1):72-78.

Kolmel et al. Quality-oriented production planning of battery assembly systems for electric mobility. Procedia CIRP 23, Dec. 2014, pp. 149-154.

Kozlowski A Novel Online Measurement Technique for AC Impedance of Batteries and Other Electrochemical Systems. The Sixteenth Annual Battery Conference on Applications and Advances (Proceedings), Jan. 2001, pp. 257-262.

Kozlowski. Electrochemical Cell Prognostics using Online Impedance Measurements and Model-Based Data Fusion Techniques. Aerospace Conference, 2003 Proceedings, vol. 7-3257, Mar. 2003, 14 pages.

Lamb et al. Determination of Battery Stability With Advanced Diagnostics. SAND2017-6959, Unlimited Release, Jul. 2017, 56 pages.

Lamb et al. Determination of Battery Stability With Advanced Diagnostics. (Report No. DOT HS 812 249), Washington, DC: National Highway Traffic Safety Administration, Mar. 2016, 42 pages.

Le et al. Lithium-ion Battery State of Health Estimation Using Ah-V Characterization. Annual Conference of the Prognostics and Health Management Society, 2011, 3(1), 7 pages.

Li et al. Understanding the molecular mechanism of pulse current charging for stable lithium-metal batteries. Science Advances, Jul. 2017, 3(7), 10 pages.

Love et al. State-of-Health Monitoring of 18650 4S Packs With a Single-Point Impedance Diagnostic. Journal of Power Sources, Oct. 2014, 266:512-519.

Lu et al. A review on the key issues for lithium-ion battery management in electric vehicles. Journal of Power Sources, Mar. 2013, 226:272-288.

Mingant et al. Towards onboard Li-ion battery state-of-health diagnosis by a virtual sensor. World Electric Vehicle Journal, May 2012, 5(2):405-411.

Novak. Developing an advanced, predictive battery health monitoring solution with a low-cost microcontroller solution. Texas Instruments, White Paper, Sep. 2012, 6 pages.

(56) References Cited

OTHER PUBLICATIONS

Noworolski et al. Reducing and Utilizing Electrical Noises for Battery Monitoring Purposes. IEEE 32-4 (Sep. 2004), pp. 511-614.

Okoshi et al. Battery condition monitoring (BCM) technologies about lead-acid batteries. Journal of Power Sources, Aug. 2006, 158(2):874-878.

Pastor-Fernandez et al. A Comparison between EIS and IC-DV as Li-ion Diagnostic Techniques to Identify and Quantify the Effects of Degradation Modes within BMS. Journal of Power Sources, Aug. 2017, 360:301-318.

Pastor-Fernandez et al. A Study of Cell-to-Cell Interactions and Degradation in Parallel Strings: Implications for the Battery Management System. Journal of Power Sources, Oct. 2016, 329:574-585.

Perez e t al. Guidelines for the characterization of the internal impedance of lithium-ion batteries in PHM algorithms. International Journal of Prognostics and Health Management, Apr. 2018, ISSN 2153-2648, 11 pages.

Piret et al. Tracking of electrochemical impedance of batteries. Journal of Power Sources, Apr. 2016, 312:60-69.

Pop et al. State-of-the-art of battery state-of-charge determination. Measurement Science and Technology, Dec. 2005, 16(4) R93-R110.

Qnovo. Fundamentals of Qnovo Adaptive Charging in Lithium Ion Batteries, http://qnovo.com/wp2-content/uploads/2015/12/Qnovo_TechWhitePaper_v2.4.pdf, Dec. 2015, 13 pages.

Rahmoun et al. Determination of the Impedance of Lithium-Ion Batteries using Methods of Digital Signal Processing. Energy Procedia, Dec. 2014, 46:204-213.

Raijmakers et al. Crosstalk Interferences on Impedance Measurements in Battery Packs. IFAC-PapersOnline, Jun. 2016, 49(11):042-047.

Saha et al. Comparison of Prognostic Algorithms for Estimating Remaining Useful Life of Batteries. Transactions of the Institute of Measurement and Control, Jun. 2009, 31(3), 10 pages.

Saha et al. Prognostics Methods for Battery Health Monitoring Using a Bayesian Framework. IEEE Transactions on Instrumentation and Measurement, Feb. 2009, 58(2):291-296.

Salehen et al. Development of battery management systems (BMS) for electric vehicles (EVs) in Malaysia. MATEC Web of Conferences, Jan. 2017, 90(11):01001, 8 pages.

Sazhin et al. Enhancing Li-Ion Battery Safety by Early Detection of Nascent Internal Shorts. Journal of the Electrochemical Society, Jan. 2017, 164(1):A6281-A6287.

Schweiger et al. Comparison of Several Methods for Determining the Internal Resistance of Lithium Ion Cells. Sensors, Jun. 2010, 10(6):5604-5625.

Singh et al. Fuzzy logic modeling of EIS measurements on lithium-ion batteries. Electrochimica Acta, Jan. 2006, 51(8):1673-1679.

Socher et al. Improving the functional safety of automotive batteries using in-situ impedance spectroscopy. Transportation Research Procedia, Dec. 2016, 14:3661-3666.

Srivastav et al. State-of-charge indication in Li-ion batteries by simulated impedance spectroscopy. J Appl Electrochem, Feb. 2017, 47(2):229-236.

Sternad et al. Condition monitoring of Lithium-Ion Batteries for electric and hybrid electric vehicles. Elektrotechnik & Informationstechnik, May 2009, 126(5):186-193.

Stroe et al. Diagnosis of Lithium-Ion Batteries State-of-Health based on Electrochemical Impedance Spectroscopy Technique. Proceedings of the 2014 Energy Conversion Congress and Exposition (ECCE) IEEE Press, Sep. 2014, pp. 1576-4582.

Jespersen et al. Capacity Measurements of Li-Ion Batteries using AC Impedance Spectroscopy. EVS24 International Battery, Hybrid and Fuel Cell Electric Vehicle Symposium, May 2009, in: 2009 World Electric Vehicle Journal, 3(1):0127-0133.

Jiang et al. Electrochemical impedance spectra for lithium-ion battery ageing considering the rate of discharge ability. Energy Procedia, May 2017, 105:844-849.

Kiel et al. Extensive Validation of a Nonintrusive Continuous Battery Monitoring Device. Battcon 2008, in: Proc. BattCon Conference May 2008, pp. 18-1-18-10.

Mingant et al. Novel state-of-health diagnostic method for Li-ion battery in service. Applied Energy, Elsevier, Dec. 2016, 183:390-398.

Perez et al. Guidelines for the Characterization of the Internal Impedance of Lithium-Ion Batteries in PHM Algorithms. International Journal of Prognostics and Health Management, Apr. 2018, 9, 11 pages.

Remy et al. Qualification and Life Testing of Li-ion VES16 Batteries. E3S Web of Conferences 16, Jan. 2017, 8 pages.

Seo et al. Detection of internal short circuit in Li-ion battery by estimating its resistance. Proceedings of the 4th IIAE International Conference on Intelligent Systems and Image Processing, Jan. 2016, 6 pages.

Taberna et al. Electrochemical Characteristics and Impedance Spectroscopy Studies of Carbon-Carbon Supercapacitors. Journal of the Electrochemical Society, Jan. 2003, 150(3):A292-A300.

Tachibana et al. Development of in situ a.c. impedance measurement system under constant-current conditions and its application to galvanostatic discharge of electrolytic manganese dioxide in alkaline solution. Journal of Power Sources, Jul. 1998, 74(1):29-33.

Tang et al. Temperature Dependent Performance and in Situ AC Impedance of High-Temperature PEM Fuel Cells Using the Nafion-112 Membrane. Journal of the Electrochemical Society, Sep. 2006, 153(11):A2036-A2043.

Varnosfaderani et al. A Comparison of Online Electrochemical Spectroscopy Impedance Estimation of Batteries. IEEE Access, Feb. 2018, vol. 6, pp. 23668-23677.

Verizon. Verizon NEBSTM Compliance: Qualification Requirements for Lithium Ion (Li-ion) Cells Batteries and Battery Strings. Verizon Technical Purchasing Requirements VZ.TPR.9810, Sep. 2015, Issue 1, 29 pages.

Waligo et al. A Comparison of the Different Broadband Impedance Measurement Techniques for Lithium-Ion Batteries. Energy Conversion congress and Exposition (ECCE), IEEE (Sep. 2016), 7 pages.

Waters. Monitoring the state of health of VRLA batteries through ohmic measurements. Proceedings of Power and Energy Systems in Converging Markets, Oct. 1997, 6 pages.

Weng et al. On-board state of health monitoring of lithium-ion batteries using incremental capacity analysis with support vector regression. Journal of Power Sources, Aug. 2013, 235:36-44.

Wu et al. A Review on Fault Mechanisms and Diagnosis Approach for Li-Ion Batteries. Journal of Nanomaterials, Oct. 2015, vol. 2015, Article ID 631263, 10 pages.

Xing et al. Battery Management Systems in Electric and Hybrid Vehicles. Energies, Oct. 2011, 4(11):1840-1857.

Xing et al. Prognostics and Health Monitoring for Lithium-ion Battery. Proceedings of the IEEE International Conference on Intelligence and Security Informatics, Jul. 2011, pp. 242-247.

Yamada et al. The intelligent automotive battery, 'CYBOX'. Journal of Power Sources, Dec. 2008, 185(2):1478-1483.

Yoo et al. An Electrochemical Impedance Measurement Technique Employing Fourier Transform. Analytical Chemistry, May 2000, 72(9):2035-2041.

Zechang et al. Battery Management Systems in the China-made 'Start' series FCHVs. IEEE Vehicle Power and Propulsion Conference (VPPC) (Sep. 2008) 6 pages.

Zenati et al. Estimation of the SOC and the SOH of li-ion batteries, by combining impedance measurements with the fuzzy logic inference. Proceedings of the 36th Annual Conference of IEEE Industrial Electronics, Nov. 2010, pp. 1767-1772.

Zhai et al. The Application of the EIS in Li-ion Batteries Measurement. Journal of Physics: Conference Series, Oct. 2006, 48(1):1157-1161.

Zhang et al. Cycling degradation of an automotive LiFePO4 lithium-ion battery. Journal of Power Sources, Feb. 2011, 196(3):1513-1520.

Zhang et al. Prediction of Lithium-Ion Battery's Remaining Useful Life Based on Relevance Vector Machine. SAE Int. J. Alt. Power, May 2016, 5(1):30-40.

(56) References Cited

OTHER PUBLICATIONS

Zhang et al. Remote Vehicle State of Health Monitoring and its Application to Vehicle No Start Prediction, 2009 IEEE Autotestcon, Oct. 2009, pp. 88-93.
Zhu et al. PSpice Simulation via AC Impedance for PEFC at Operational Loads. http://folk.ntnu.no/skoge/prosl/proceedings/aiche-2005/topical/pdffiles/T1/papers/215c.pdf, 2005, 3 pages.
Zhu et al. In-Situ Electrical Characterization of PEM Fuel Cells at Load. American Institute of Chemical Engineers, 2007, 5 pages.
Zhu et al. In-Stu Assessment of PEM Fuel Cells via AC Impedance at Operational Loads. http://folk.ntnu.no/skoge/prost/proceedings/aiche-2004/pdffiles/papers/014g.pdf, 2004, 5 pages.
Zou et al. Combined State of Charge and State of Health estimation over lithium-ion battery cell cycle lifespan for electric vehicles. Journal of Power Sources, Jan. 2015, 273:793-803.
Morrison et al. An Advanced Calibration Procedure for Complex Impedance Spectrum Measurements of Advanced Energy Storage. 58th International Instrumentation Symposium, Jun. 2012, INL/CON-12-24519, 17 pages.
Morrison et al. Fast Summation Transformation for Battery Impedance Identification. IEEE Aerospace Conference, Mar. 2009, 9 pages.
Morrison et al. Real Time Estimation of Battery Impedance. IEEE Aerospace Conference, Mar. 2006, 13 pages.
Morrison. DC Buffering and Floating Current for a High Voltage IMB Application. INL/EXT-14-32858, Aug. 2014, 8 pages.
Morrison. Development and Implementation of a Calibration Procedure for Complex Impedance Spectrum Measurements with Applications to Embedded Battery Health Monitoring and Management Systems. University of Connecticut Master's Thesis, 2012, 119 pages.
Morrison. Signals and Systems: State Variable Description of Linear Time Invariant Systems. Montana Tech Digital Commons, Sep. 2013, Chapter 17, pp. 198-216.
Morrison. Signals and Systems: Synchronous Detection. Montana Tech Digital Commons, Sep. 2013, Chapter 20, pp. 243-246.
Motloch et al. High-Power Battery Testing Procedures and Analytical Methodologies for HEV's. 7, SAE Int. Passenger Cars Electron. Electr. Syst., vol. 111 (2002), pp. 797-802.
Nikolopoulos et al. Accurate Method of Representation of High-Voltage Measuring Systems and its Application in High-Impulse-Voltage Measurements. IEEE, Mar. 1989, 136(2):66-72.
Piller et al. Methods for state-of-charge determination and their applications. Journal of Power Sources, Jun. 2001, 96(1):113-120.
Qahouq et al. Single-Perturbation-Cycle Online Battery Impedance Spectrum Measurement Method With Closed-Loop Control of Power Converter. IEEE Transactions on Industrial Electronics, Sep. 2017, 64(9):7019-7029.
Qahouq. Online Battery Impedance Spectrum Measurement Method. IEEE Applied Power Electronics Conference and Exposition, Mar. 2016, pp. 3611-3615.
Ramos et al. Comparison of impedance measurements in a DSP using ellipse-fit and seven-parameter sine-fit algorithms. Measurement, May 2009, 42(9):1370-1379.
Ran et al. Prediction of State of Charge of Lithium-ion Rechargeable Battery with Electrochemical Impedance Spectroscopy Theory. 5th IEEE Conference on Industrial Electronics and Applications, Jul. 2010, pp. 684-688.
Ranade et al. An overview of harmonics modeling and simulation, Tutorial on Harmonics Modeling and Simulation. IEEE Power Engineering Society, 1998, Chapter 1, 7 pages.
Ranieri et al. Electronic Module for the Thermal Monitoring of a Li-ion Battery Cell through the Electrochemical Impedance Estimation. 22nd International Workshop on Thermal Investigations of ICs and Systems, Sep. 2016, pp. 294-297.
Smith et al. Model Validation Approaches for Nonlinear Feedback Systems Using Frequency Response Measurements. IEEE Proceedings of the 38th IEEE Conference on Decision and Control, Dec. 1999, vol. 2, pp. 1500-1504.
Smyth. Development of a Real Time Battery Impedance Measuring System. M.S. Thesis, Montana Tech of the University of Montana, 2008, 128 pages.
Thomas et al. Statistical methodology for predicting the life of lithium-ion cells via accelerated degradation testing. Journal of Power Sources, Sep. 2008, 184(1):312-317.
Unkelhaeuser et al. Electrochemical Storage System Abuse Test Procedure Manual. United States Advanced Battery Consortium, SAND99-0497, Jul. 1999, 33 pages.
Varnosfaderani et al. Online Impedance Spectroscopy Estimation of a dc-dc converter connected Battery using an Earth Leakage Monitoring Circuit. 19th European Conference on Power Electronics and Applications, Sep. 2017, pp. P.1-P.10.
Verbrugge et al. Adaptive state of charge algorithm for nickel metal hydride batteries including hysteresis phenomena. Journal of Power Sources, Feb. 2004, 126(1-2):236-249.
Verbrugge. Adaptive, multi-parameter battery state estimator with optimized time-weighting factors. J Appl Electrochem, May 2007, 37(5):605-616.
Wang et al. State Estimation of Lithium ion Battery Based on Electrochemical Impedance Spectroscopy with On-board Impedance Measurement System. IEEE Vehicle Power and Propulsion Conference, Oct. 2015, 5 pages.
Zhu et al. PSpice Simulation via AC Impedance for PEFC at Operational Loads. http://folk.ntnu.no/skoge/prost/proceedings/aiche-2005/topical/pdffiles/T1/papers/215c.pdf, 2005, 3 pages.
Ziemer et al. Signals and Linear System Analysis, Chapter 2, pp. 16-100, in: Principles of Communications, 5th edition, John Wiley & Sons.
Solartron Analytical. 1260 Impedance/Gain-Phase Analyzer. Operating Manual, Jan. 1996, 215 pages.
Solartron Analytical. 1287 Electrochemical Interface, User Guide, Aug. 2002, 134 pages.
Ineel. FreedomCAR Battery Test Manual for Power-Assist Hybrid Electric Vehicles. Oct. 2003, DOE/ID-11069, 130 pages.
Ineel. FreedomCAR Ultracapacitor Test Manual. DOE/ID-11173, Revision 0, Sep. 2004, 116 pages.
Idaho National Laboratory. Battery Test Manual for Plug-In Hybrid Electric Vehicles, INL/EXT-07-12536, Revision 0, Mar. 2008, 68 pages.
Idaho National Laboratory. Battery Test Manual for Plug-In Hybrid Electric Vehicles, INL/EXT-07-12536, Revision 2, Dec. 2010, 71 pages.
Katayama et al. Real-Time Electrochemical Impedance Diagnosis for Fuel Cells Using a DC-DC Converter. IEEE Transactions on Energy Conversion, Jun. 2015, 30(2):707-713.
Koch et al. Electrochemical Impedance Spectroscopy for Online Battery Monitoring—Power Electronics Control. 16th European Conference on Power Electronics and Applications, 2014, 10 pages.
Koch et al. Impedance Spectroscopy for Battery Monitoring with Switched Mode Amplifiers. 16th International Power Electronics and Motion Control Conference and Exposition, Sep. 2014, pp. 496-501.
Koch et al. On-line Electrochemical Impedance Spectroscopy Implementation for Telecommunication Power Supplies. IEEE International Telecommunications Energy Conference, 2015, 6 pages.
U.S. Department of Energy. Battery Calendar Life Estimator Manual: Modeling and Simulation. U.S. Department of Energy Vehicle Technologies Program, Revision 1, Oct. 2012, INL-EXT-08-15136, 84 pages.
Aglzim et al. Characterization of the Resistance of a Fuel Cell on Load by Electrochemical Impedance Spectroscopy. Proceedings from the EUROCON Conference, IEEE 2007, pp. 1489-1492.
Albrecht. Battery Complex Impedance Identification with Random Signal Techniques. MS Thesis, Montana Tech of the University of Montana, May 2005, 99 pages.
Ashtiani. Battery Hazard Modes and Risk Mitigation Analysis. USABC Version 0.0, Aug. 2007, 10 pages.
Bald. Rapid Impedance Measurements for 50-V Battery Modules. Montana Tech MS Thesis, 2012, 115 pages.

(56) References Cited

OTHER PUBLICATIONS

U.S. Department of Energy. Battery Test Manual for 12 Volt Start/Stop Vehicles, U.S. Department of Energy Vehicle Technologies Program, INL/EXT-12-26503, Revision 1, May 2015, 67 pages.
U.S. Department of Energy. Battery Test Manual for 48 Volt Mild Hybrid Electric Vehicles, U.S. Department of Energy Vehicle Technologies Program, INL/EXT-15-36567, Revision 0, Mar. 2017, 70 pages.
U.S. Department of Energy. Battery Test Manual for Plug-In Hybrid Electric Vehicles, U.S. Department of Energy Vehicle Technologies Program, INL/EXT-14-32849, Revision 3, Sep. 2014, 83 pages.
Belt et al. Calendar and PHEV cycle life aging of high-energy, lium-ion cells containing blended spinel and layered-oxide cathodes. Journal of Power Sources, Dec. 2011, 196(23):10213-10221.
Bloom et al. An Investigation of the Impedance Rise and Power Fade in High-Power Li-Ion Cells. 19th International Electric Vehicle Symposium (EVS-19), Oct. 2002, 14 pages.
Chan. Swept Sine Chirps for Measuring Impulse Response. Application Note, Stanford Research Systems Inc., 2010, http://thinksrs.com/downloads/pdfs/applicationnotes/SR1_SweptSine.pdf.
Chen et al. Sinusoidal-Ripple-Current Charging Strategy and Optimal Charging Frequency Study for Li-Ion Batteries. IEEE Transactions on Industrial Electronics, Jan. 2013, 60(1):88-97.
Cho et al. Battery Impedance Analysis Considering DC Component in Sinusoidal Ripple-Current Charging. IEEE Transactions on Industrial Electronics, Mar. 2016, 63(3):1561-1573.
Christophersen et al. Battery Technology Life Verification Testing and Analysis. Idaho National Laboratory INL/CON-07-12282, Dec. 2007, 12 pages.
Christophersen et al. Performance Evaluation of Gen3 Advanced Technology Development Cells. 214th ECS Meeting, Abstract #549, The Electrochemical Society, 2008, 1 page.
Christophersen et al. Pulse resistance effects due to charging or discharging of high-power lithium-ion cells: A path dependence study. Journal of Power Sources, Nov. 2007,173(2):998-1005.
Christophersen et al. Advanced Technology Development Program for Lithium-Ion Batteries: Gen 2 Performance Evaluation Final Report. INL/EXT-05-00913, Jul. 2006, 140 pages.
Christophersen et al. Crosstalk Compensation for a Rapid, Higher-Resolution Impedance Spectrum Measurement. Aerospace Conference, 2012 IEEE, Mar. 2012, 16 pages.
Christophersen et al. Effects of Reference Performance Testing during Aging Using Commercial Lithium-ion Cells. J. Electrochem Soc., May 2006, 153(7):A1406-A1416.
Christophersen et al. Electrochemical Impedance Spectroscopy Testing on the Advanced Technology Development Program Lithium-ion Cells. Sep. 2002, IEEE Trans. Veh. Technol., 56(3):1851-1855.
Christophersen et al. Long-Term Validation of Rapid Impedance Spectrum Measurements as a Battery State-of-Health Assessment Technique. SAE Int. J. Alt. Power, May 2013, 6(1):146-155.
Christophersen et al. Lumped Parameter Modeling as a Predictive Tool for a Battery Status Monitor. Oct. 2003, Proceedings from IEEE Vehicular Technology Conference, 6 pages.
Christophersen et al. Rapid Impedance Spectrum Measurements for State-of-Health Assessment of Energy Storage Devices. SAE Int. J. Passeng. Cars—Electron. Electr. Syst., Apr. 2012, 5(1), 11 pages.
Christophersen et al. Impedance Noise Identification for State-of-Health Prognostics. 43rd Power Sources Conference, Jul. 2008, 4 pages.
Christopherson. Battery Test Manual for Electric Vehicles. Idaho National Laboratory, U.S. Department of Energy Vehicle Technologies Program, INL/ EXT-15-34184, Revision 3, Jun. 2015, 67 pages.
Delaille et al. Study of the 'coup de fouet' of lead-acid cells as a function of their state-of-charge and state-of-health. Journal of Power Sources, Aug. 2006,158(2):1019-1028.
Din et al. A Scalable Active Battery Management System With Embedded Real-Time Electrochemical Impedance Spectroscopy. IEEE Transactions on Power Electronics, Jul. 2017, 32(7):5688-5698.
Din et al. Online Spectroscopic Diagnostics Implemented in an Efficient Battery Management System. 16th Workshop on Control and Modeling for Power Electronics, 2015, 7 pages.
Doan et al. Intelligent Charger with Online Battery Diagnosis Function. 9th International Conference on Power Electronics-ECCE Asia, Jun. 2015, pp. 1644-1649.
Doughty et al. FreedomCAR Electrical Energy Storage System Abuse Test Manual for Electric and Hybrid Electric Vehicle Applications. SAND2005-3123, Aug. 2006, 46 pages.
Egloff et al. A Critical Analysis of an Instrumentation Current Sources. 59th International Instrumentation Symposium, May 2013, 12 pages.
Fasmin et al. Review—Nonlinear Electrochemical Impedance Spectroscopy. Journal of the Electrochemical Society, May 2017, 164(7):H443-H455.
Fenton et al. BSM Development Documentation Senior Project Final Report for the Idaho National Laboratory. May 2005, Montana Tech of the University of Montana, 21 pages.
Ford, Jr. Validation of Push Pull Current. Proceedings of the Annual Montana Tech Electrical and General Engineering Symposium, Jan. 2016, 25 pages.
Garcia et al. On-line State-of-Health and Remaining-Useful-Life Assessment of Batteries using Rapid Impedance Spectrum Measurements. 45th Power Sources Conference Proceedings, Jun. 2012, 7.3, pp. 115-118.
Haskins et al. Battery Technology Life Verification Test Manual. Idaho National Laboratory, Feb. 2005, INEEL/EXT-04-01986, 133 pages.
Hirschorn et al. On Selection of the Perturbation Amplitude Required to Avoid Nonlinear Effects in Impedance Measurements. Israel Journal of Chemistry, 2008, vol. 48, pp. 133-142.
Hoffmann et al. Development and Test of a Real Time Battery Impedance Estimation System. IEEE Aerospace 2006 Conference, Mar. 2006, IEEE 0-7803-9546-8/06, 8 pages.
Huet. A review of impedance measurements for determination of the state-of-charge or state-of-health of secondary batteries. Journal of Power Sources, Jan. 1998, 70(1):59-69.
Adany et al. Switching algorithms for extending battery life in Electric Vehicles. Journal of Power Sources, Jun. 2013, 231:50-59.
Ahmed et al. Enabling fast charging—A battery technology gap assessment. Journal of Power Sources, Nov. 2017, 367:250-262.
Baert et al. Determination of the State-of-Health of VRLA Batteries by Means of Noise Measurements. Intelec 2001, Nov. 2001, Conference Publication No. 484, pp. 301-306.
Bald et al. Hardware Architecture for Rapid Impedance Measurements of 50V Battery Modules. San Diego: The International Society of Automation, 58th International Instrumentation Symposium, INL/CON-12-24516, Jun. 2012, 18 pages.
Banaei et al. Online Detection of terminal voltage in Li-ion Batteries via Battery Impulse Response. IEEE, Oct. 2009, pp. 194-198.
Barsukov et al. Challenges and Solutions in Battery Fuel Gauging. Power Management Workbook, 2004, 10 pages, Texas Instruments Inc.
Beelen et al. A comparison and accuracy analysis of impedance-based temperature estimation methods for Li-ion batteries. Applied Energy, Aug. 2016, 175:128-140.
Berecibar et al. Critical review of state of health estimation methods of Li-ion batteries for real applications. Renewable and Sustainable Energy Reviews, Apr. 2016, 56:572-587.
Blanke et al. Impedance measurements on lead-acid batteries for state-of-charge, state-of-health and cranking capability prognosis in electric and hybrid electric vehicles. Journal of Power Sources, Jun. 2005, 144:418-425.
Blidberg. Correlation between different impedance measurement methods for battery cells. KTH Chemical Science and Engineering, 2012, 42 pages, Stockholm, Sweden.
Bohlen et al. Impedance Based Battery Diagnosis for Automotive Applications. 35th Annual IEEE Power Electronics Specialists Conference, Apr. 2004, 4:2192-2797.

(56) References Cited

OTHER PUBLICATIONS

Bose et al. Battery state of health estimation through coup de fouet: field experience. INTELEC, Twenty-Second International Telecommunications Energy Conference (Cat. No. 00CH37131), 2000, pp. 597-601.

Bose et al. Lessons Learned in Using OHMIC Techniques for Battery Monitoring. IEEE, 2001, pp. 99-104.

Brauer et al. Residential Energy Storage from Repurposed Electric Vehicle Batteries: Market Overview and Development of a Service-Centered Business Model. IEEE 18th Conference on Business Informatics, Aug. 2016, pp. 143-152.

Breugelmans et al. Odd random phase multisine electrochemical impedance spectroscopy to quantify a non-stationary behaviour: Theory and validation by calculating an instantaneous impedance value. Electrochimica Acta, Aug. 2012, 76:375-382.

Burnham et al. Enabling fast charging—Infrastructure and economic considerations. Journal of Power Sources, Nov. 2017, 367:237-249.

Cabrera-Castillo et al. Calculation of the state of safety (SOS) for lithium ion batteries. Journal of Power Sources, Aug. 2016, 324:509-520.

Carkhuff et al. Impedance-Based Battery Management System for Safety Monitoring of Lithium-Ion Batteries. IEEE Transactions on Industrial Electronics, Aug. 2018, 65(8):6497-6504.

Chan. Swept Sine Chirps for Measuring Impulse Response. Stanford Research Systems Inc., https://thinksrs.com/downloads/pdfs/applicationnotes/SR1_SweptSine.pdf, 2010, 6 pages.

Cheng et al. Battery-Management System (BMS) and SOC Development for Electrical Vehicles. IEEE Transactions on Vehicular Technology, Jan. 2011, 60(1):76-88.

Christensen et al. Using on-board Electrochemical Impedance Spectroscopy in Battery Management Systems. World Electric Vehicle Journal, Nov. 2013, 6:0793-0799.

Cordioli et al. Development of a Methodology Based on Odd Random Phase Electrochemical Impedance Spectroscopy to Evaluate Corrosion Protection of Coatings. Proceedings of the 4th International Conference on Self-Healing Materials, Jun. 2013, pp. 152-155.

Cox et al. Battery State of Health Monitoring, Combining Conductance Technology with other Measurement Parameters for Real-Time Battery Performance Analysis. INTELEC, International Telecommunications Energy Conference (Proceedings), Feb. 2000, 19-2, pp. 342-347.

Crow et al. Integrated Prognostic Health Monitoring of Battery Health in Ground Robots. Penn State Applied Research Laboratory, 32nd Association for Unmanned Vehicle Systems International Meeting, Jun. 2005, 16 pages.

Damlund. Analysis and Interpretation of AC-measurements on Batteries used to assess State-of-Health and Capacity-condition. IEEE, 1995, pp. 828-833.

Diard et al. Constant load vs constant current EIS study of electrochemical battery discharge. Electrochimica Acta, 1997, 42(23-24):3417-3420.

Diard et al. EIS study of electrochemical battery discharge on constant load. Journal of Power Sources, Jan. 1998, 70(1):78-84.

Diard et al. Impedance measurements of polymer electrolyte membrane fuel cells running on constant load. Journal of Power Sources, Aug. 1998, 74(2):244-245.

\* cited by examiner

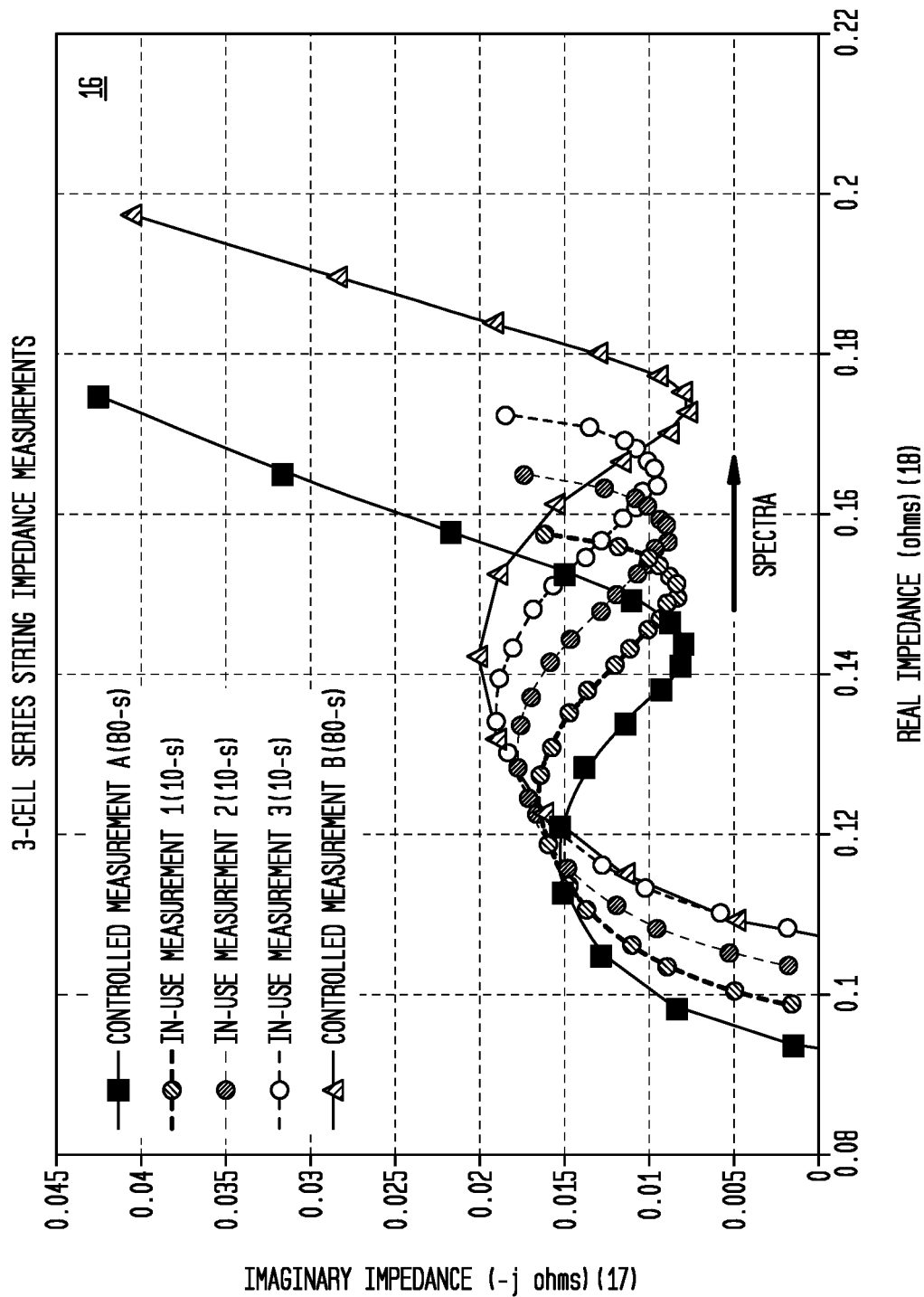

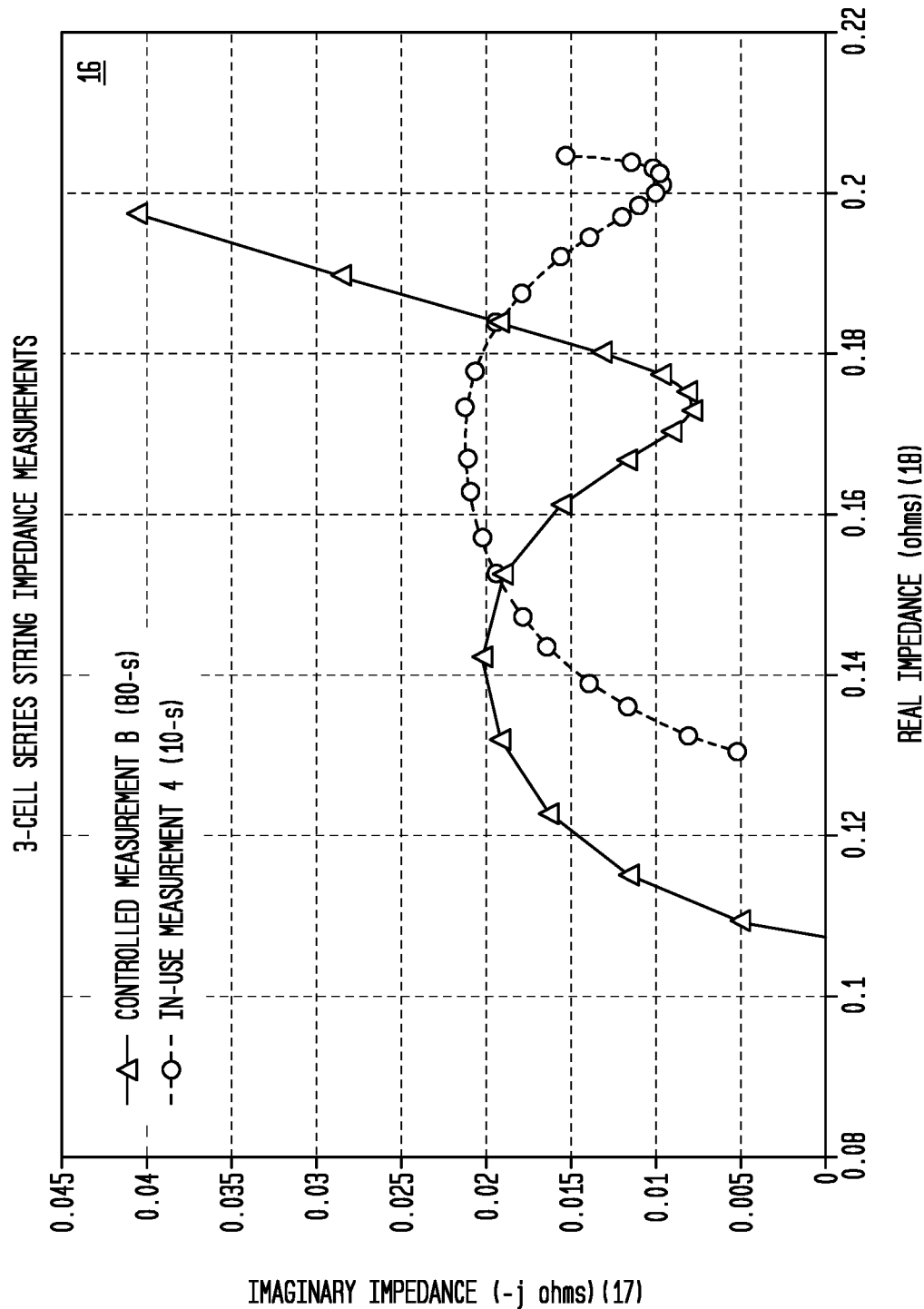

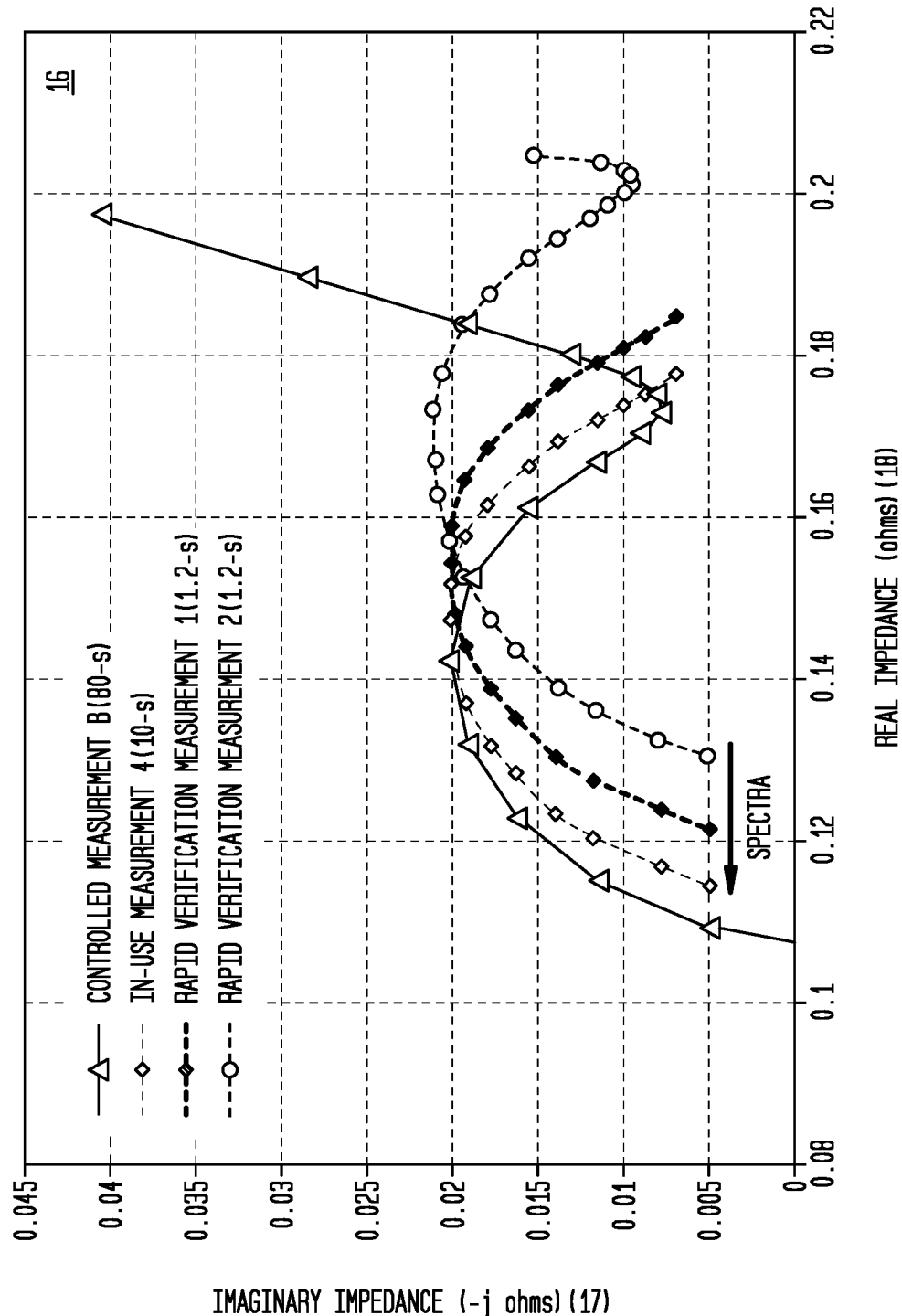

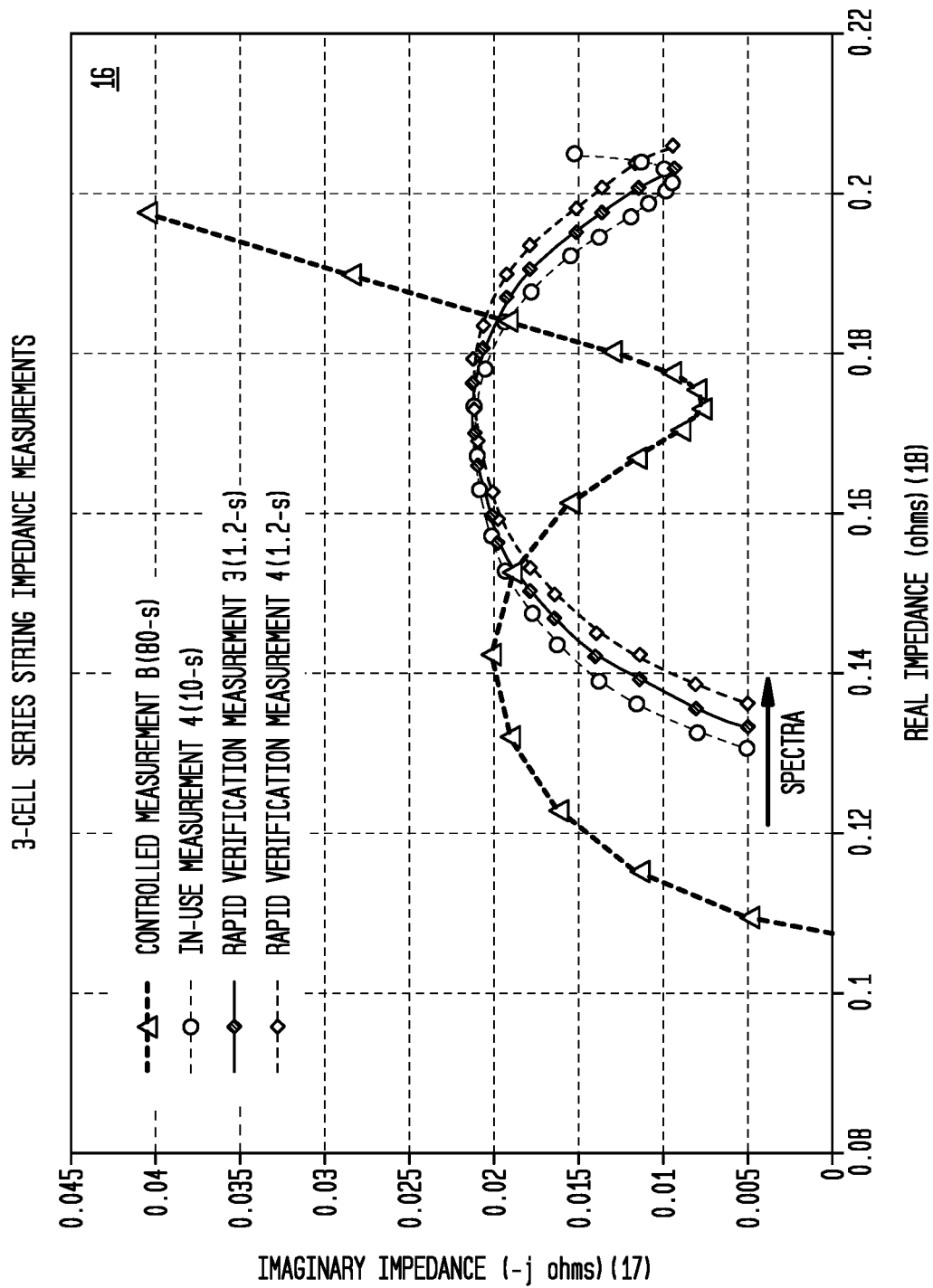

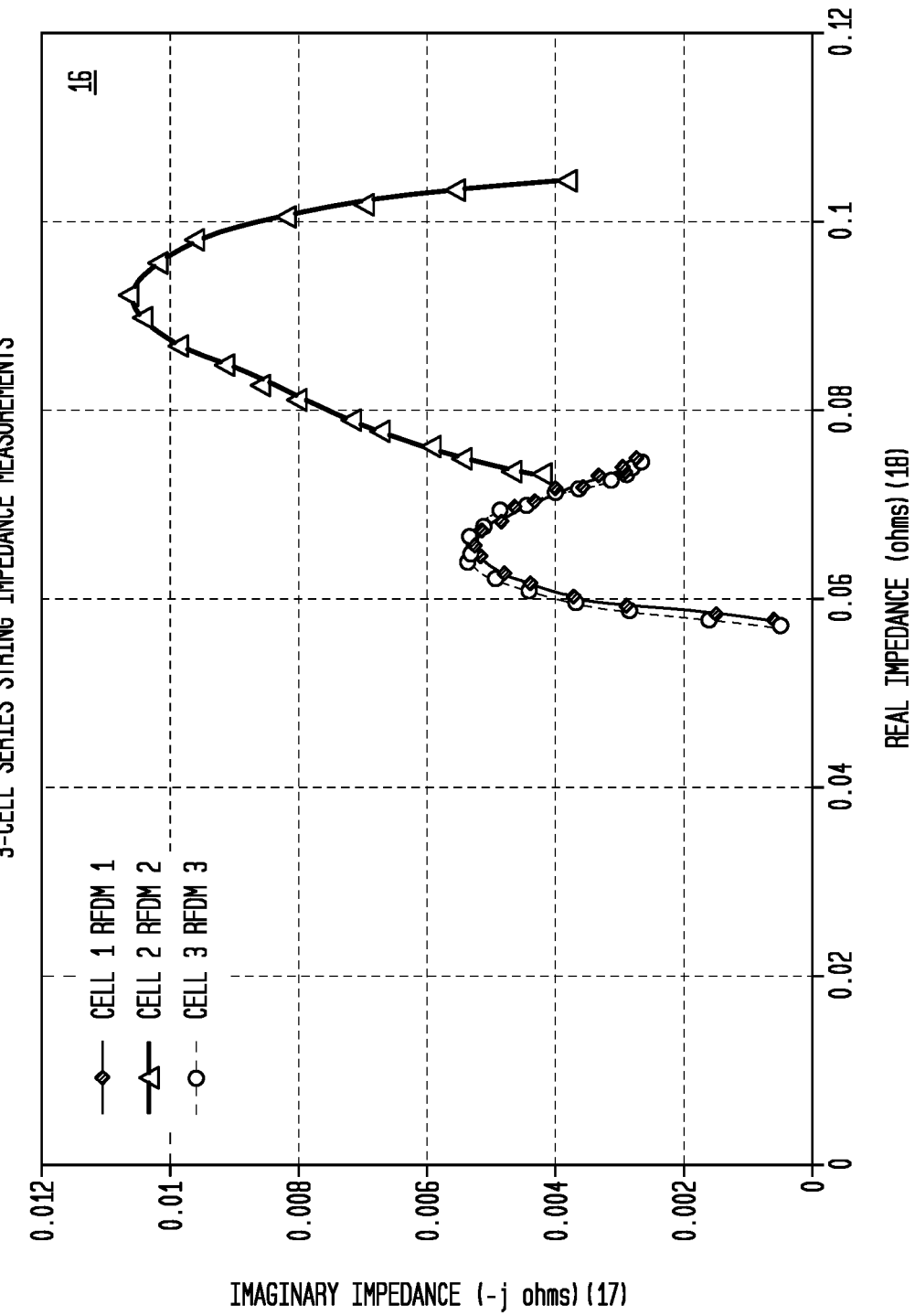

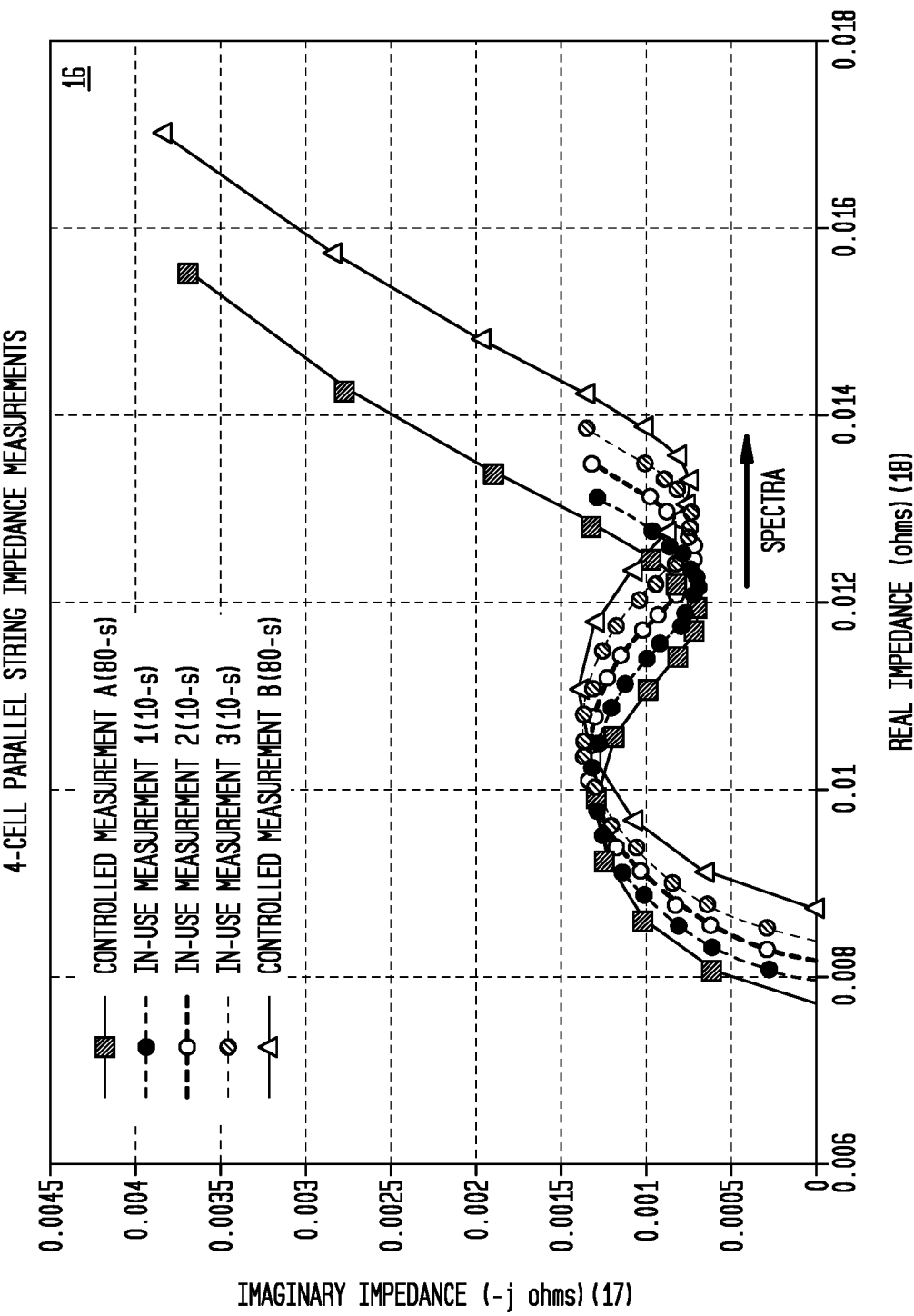

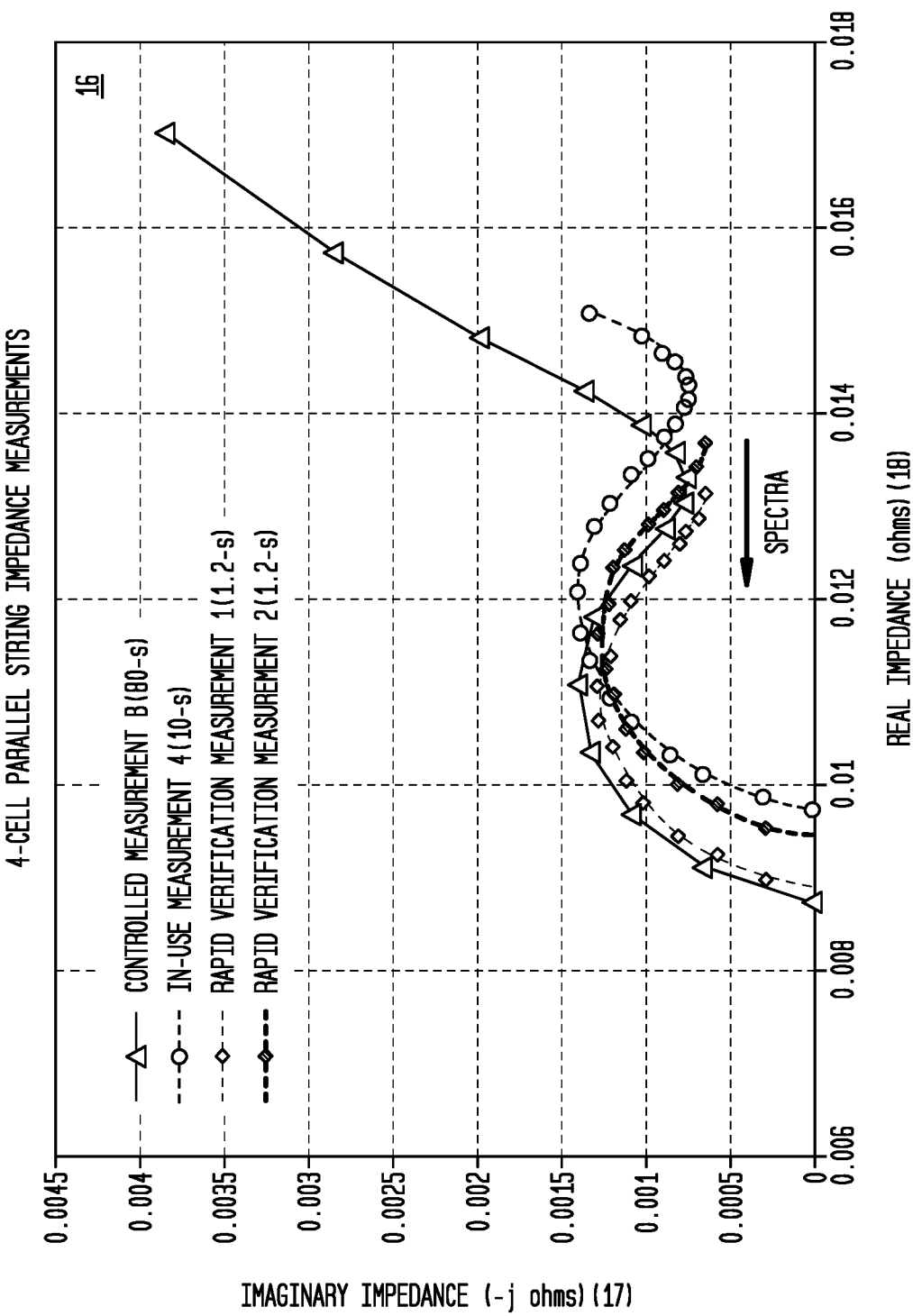

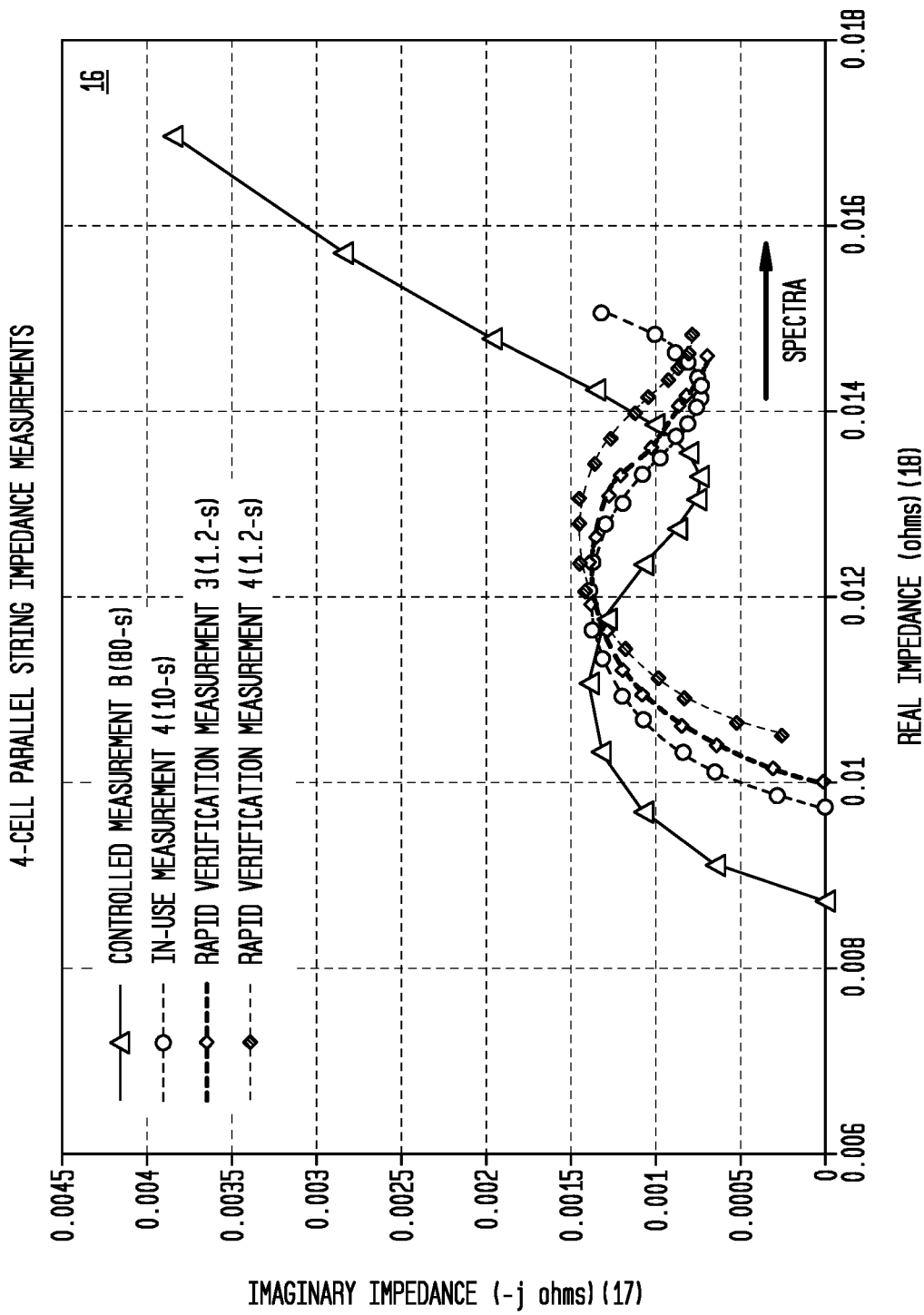

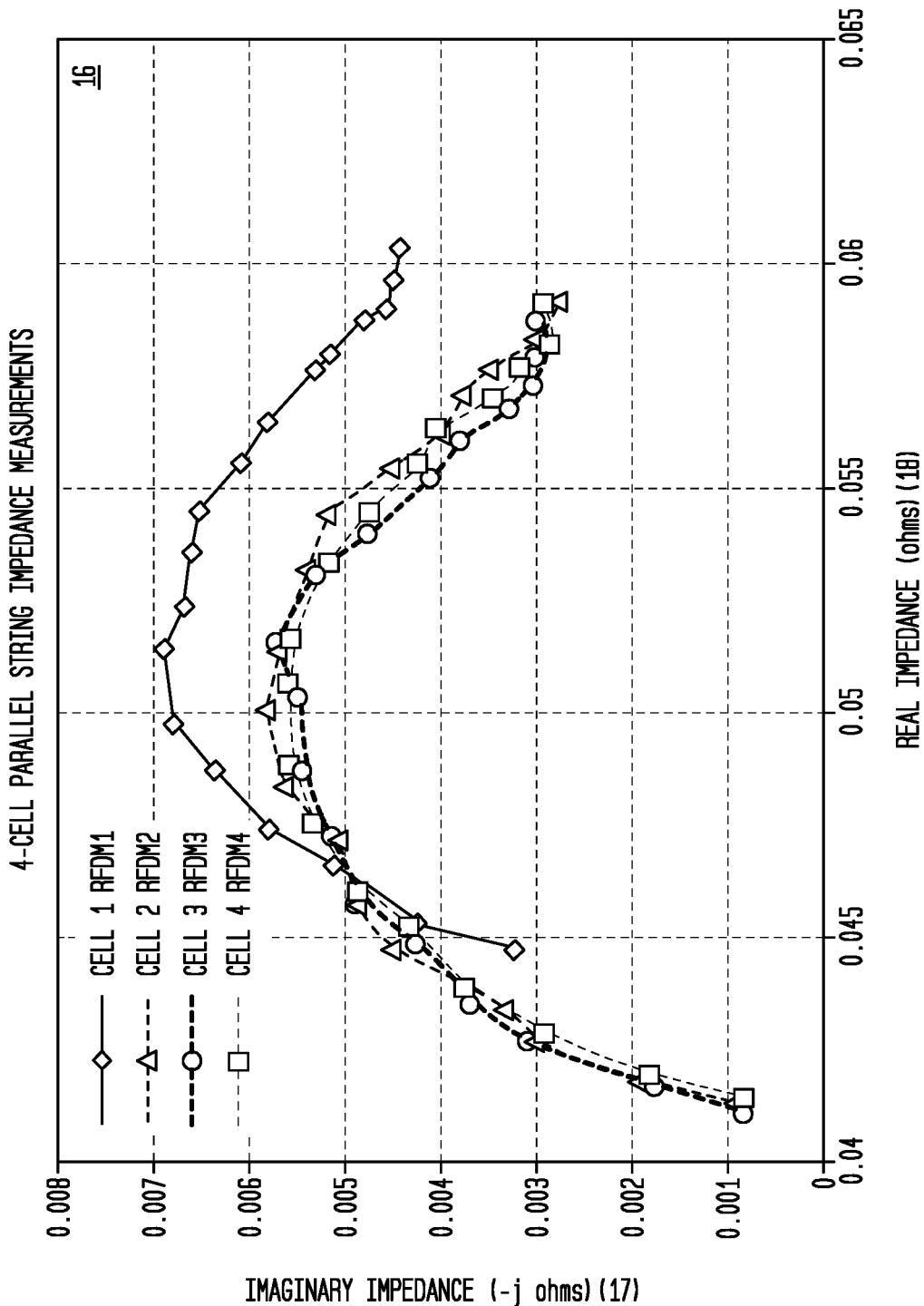

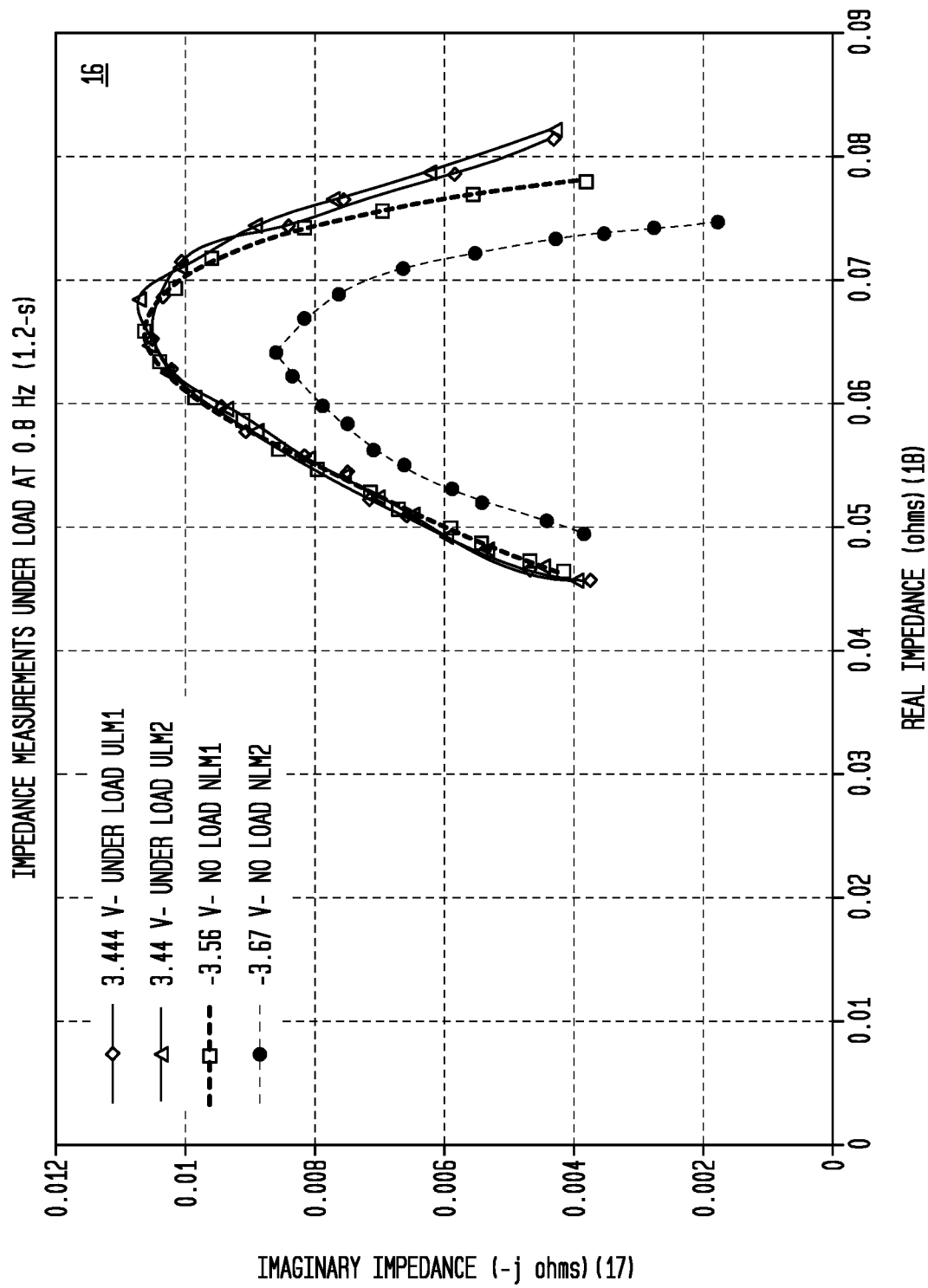

MULTISPECTRAL IMPEDANCE MEASUREMENTS ACROSS STRINGS OF INTERCONNECTED CELLS

This United States Patent application claims the benefit of U.S. Provisional Patent Application No. 62/959,711, filed Jan. 10, 2020, hereby incorporated by reference herein.

I. FIELD OF THE INVENTION

An in-line rapid impedance measurement device and methods of performing in-line fast impedance spectroscopy including a switch network operable under a switching algorithm useful to rapidly perform targeted impedance measurements to assess state of health, defect or failure of battery packs or modules having a plurality of electrochemical cells interconnected in series or parallel and to isolate individual cells within a pack or module to distinguish between non-repeatable anomalous impedance measurements from repeatable deviant impedance measurements and identify the source of deviant impedance measurements.

II. BACKGROUND OF THE INVENTION

A battery is a device including an electrochemical cell having a one positive and one negative terminal which transforms stored chemical energy into electrical energy. Cells can but need not necessarily be assembled into various form factors to provide a required amount of power ("watts" or "W") and energy ("watt-hours" or "Wh") for a given application. Battery form factors generally include packs ("P"), modules ("M") and cells ("C"). A battery module (also referred to as a "module" or "M") includes a plurality of cells (electrochemical cells ("C") generally interconnected in series or parallel, or combinations thereof. A battery pack (also referred to as a "pack" or "P") includes a plurality of modules interconnected in either series ("s") or parallel ("p"). Interconnecting cells (C), modules (M) or packs (P) in series (s) increases the amount of power (voltage, "V"), while interconnecting cells (C), modules (M), or packs (P) in parallel increases current capacity ("amp-hour" or "mAh").

Conventional real time battery monitoring (input data is processed within milliseconds for immediate feedback) through a battery management system ("BMS") typically senses voltage ("V"), current ("I"), or temperature ("T"). Impedance ("Z") extends the concept of resistance ("Ω") to alternating current ("AC") circuits and possesses both magnitude and phase. There is a long felt but unresolved need to integrate near real-time broadband impedance measurements in real time battery monitors or BMS to enhance battery diagnostics. Impedance measurement devices ("IMD") can perform measurements that can reveal changes in the behavior of electrochemical processes in a cell as a function of age and use which can provide insights into changes in the electrode surface and diffusion layer. See: Kozlowski, J. D. Electrochemical cell prognostics using online impedance measurements and model-based data fusion techniques. 2003. Proceedings from the IEEE Aerospace Conference, Vol. 4. pp. 3257-3270.

III. SUMMARY OF THE INVENTION

Accordingly, a broad object of the invention can be to provide devices and methods to perform AC impedance measurement of a given pack, module or cell form factor at known controlled conditions to establish baseline performance of the battery pack, module, or cell as a function of age and use.

Another broad object of particular embodiments can be to provide i devices and methods to perform a high-fidelity AC impedance measurement of a pack, module or cell at a lower starting frequency range (for example, at about 0.0125 Hz for about 80 seconds or about 0.025 Hz for about 40 seconds). Controlled conditions, can but need not necessarily, include breaks within a charge algorithm after the cells have had a chance to electrochemically and thermally stabilize. Measurements can be performed of a pack, module or of individual cells within the pack or module. Measurements of the pack, module, or cell can, but need not necessarily, be conducted at varying state of charge ("SOC") conditions during the charge algorithm depending on charge rate (for example, Level 1 charging using a 120 volt connection can take longer than Level 2 charging using a 240 volt connection or Level 3 or extreme fast charging algorithms ("XFC"), so it may be possible to capture more pack, module, or cell measurements). Measurements can be conducted under no-load or load conditions, combinations thereof.

Another broad object of particular embodiments can be to provide devices and methods to perform a mid-fidelity AC impedance measurement of a pack, module, or cell which can be performed at periodic intervals during pack, module or cell use or storage conditions as an indicator of pack, module, or cell status or change of pack, module, or cell status over time (for example pack, module, or cell health or stability). AC impedance measurements of a pack, module, or cell can be performed at a nominal frequency range, depending on cell chemistry (for example, at about 0.1 Hz for about 10 second measurement or at 0.2 Hz for a 5 second measurement). These AC impedance measurements can, but need not, be combined with conventional BMS measurements of V, T, or I of the pack, module or cell which can be used to ascertain SOC, load conditions (under load or not under load), state of use conditions (in use, not in use, or in storage), or the like. Mid-fidelity measurements can be conducted on and entire pack, modules, or cells at periodic intervals. The IMD, the BMS, or remote computer, or combinations thereof, can adjust AC impedance measurement parameters, such as frequency range, excitation level, measurement time period, as needed based on AC impedance data generated during measurement of a battery (for example, if saturation occurs). AC impedance measurements can be conducted under no-load or load conditions, or both.

Another broad object of particular embodiments can be to provide devices and methods to perform a low-fidelity AC impedance measurement of a pack, module, or cell which can, but need not necessarily be performed in a lesser time period than high-fidelity or mid-fidelity AC impedance measurements. Low-fidelity AC impedance measurements of a pack, module, or cell can as an example be performed very fast at about 0.8 Hz for about 1.2 seconds. Low-fidelity AC impedance measurements can, but need not necessarily, be coordinated with high-fidelity or mid-fidelity measurements or with BMS measurements to target different impedance measurement parameters at the pack, module or cell level based on monitored battery conditions or prior impedance measurement data, or combinations thereof. As an illustrative example, one or repeated low fidelity AC impedance measurements of an entire pack, module or individual cells could be triggered by a high-fidelity, mid-fidelity or BMS measurements which deviate from a control or standard threshold measurement values applied to AC impedance test measures of a particular pack, module or cell to distinguish non-repeatable anomalous conditions from repeatable deviant conditions and to identify whether a deviant condition has a comparatively slow or rapid rate of impedance measurement change. AC impedance measurements could be conducted under no-load or load conditions, or combinations thereof.

Another broad object of particular embodiments can be to provide devices and methods which include a switch network operable under a smart switching algorithm to enable drill-down AC impedance measurements using high-fidelity, mid-fidelity or low-fidelity AC impedance measurements, or combinations thereof, to identify a specific pack, module, or cell that may be generating AC impedance measurement which deviates in comparison to the control or standard impedance measurement values for the particular battery type. As an illustrative example, upon detection of an anomalous condition, the IMD, BMS, or remote computer can then trigger a sequence of very rapid, low-fidelity measurements at various subsystems or levels within the pack or module to identify the specific cell string or cell associated with the BMS measurement which deviates from the control or standard impedance measurement value. Whether triggered by the BMS or otherwise, the devices and methods can employ the switch network under control of the switch algorithm which can, but need not necessarily, begin at the pack level and then switch to the module level. Once a module is identified as being associated with the deviant condition, the switch network under control of the switch algorithm can enable low-fidelity AC impedance measurements within the strings of the pack or module. Once the specific string is determined, the switch network would enable low-fidelity AC measurements of the individual cells.

Another broad object of particular embodiments can be to provide devices and methods which perform inline rapid impedance spectroscopy ("iRIS"). iRIS provides rapid, broadband AC impedance measurements of a pack, module or cell using a targeted frequency range. The existing system can measure packs, modules or single cells up to 400 V. Depending on the pack or module assembly, the iRIS sensor can be integrated at any level for near real-time broadband impedance acquisition. This enables advanced diagnostics and prognostics capability. iRIS can provide a significant wealth of information and could be used independently for battery assessment. However, in particular embodiments iRIS can, but need not necessarily, be combined with existing BMS sensor technology (V, T, and I) for battery health and stability assessments.

While this description and the associated figures provide illustrative examples in the context of AC impedance measurements of battery packs, modules, strings of cells, or cells, or battery components, this is not intended to preclude application of embodiments of iRIS, the switch network, or the switching algorithm to measure AC impedance of other devices or objects such as solar panels, solar cells, solar cell components, dielectric materials, or biological systems, components, or objects such human or animal body parts, organs, glands, tissues, membranes, fluids, or isolated biological cells, cell culture growth medium, or to enhance data presentation in electrical impedance tomography.

Additionally, while this description and the associated figures provide illustrative examples of iRIS, this is not intended to preclude embodiments which include or apply the switch network or the switching algorithm to measure AC impedance in batteries, or measure impedance of other devices or objects, using conventional electrical impedance spectroscopy or other impedance measurement techniques, or combinations thereof, embedded in devices which stimulate or excite the battery or object to determine the condition of the device or object including, as examples, impedance noise identification, compensated synchronous detection, or fast summation transformation, or combinations thereof.

Naturally, further objects of the invention are disclosed throughout other areas of the specification, drawings, photographs, and claims.

IV. BRIEF DESCRIPTION OF THE DRAWINGS

Figure 4:
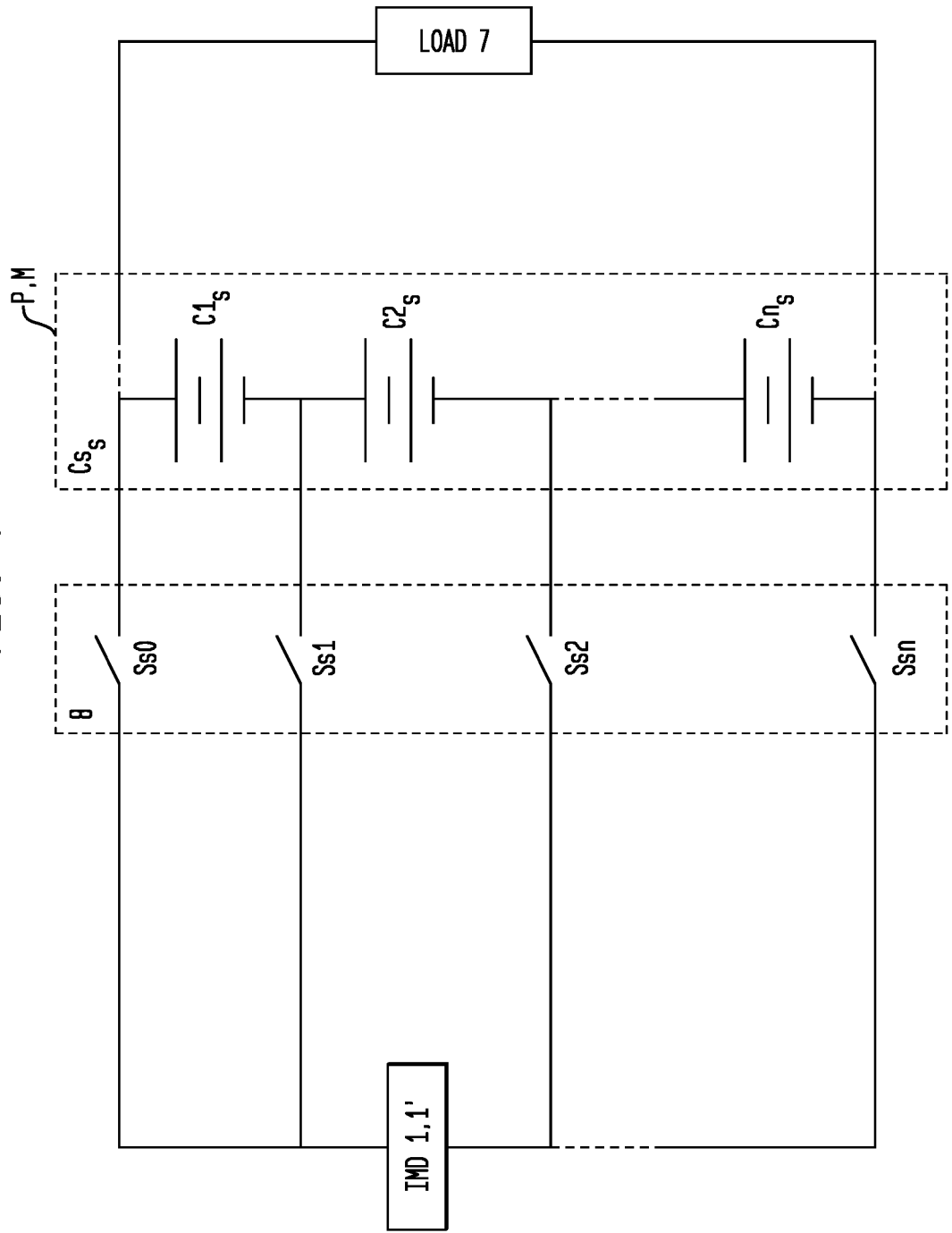

FIG. 4 is a block diagram of a series cell string ($CS_s$) including a plurality of cells ($C1s, C2s \ldots C_{ns}$) electrically connected to a switch network including a plurality of switches ($Ss0, Ss1, Ss2 \ldots Ss_n$) switchable to electrically connect one or more of the plurality of cells ($C1s, C2s \ldots C_{ns}$) in the series cell string (CSs) to an impedance measurement device and optionally to a load.

Figure 5:
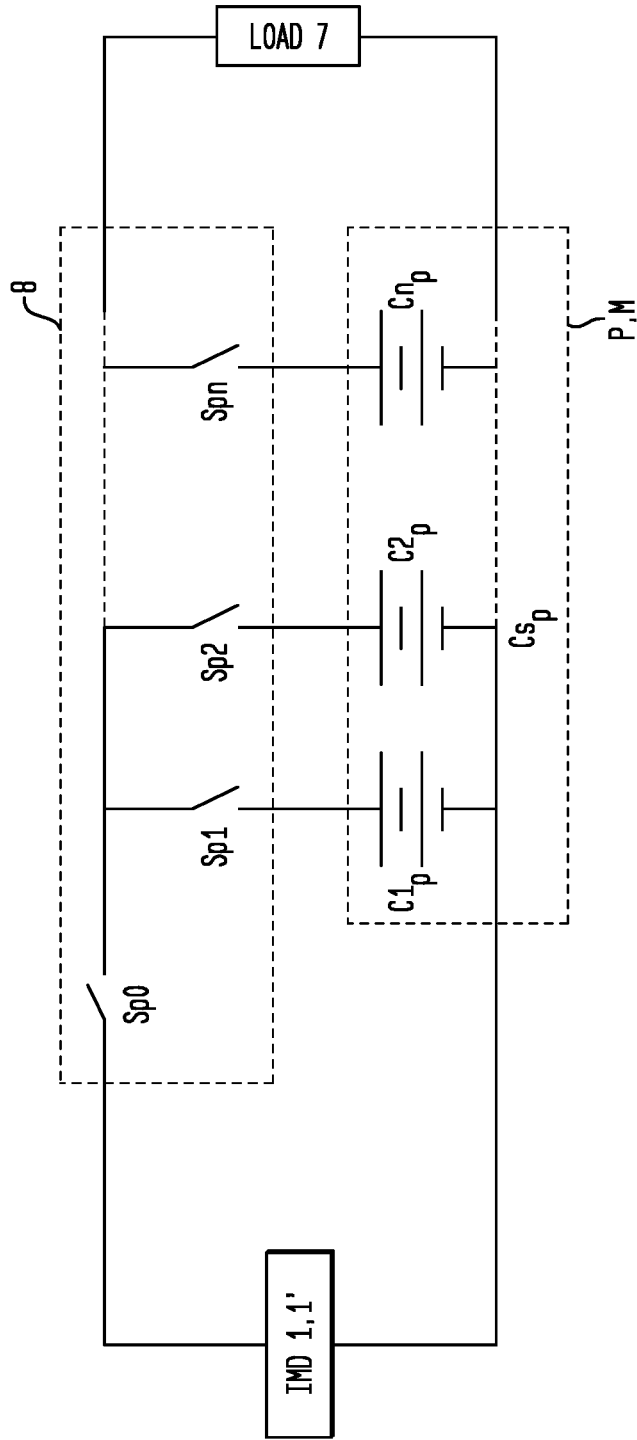

FIG. 5 is a block diagram of a parallel cell string (CSp) electrically connected to a switch network including plurality of switches ($Sp0, Sp1, Sp2 \ldots Sp_n$) switchable to electrically connect one or more of the plurality of cells ($C1p, C2p \ldots C_{np}$) in the parallel cell string (CSp) to an impedance measurement device and optionally to a load.

Figure 6:
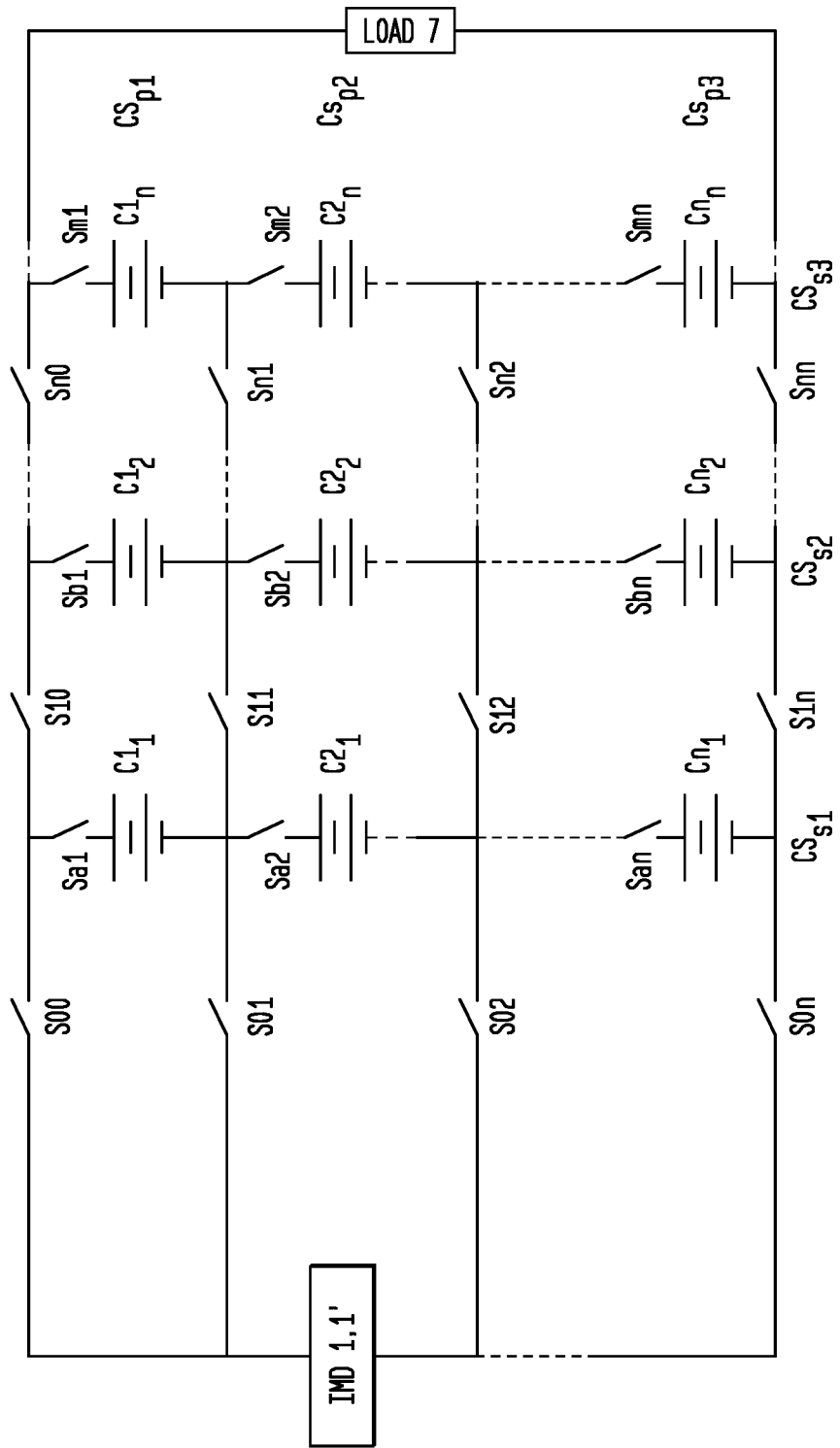

FIG. 6 illustrates a plurality of cells ($C1_1, C1_2, \ldots C1_n$, $C2_1, C2_2, \ldots C2_n, C_{N1}, C_{N2}, \ldots C_{Nn}$) electrically interconnected in plurality of series cell strings (CSs1, CSs2, CSsn) which can be electrically interconnected in parallel to provide a plurality of parallel cell strings (CSp1, CSp2, CSpn) which can be connected to a switch network including plurality of switches (S) switchable to electrically connect one or more of the cells (C) in a series cell string (CSs1, CSs2, CSsn), or electrically connect the one or more cells in a parallel cell string (CSp1, CSp2, CSpn), or electrically connect all of the plurality of cells (C) interconnected in series and in parallel, to an impedance measurement device and optionally to a load.

Figure 7:
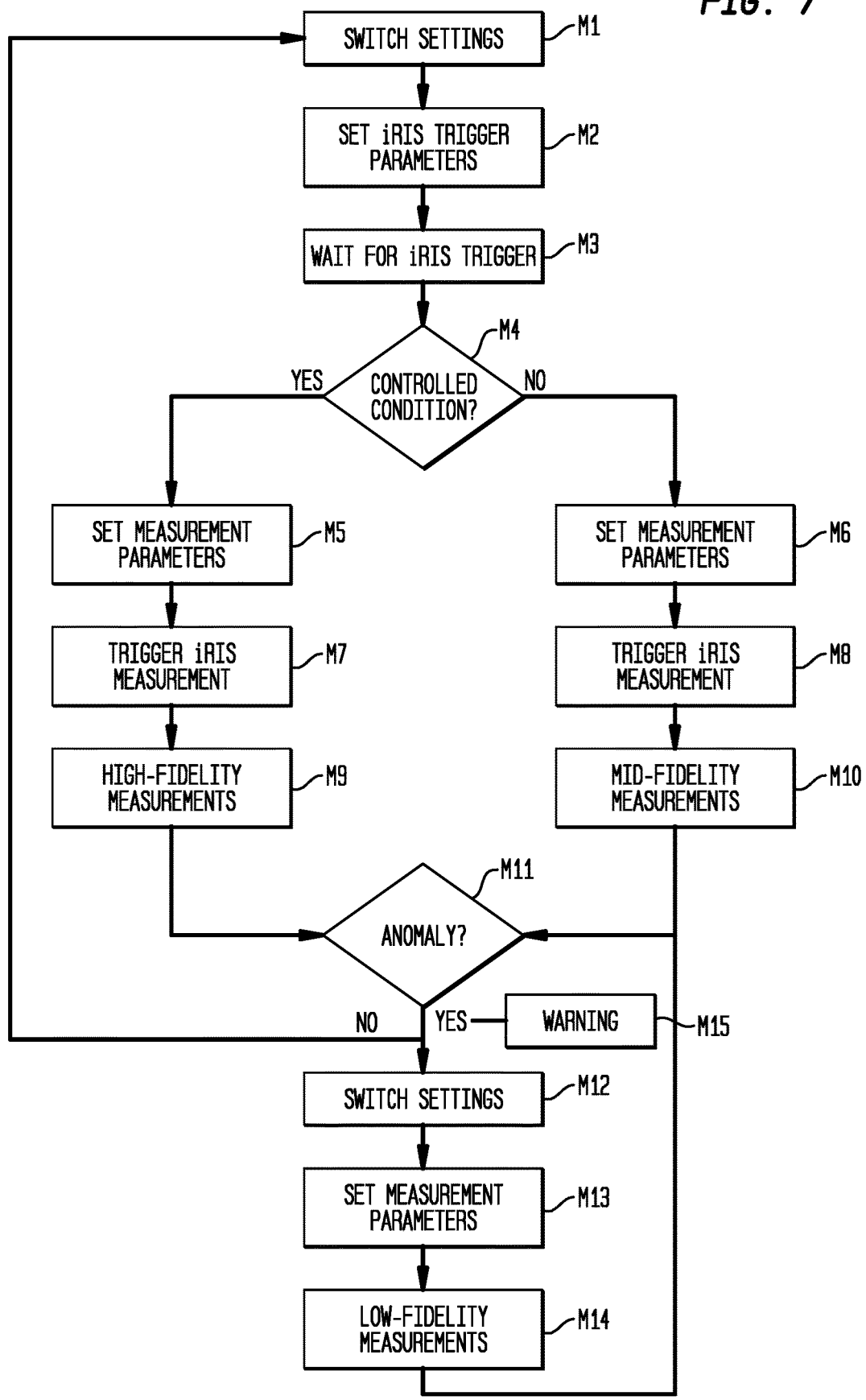

FIG. 7 is block flow diagram of an illustrative method of operating an impedance measurement device electrically connected to a switch network switchable under a switch algorithm to target particular impedance measurement parameters to measure impedance of a battery at the pack, module or cell level.

Figure 8:
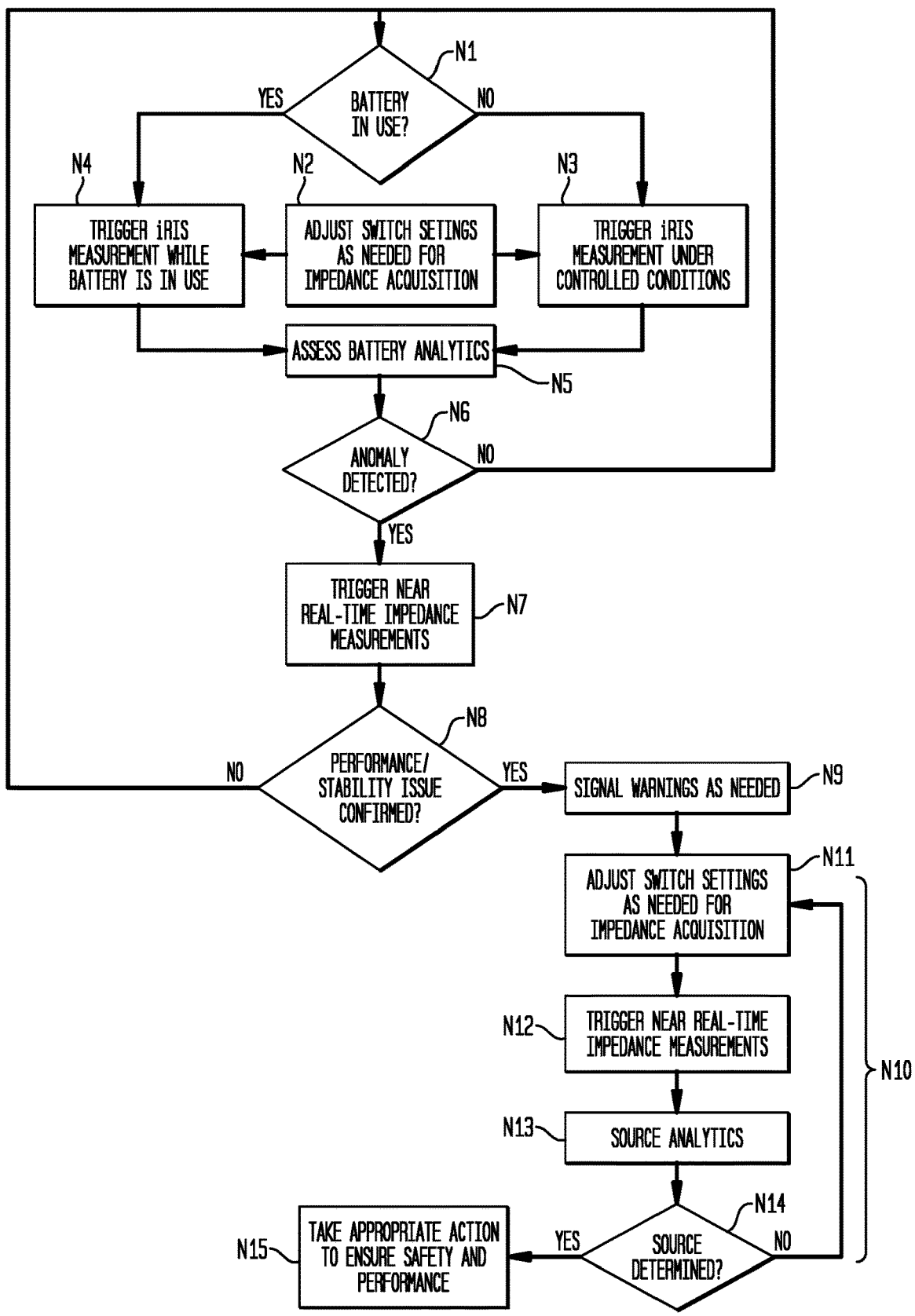

FIG. 8 is a block flow diagram of an illustrative method of performing an impedance measurement of a battery pack, module or cell using a switching algorithm to serially adjust the switches in a switch network to detect impedance measurement anomalies and deviations from preselect impedance measurement thresholds.

FIG. 9A depicts battery impedance measurement plots of real impedance on the X axis versus imaginary impedance on the Y axis obtained by performing a plurality of impedance measurements of three cells electrically interconnected in series cell string (CS$_s$) at high-fidelity impedance measurement and at a mid-fidelity impedance measurement.

FIG. 9B depicts battery impedance measurement plots of a high-fidelity impedance measurement (Controlled Measurement B) across the series string of three cells (CS$_s$) and a subsequent mid-fidelity impedance measurement (In-Use Measurement 4 (IUM 4)) of the series string of three cells (CS$_s$) indicative of an anomalous condition by comparative increase in the impedance of the series string of three cells (CS$_s$).

FIG. 9C depicts battery impedance measurement plots of a high-fidelity impedance measurement (Controlled Measurement B) across the series string of three cells (CS$_s$) and IUM 4 as shown in FIG. 9B, and a subsequent plurality of low-fidelity impedance measurements (Rapid Verification Measurements 1 and 2 (RVM 1 and RVM 2)) of the series string of three cells (CS$_s$) indicative of non-repeatable anomaly condition (IUM 4).

FIG. 9D depicts battery impedance measurement plots of a high-fidelity impedance measurement (Controlled Measurement B) across the series string of three cells (CS$_s$) and IUM 4 as shown in FIG. 9C, and a subsequent plurality of low-fidelity impedance measurements (Rapid Verification Measurements (RVM 3 and RVM 4)) of the series string of three cells indicative of a repeatable deviation from pre-determined impedance measurement threshold values.

FIG. 9E depicts battery impedance measurement plots of low-fidelity impedance measurement of each of Cell 1 (RFDM 1), Cell 2 (RFDM 2), and Cell 3 (RFDM 3) of the series string of three cells (CS$_s$) indicative of failure of Cell 2 in the series string of three cells (CS$_s$).

FIG. 10A depicts battery impedance measurement plots of real impedance on the X axis versus imaginary impedance on the Y axis of four cells electrically interconnected in parallel (CS$_p$) showing that the impedance spectra for Controlled Measurement B has shifted to the right of Controlled Measurement A due to aging of the four cells over a period of time.

Figure 10B:
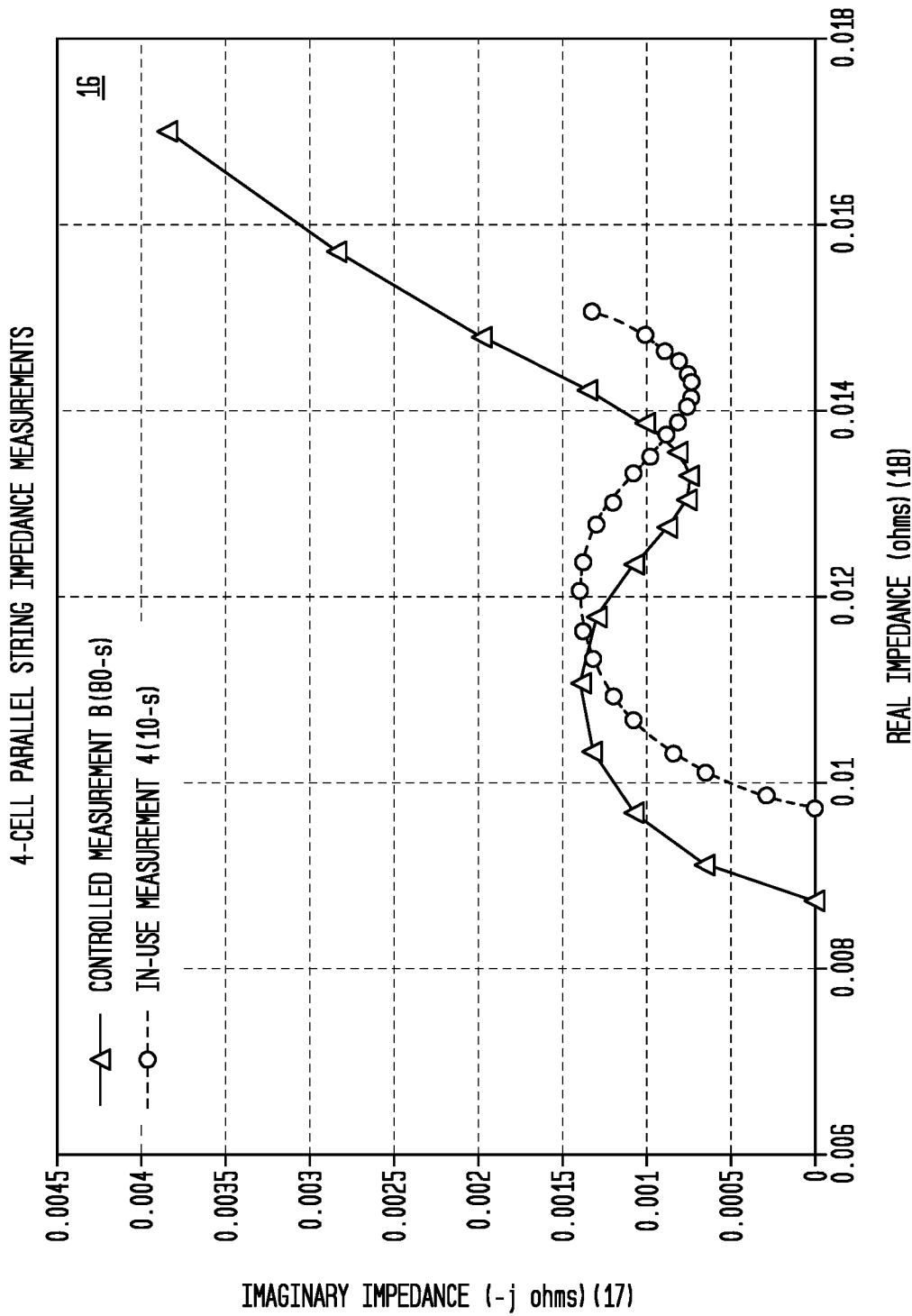

FIG. 10B includes battery impedance measurement plots of a high-fidelity impedance measurement Controlled Measurement B across the parallel string of four cells (CS$_p$) as shown in FIG. 10A, and subsequent mid-fidelity impedance measurement In-Use Measurement 4 (IUM 4) of the parallel string of four cells (CS$_p$) indicates an anomalous condition by the substantial comparative increase in the impedance of the parallel string of four cells (CS$_p$).

FIG. 10C depicts battery impedance measurement plots of a high-fidelity impedance measurement Controlled Measurement B across the parallel string of four cells and IUM 4 as shown in FIG. 10B, and a subsequent plurality of low-fidelity impedance measurements Rapid Verification Measurements (RVM 1 and RVM 2) of the parallel string of four cells (CS$_p$) indicative of a non-repeatable anomaly condition (64) IUM 4.

FIG. 10D depicts battery impedance measurement plots of a high-fidelity impedance measurement Controlled Measurement B across the parallel string of four cells (CS$_p$) and IUM 4 as shown in FIG. 10C, and a subsequent plurality of low-fidelity impedance measurements Rapid Verification Measurements (RVM 3 and RVM 4) of the parallel string of four cells (CSp) indicating that In-Use Measurement 4 was a repeatable deviant condition.

FIG. 10E depicts battery impedance measurement plots of low-fidelity impedance measurements Rapid Failure Detection Measurements of each of Cell 1 (RFDM 1), Cell 2 (RFDM 2), Cell 3 (RFDM 3) and Cell 4 (RFDM) of the parallel string of fours cells (CS$_p$) indicative of failure of Cell 1 in the parallel string of four cells (CS$_p$).

Figure 11A:
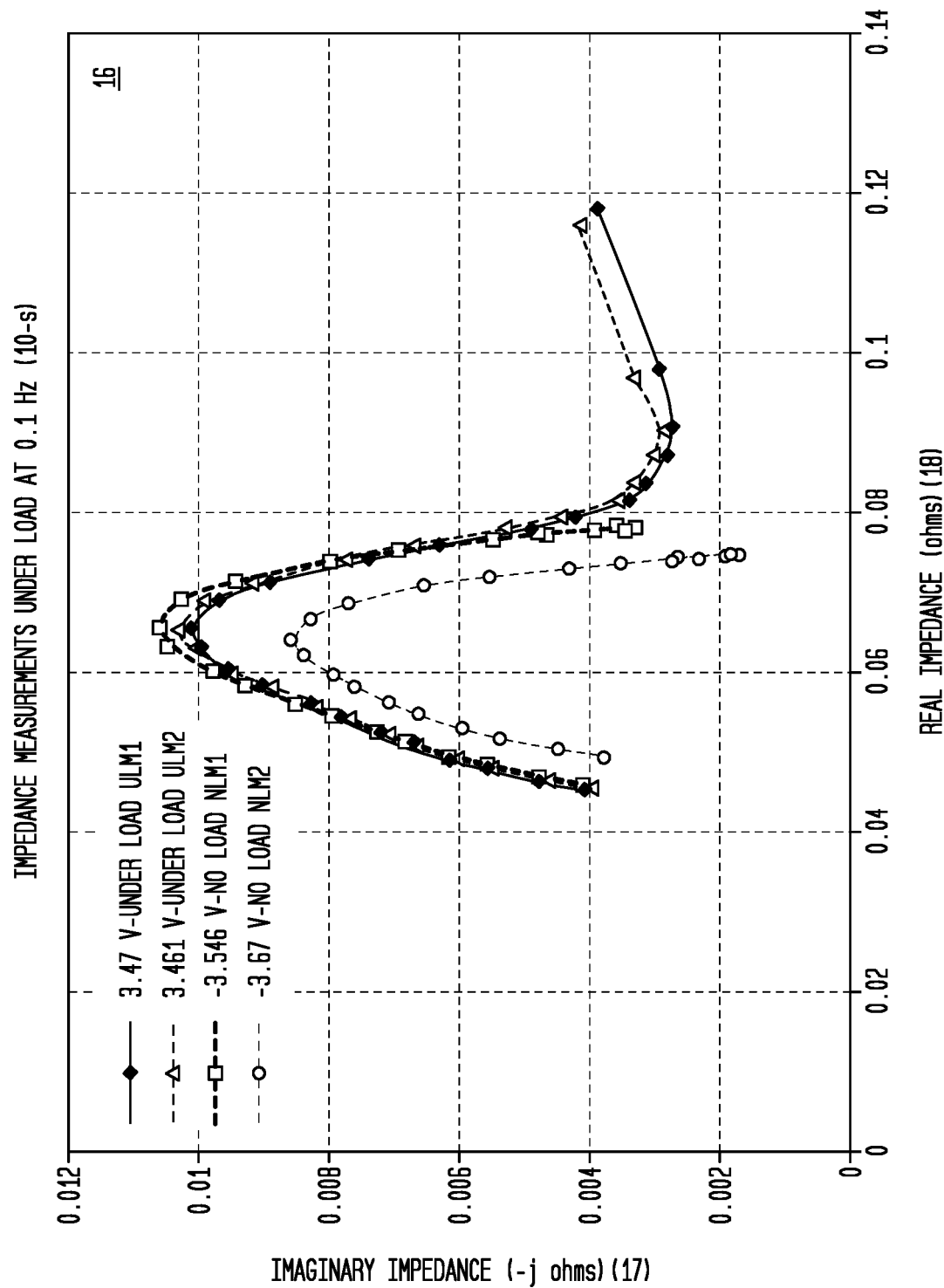

FIG. 11A depict battery impedance plots of mid-fidelity impedance measurements of a cell under load conditions and under no load conditions at a starting frequency of about 0.1 Hz which show that the impedance measurements of the cell (C) under load conditions and under no-load conditions are similar.

Figure 11B:
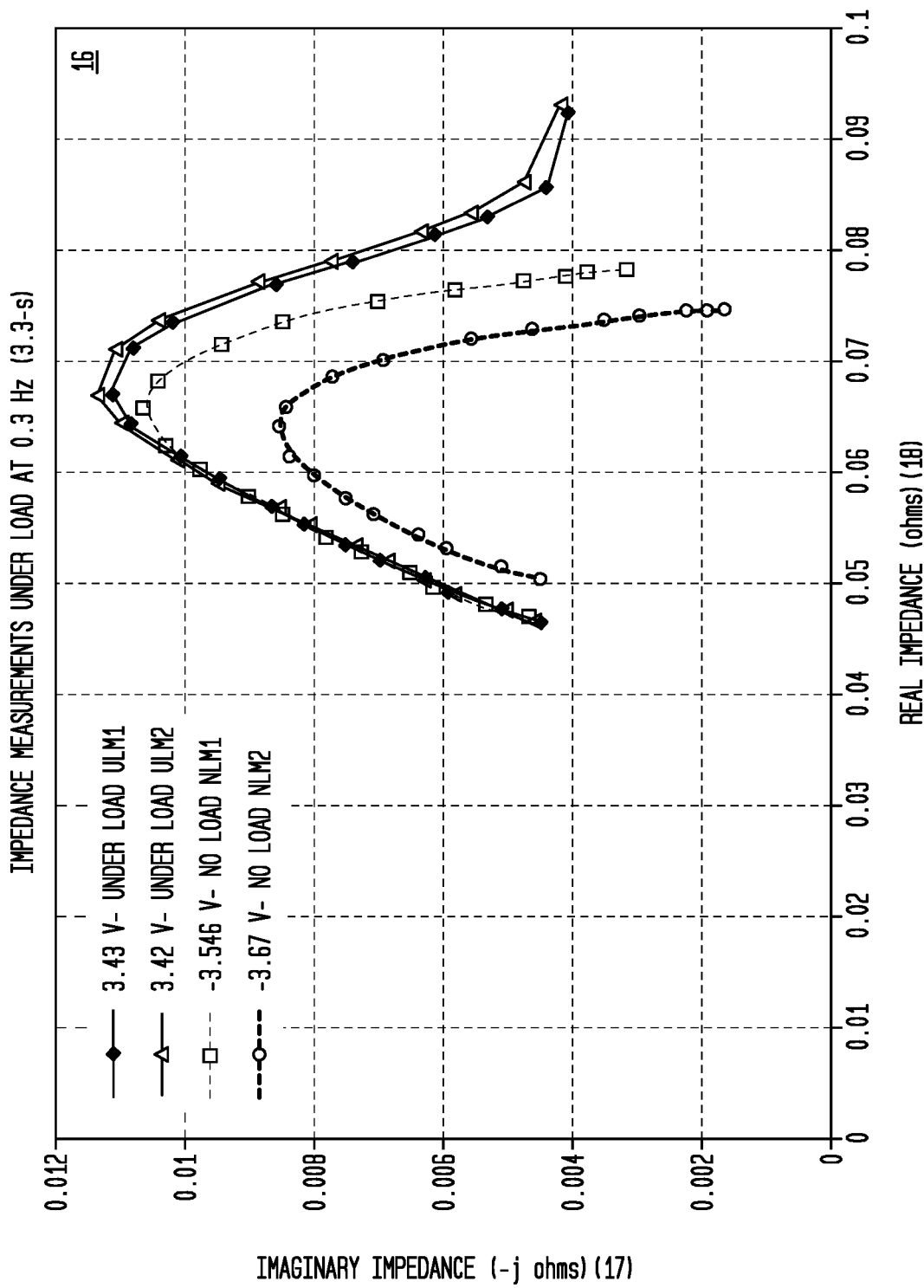

FIG. 11B depict battery impedance plots of mid-fidelity impedance measurements of a cell under load conditions and under no load conditions at a starting frequency of about 0.3 Hz which show that the impedance measurements of the cell (C) under load conditions and under no-load conditions are similar.

FIG. 11C depict battery impedance plots of mid-fidelity impedance measurements of a cell under load conditions and under no load conditions at a starting frequency of about 0.8 Hz which show that the impedance measurements of the cell (C) under load conditions and under no-load conditions are similar.

Figure 12:
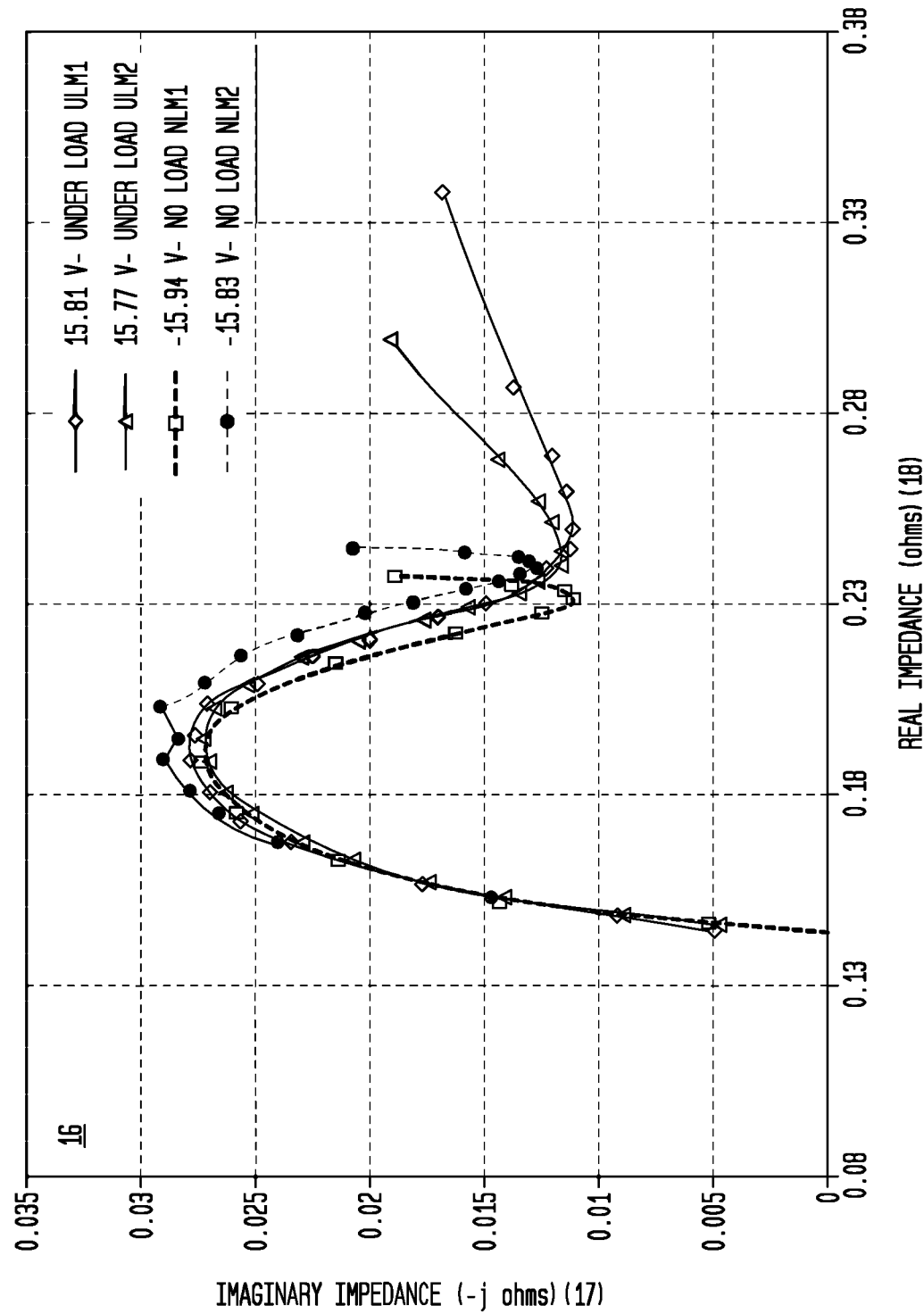

FIG. 12 depicts a battery impedance measurement plots of mid-fidelity impedance measurements of four cells electrically connected in series (CS$_s$) having one cell within the string subjected to a discharge condition under load conditions and under no load conditions at a starting frequency of about 0.1 Hz.

V. DETAILED DESCRIPTION OF THE INVENTION

Now with general reference to FIGS. 1 through 12 which provide illustrative examples of IMD (1) and iRIS (1') and methods for using impedance measurement devices (1)(1') for performing impedance measurements (2) on illustrative electrical circuits (3) including a battery (4) having a plurality of cells (cell 1, cell 2 . . . cell$_n$)(also referred to as C1, C2, . . . C$_n$) whether electrically interconnected in a series circuit (5) where the current through each of the components in the series circuit (5) is the same, and the voltage across the series circuit (5) is the sum of the voltages across each component, or in a parallel circuit (6) where the voltage across each of the components in the parallel circuit (6) is the same, and the total current is the sum of the currents flowing through each component, or combinations thereof.

In particular embodiments, the electrical circuit (3) can, but need not necessarily, include a load (7) consuming electrical power from the plurality of cells (C$_n$). In particular embodiments, the electrical circuit (3) may include a switch network (8) including a plurality of switches (9) (switch 1, switch 2 . . . switch$_n$)(also referred to as S1, S2 . . . S$_n$) which allows performance of impedance measurements (2) on all of the plurality of cells (C$_n$) in the electrical circuit (3), performance of impedance measurements (2) on a cell string (CS), or on each cell (C1, C2, . . . C$_n$) of the plurality of cells (C$_n$) independent of the other cells (C1, C2, . . . C$_n$) in a plurality of cells (C$_n$) in the electrical circuit (3). While particular illustrative examples include an IMD (1) comprising an inline rapid impedance spectroscopy device ("iRIS device" or "iRIS")(1') and methods of using an iRIS device (1'), this is not intended to preclude embodiments including or substituting other types or kinds of IMD (1) capable of generating a stimulus signal (10) to one or more cells (C1, C2, . . . C$_n$) within a plurality of cells (Ce) of a battery (4) which can, but need not necessarily, be configured as a module ("M") or pack ("P"), detecting a response signal (11) from one cell (C) or more cells (C1, C2, . . . C$_n$)

within a plurality of cells ($C_n$), and estimating the impedance (12) of the one cell (C) or more cells (C1, C2, ... $C_n$) within a plurality of cells ($C_n$).

Elements, circuits, modules, and functions may be shown in block diagram form. Moreover, specific implementations shown and described are illustrative only and should not be construed as the only way to implement the present disclosure unless specified otherwise herein. Additionally, block definitions and partitioning of logic between various blocks is illustrative of a specific implementation. However, the present disclosure may be practiced by numerous other partitioning solutions. For the most part, details concerning timing considerations and the like have been omitted where such details are not necessary to obtain a complete understanding of the present disclosure by persons of ordinary skill in the relevant art.

Those of ordinary skill would appreciate that the various illustrative logical blocks, modules, circuits, and algorithm described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

When implemented with hardware, the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. When executing software for carrying out processes for embodiments described herein, a general-purpose processor should be considered a special-purpose processor configured for carrying out such processes. A processor may also be implemented as a combination of computing devices, such as, a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, or a step depending on the application. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

Electrochemical Impedance Spectroscopy. Electrical Impedance Spectroscopy (EIS) measurements involve measuring a response signal (11) to a stimulus signal (10). This stimulus signal (10) can be either a current stimulus signal (10a) or a voltage stimulus signal (10b) with the response signal (11) measure being the complement (for example, if the stimulus signal (10) is a sum of sines (SOS) root mean square (RMS) current stimulus signal (10a) (SOS RMS current) then the response is a voltage response signal (11a), if the stimulus signal (10) is a voltage stimulus signal (10b) then the response signal (11) is a current response signal (11b)). Data processing then calculates the complex impedance (12) of the cell (4) at the stimulus signal frequency (13). This process is generally performed at each of a plurality of frequencies (13a, 13b, 13c, 13d ... ) to create an array of the complex impedances (12). Conventional use of EIS produces impedance measurements (14) that typically have a range from about 100 kHz to about 10 mHz may take an amount of time in the range of about ten minutes to about an hour to perform depending on impedance measurement parameters (31). By comparison iRIS devices (1') produce impedance measurements (14) from about 2 kHz to about 10 mHz and may take an amount of time in the range of about 1 sec to about 80 sec depending on the impedance measurement parameters (31). As illustrative examples, iRIS devices (1') can perform impedance measurements (14) from about 1.6 kHz to about 12 mHz in about 80 sec, from about 1.6 kHz to about 0.1 Hz in about 10 sec, or from about 1.6 kHz to about 0.8 Hz in about 1.2 sec, or increments between a start frequency (50) of about 1.6 kHz to about 12 mHz; although this is not intended to preclude certain embodiments including or using conventional EIS IMD (1).

In particular embodiments, the iRIS device or sensor can provide additional metrics for enhanced in-situ (and ex-situ) battery state-of-health (SOH) and state-of-stability (SOS) assessments. It can inject an excitation signal consisting of a sum of sinusoids over a broad frequency range with one period of the lowest frequency and captures the battery response. Particular embodiments of the iRIS sensor are capable of measuring batteries up to 50V having impedances down to 3 mW with 0.1 mW resolution. The measurable battery impedance can be lowered to approximately 1 mW with 0.04 mW resolution if the maximum iRIS upper voltage threshold is reduced to 10V. However, studies have shown that there is a long felt unresolved need to ensure accurate and repeatable measurements during SOH and SOS assessments (especially for subtle initial changes in battery characteristics that can indicate the onset of degradation/failure).

Thus, the iRIS system including hardware and software have been developed for higher resolution capability with improved signal-to-noise ratios and measurement repeatability. These enhancements enable higher levels of detectability in both SOH and SOS as a function of battery aging and use. Results show that a cell-level iRIS' system (<5V)

can now achieve a resolution of 4.8 mW; a 10-V system (for example, cell strings and sub-modules) can now achieve a resolution of 10.5 mW. Another advantage of these upgrades is the ability to measure lower-impedance batteries. Measurements have been conducted on test circuits, which include an RC network intended to simulate battery characteristics.

Pack, Module or Cell Impedance Plots.

Figure 1:
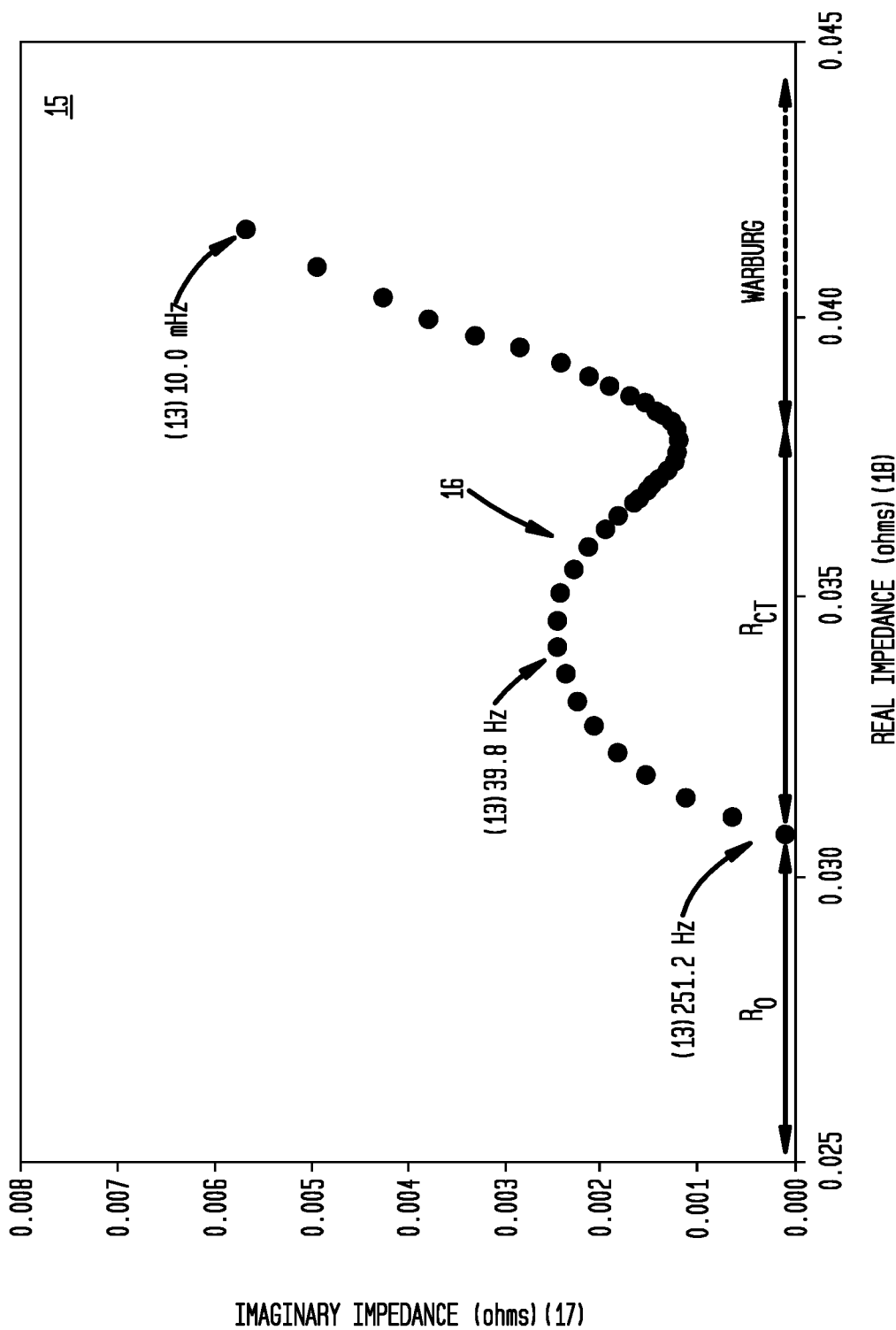
FIG. 1 illustrates a battery impedance plot of real impedance on the X axis versus imaginary impedance on the Y axis and illustrates ohmic resistance value ($R_o$) where the plot crosses the X axis, the charge transfer resistance (Rct) and the low-frequency tail referred to as the Warburg tail (Warburg).

Now with primary reference to FIG. 1, an impedance spectrum (15) is typically displayed graphically as a plot (16) similar to a standard Nyquist plot. Following convention among electrochemical researchers, these plots differ in that a negative imaginary impedance in ohms (17)(also referred to as "imaginary impedance") is plotted on the Y axis (and only positive impedance in ohms (18) (also referred to as "real impedance") of each of a plurality of stimulus signal frequencies (13) is plotted on the X axis. The ohmic resistance value ($R_o$) is the real impedance value where the plot crosses the X axis (in the example of FIG. 1, the ohmic resistance is about 251.2 Hz). The mid-frequency semicircle is the charge transfer resistance (Rct) and the low-frequency tail is often referred to as the Warburg tail ("Warburg").

Figure 2:
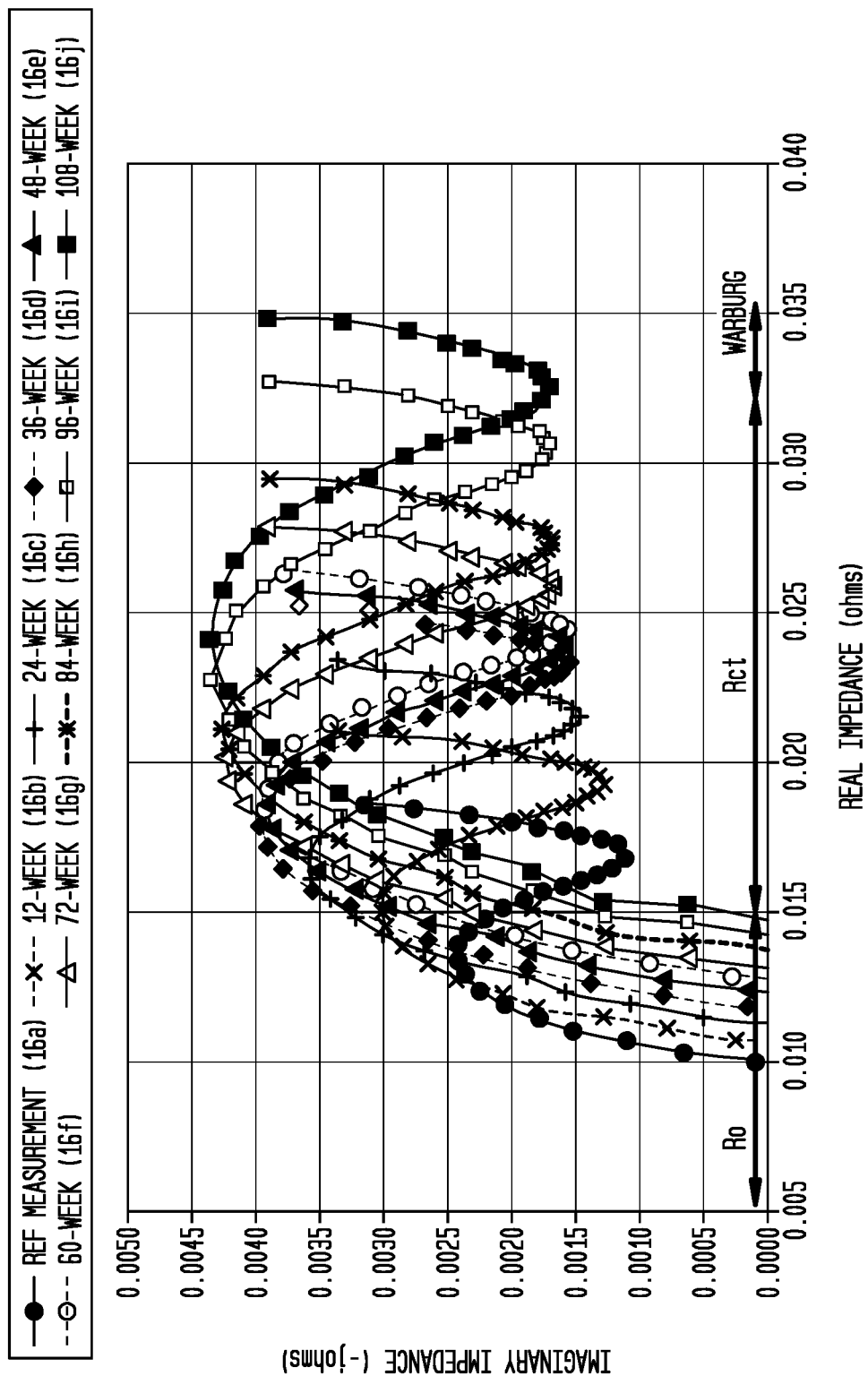
FIG. 2 illustrates a plurality of impedance spectrum as battery impedance plots $16a \ldots 16j$ showing change in impedance of a battery over time.

Now with primary reference to FIG. 2, which displays a plurality of impedance spectrum (15) as battery impedance plots (16a ... 16j) showing change in impedance of a battery (4) over time. Plot (16a) illustrates a baseline impedance measurement (14) of the battery (4). Plots (16b ... 16d) illustrate impedance measurements (14) of the battery (4) upon elapse of 12, 24, and 36 weeks, respectively. Plots (16e ... 16g) illustrate impedance measurements of the battery (4) upon elapse of 48, 60, and 72 weeks, respectively. Plots (16h ... 16j) illustrate impedance measurements of the battery (4) upon elapse of 84, 96, and 108 weeks, respectively. The semicircles within the plots, corresponding to Rct or the $R_o$, or combinations thereof, can increase as the cell ages and can thus be used to effectively estimate the battery SOH by analyzing movement of the Rct within the plots (16b ... 16j) over time.

Impedance Measurement Device. Now, with general reference to FIG. 3 which depicts circuits of an illustrative IMD (1), which can, but need not necessarily, be an iRIS device (1'), including a processor (19) in communication with a non-transitory computer readable medium (20) containing a program code (21) which implements one or more impedance spectrum algorithms (22), a sum of sines generator ("SOSG")(23); a data acquisition system ("DAS")(24); a preamplifier (25), a connection safety circuit (26) and a power supply (27). Auto calibration (28) may be included in some embodiments under control of the processor (19); although in certain embodiments, calibration can be performed as described in U.S. Pat. No. 10,436,873, hereby incorporated by reference herein. An illustrative impedance measurement device (1) suitable for use in particular embodiments can be made and used as described in U.S. Pat. No. 10,379,168, hereby incorporated by reference herein.

Examples of impedance spectrum algorithms (22) useful to process AC impedance measurement response time record (29) to determine impedance (12) as a function of the stimulus signal frequencies (13) utilized in the stimulus signal (10) to the battery (4) include, but are not limited to, harmonic compensated synchronous detection (HCSD), fast summation transformation (FST), generalized fast summation transformation (GFST), frequency cross talk compensation (FCTC), time cross talk compensation (TCTC), harmonic orthogonal synchronous transformation (HOST). See, for example, U.S. Pat. Nos. 7,688,036; 7,395,163 B1; 7,675, 293 B2; 8,150,643 B1; 8,352,204 B2; 8,762,109 B2; 8,868, 363 B2; and 9,244,130 B2, and United States Patent Publications Nos. 2011/0270559 A1; 2014/0358462 A1; and 2017/0003354 A1 (each hereby incorporated by reference herein) which describe the implementation of one more of the spectrum algorithms (22).

The IMD (1) can, but need not necessarily, include a remote computer (30)(or the computer may be local or integral to the IMD (1)) via a Universal Serial Bus (USB) interface or other suitable interface, such as, for example, hardwire serial interfaces, hardwire parallel interfaces, and wireless interfaces (as examples, WI-FI®, ZIGBEE®, BLUETOOTH®). In particular embodiments, the remote computer (30) can include all or part of the components necessary to control the 1 MB (1) to perform impedance measurements (14) (as shown in the examples of FIGS. 7 and 8) of the battery (4).

The processor (19) (whether integral to the IMD (1) or included in the remote computer (30)) can synchronize and control the DAS (24), the SOSG (23) and the preamplifier (25) in accordance with control impedance measurement parameters (31) and generate impedance measurement commands (32) to operate the IMD (1) dictated by the program code (21). In particular embodiments, the processor (19) can interface with the remote computer (30) to download desired impedance measurement parameters (31) and impedance measurement commands (32) and upload various impedance measurement data (33). As non-limiting examples, the processor (19) or memory (20), can include adequate buffer memory (34) to hold an acquired battery impedance measurement time record (29) until processed, hold the desired number of high-fidelity, mid-fidelity, or low fidelity battery impedance spectrum algorithms (22a, 22b, 22c, respectively) and the corresponding high-fidelity, mid-fidelity, or low-fidelity resolution SOS samples (22a', 22b', 22c').

The processor (19) may be configured to accept downloaded impedance measurement commands (32) and impedance measurement parameters (31) and upload to the remote computer (30) archived battery impedance measurement data (33) under direction of the remote computer (30). Additionally, the IMD (1) may be able to be controlled via human interaction in a user interface ("GUI") on the remote computer (30) or the IMD (1) for the purpose of inputting impedance measurement commands (32) and impedance measurement parameters (31) to the 1 MB (1).

When an impedance measurement (2) or targeted impedance measurement (14) of a pack (P), module (M) or cell (C) under test is triggered, the DAS (24) can send out a power up signal (35) to a power supply (27) relay to power up a DC voltage amplifier (25) and a connection safety circuit (26). The DC battery voltage (36) may be measured by a battery response amplifier (37) and input to the DAS (24) as the battery voltage analog signal (38) of the DC battery voltage (36). The DAS (24) or the processor (19) may digitize the battery voltage analog signal (38) of the DC battery voltage (36) and may send the digitized result to the remote computer (30).

When the stimulus signal (10), and in particular embodiments the SOS current (41) stimulates a battery (4) under test, the measured response signal (11) at its terminals includes the DC battery voltage (36) plus a SOS voltage response (42) of the SOS current (41) acting on the internal impedance of the battery (4). It is this SOS voltage response (42) that, when captured and processed, yields the impedance spectrum (15) of the measured battery response signal (11). To accurately detect the SOS voltage response (42), the DC battery voltage (36) can be subtracted out prior to measuring the SOS voltage response (42) allowing an analog to digital convertor (43) to focus on the desired response signal (11) which can substantially improve accuracy. This subtraction of the DC battery voltage (36) may be accomplished by measuring the DC battery voltage (36) prior to the application of the stimulus signal (11) (for example an SOS current (41)) to the battery (4) under test and then feeding back a computer generated buck voltage signal (44) to generate a buck bias voltage (39) by the battery response amplifier (37) from the total of the DC battery voltage (36) and the SOS voltage response (42) to yield only the corresponding response signal (11) (for example an SOS voltage (42)).

The remote computer (30) or the processor (19) can send a connection signal (46) to the connection safety circuit (26) to connect the battery (4) to current drivers (48) in the DC voltage amplifier (25). With the DC voltage amplifier (25) connected to the battery (4), the remote computer (30) or processor (19) sends a battery impedance measurement signal (10') such as, an SOS signal (41'), or other suitable measurement signal (10') to the DC voltage amplifier (25).

The impedance measurement signal (10') may be smoothed out using a smoothing filter (47), then fed into a current driver (48), which converts the signal into the stimulus signal (10), such as an SOS current (41). The battery response amplifier (37) in the DC voltage amplifier (25) detects the DC battery voltage (39) and subtracts the buck bias voltage (39) to become the battery response signal (11) that may be digitized by the DAS (24). The captured impedance measurement time record (29) may be processed using one or more of the spectrum algorithms (22) discussed herein to generate the impedance spectrum (15) which can be converted to impedance plots (16).

As an illustrative example, the IMD (1) can process a battery impedance spectrum (15) with at least fifteen frequencies of resolution for FST and eleven frequencies for GFST (based upon triads) or HCSD, when the start frequency is 0.1 Hz. In addition, the IMD (1) can support a dither feature (49) of high spectrum resolution with dither steps as fine as 21/4 for FST and 31/4 for GFST based upon triads. For suitable results, the captured impedance measurement time record (29) may be as low as one period of the lowest frequency and the IMD (1) may be able to process an impedance measurement time record (29) with a start frequency (50) of as low as 2 kHz or a stop frequency (51) as high as 10 kHz; however, these illustrative examples are not intended to obviate embodiments which can have a lower start frequency or a higher stop frequency.

The SOSG (23) can, under control of the processor (19) or remote computer (30), generate a zero-order hold synthesis of the SOS as an input to the DC voltage amplifier (25). As a non-limiting example, a sample rate for the SOSG digital to analog convertor (43) may be configured at least one-hundred times the highest stimulus signal frequency (13) and compatible with the smoothing filter (47) within the DC voltage amplifier (25).

In one embodiment, the SOSG (23) under control of the processor (19) can synthesize a sample clock (52) to be used by the DAS (24). FST requires a sampling frequency that is octave harmonic with the highest frequency of the SOS stimulus and is at least 4 times higher. GFST based on triads requires a sampling frequency that is triad harmonic with the highest frequency of the SOS stimulus and is at least 9 times higher. The SOSG (23) can include a programmable signal level for the DAC output to the smoothing filter (47), which enables the processor (19) to control the level of the SOS RMS current (41) to the battery (4) under test.

The DAS (23) may be configured with 16 bits of resolution and accept an external sample clock (52) from the SOSG (23). The DAS (23) may accept an enable signal from the processor (19) to start acquiring data concurrent with the application of the stimulus signal (10), such as the SOS current signal (41) to the battery (4) under test. The DAS (23) can accept the analog battery voltage signal (38) that has been conditioned by the DC voltage amplifier (25) for digitizing. The DAS (23) may include a buffer memory to hold a sample of the digitized battery voltage signal (38) for uploading to memory (20). Each of the acquired samples may become part of the time record (29) that is input into the spectrum algorithms (22), such as an FST algorithm. Additionally, the DAS (23) may acquire a measurement of the DC battery voltage (V), battery temperature (T) and battery current (I) of the battery (4), whether by the IMD (1) or via the BMS (53) which may be prior to the application of the stimulus signal (10), such as the SOS current (41). When a stimulus signal (10), such as the SOS current (41) is not being sent to the battery (4) under test, the connection to that battery (4) can be disconnected via operation of the safety circuit (26) or one or more switches in the switch network (8).

The DC voltage amplifier (25) input signal may be the zero-order hold impedance measurement signal (10'), such as an SOS signal from the SOSG (23). The DC voltage amplifier (25) may include an active Butterworth low pass filter as the smoothing filter (47) and include about 1 db of attenuation at 8 kHz and 60 db of attenuation to the frequencies introduced by the zero-order hold upon the impedance measurement signal (10'). Additionally, the BMS (53) can provide V, T, I analog or digital data to the DAS (24). All grounds in the DC voltage amplifier (25) may be brought to a single point chassis ground of an object or vehicle (54) which may contain the battery (4) or IMD (1), iRIS device (1') or BMS (53), or combinations thereof.

The impedance spectrum (15) generated during an impedance measurement (14) of a battery (4) can be passed to the processor (19) or the remote computer (30) in any suitable format (as an illustrative example: Comma Separated Values (CSV) format). Each individual impedance spectrum (15) may further include one or more of: a time stamp (55), an information header (56), the stimulus signal frequencies (13), the real impedance (18), the imaginary impedance (17) and the DC battery voltage (36) for the impedance spectrum (15), SOS RMS current (41); the magnitude and phase calibration constants (57).

In-line Rapid Impedance Spectroscopy (iRIS®). Again, with primary reference to FIG. 3, particular embodiments of the IMD (1) or iRIS device (1') can measure the impedance spectrum (15) of a battery (4), other energy storage device, or other device, or component, under test in one second or less. An iRIS device (1') can be configured to measure all of the component stimulus signal frequencies (13) of a stimulus signal (11), such as an SOS current (41), in parallel within one period of the lowest frequency (22c). In one embodiment, the iRIS device (1') can process a battery impedance spectrum (15) with at least 15 frequencies (13) of resolution for FST and 11 frequencies for GFST (based upon triads) when the start frequency (50) comprises about 0.1 Hz. In addition, the iRIS device (1') may be able to support a dither feature of high spectrum resolution with dither steps as fine as 21/4 for FST and 31/4 for GFST based upon triads. The impedance measurement time record (29) can, but need not necessarily, comprise one period of the lowest frequency (13a) and the IMD (1), or iRIS device (1') can, but need not necessarily, process a response signal (11), such as an SOS voltage (45) with a start frequency (50) of as low as about 10 mHz or a stop frequency (51) as high as about 10 kHz, as above described.

High-Fidelity AC Impedance Measurement. In particular embodiments, impedance measurements (14) used as diagnostic sensor in or with a BMS (53) can be performed on a pack (P), module (M) or individual cell (C) with high-fidelity impedance measurements (14a) to establish reference measurement (such as reference measurement 16a in the example of FIG. 2) of the pack (P), module (M), or cell (C) as a function of age or use, or combinations thereof. Battery controlled conditions (4c) can include breaks within a battery charge algorithm (58) after the battery (4)(P)(M)(C) has had a chance to electrochemically or thermally stabilize or during extended rest intervals after a discharge. As illustrative examples, impedance measurement (14) of pack (P), module (M), or cell (C) at high-fidelity (14a) can be conducted at stimulus frequencies (13) starting at about 0.0125 Hz for an 80 second ("sec") measurement or 0.025 Hz for a 40 sec measurement using 18 frequencies within the stimulus signal (10) up to 1638.4 Hz. Impedance measurement of a pack (P), module (M), or cell (C) can be conducted at varying SOC conditions (4e) during the charge algorithm (58) depending on a battery charge rate (59) (as illustrative examples: Level 1 charging (59a) may take longer than Level 2 charging (59b) or Level 3 charging (59c) or extremely fast charging ("XFC")(59d). High-fidelity impedance measurements (14a) can be conducted under battery no-load conditions (7a) or battery load conditions (7b), or combinations thereof. High-fidelity impedance measurements (14b) can, but need not necessarily, be combined with V, T, I measurements of the pack (P), module (M), or cell (C) to ascertain SOC (4d), battery load condition (14b), or other conditions of the pack (P), module (M) or cell (C). In particular embodiments, the IMD (1)(a'), remote computer (30) or the BMS (53) may also adjust impedance measurement parameters (31) such as stimulus signal frequencies (13), stimulus signal amplitude (60), impedance measurement fidelity (14a . . . 14c), impedance measurement time period (61), impedance measurement decimation (62) based on impedance measurements (14), such as detected saturation of the analog to digital converter (43).

Mid-Fidelity AC Impedance Measurement. Again, with primary reference to FIG. 3, in particular embodiments, impedance measurements (14) used as a diagnostic sensor in or with a BMS (53) can be performed on a pack (P), module (M) or individual cell (C) at mid-fidelity impedance measurements (14b) at periodic intervals during pack (P), module (M), or individual cell (C) battery use conditions (4a) or battery storage conditions (4b). As illustrative examples, AC impedance measurement of the pack (P), module (M), or individual cell (C) can be conducted at a start frequency of about 0.1 Hz for a 10 sec measurement or at about 0.2 Hz for a 5 sec measurement using 15 frequencies with the stimulus signal (10) up to 1638.4 Hz. Mid-fidelity impedance measurements (14b) may be conducted under battery no-load conditions (4a) or battery load conditions (4b), or combinations thereof. Mid-fidelity impedance measurements (14b) can, but need not necessarily, be combined with V, T, I measurements of the pack (P), module (M), or cell (C) to ascertain SOC (4d), battery load condition (14b), or other conditions of the pack (P), module (M) or cell (C). In particular embodiments, the IMD (1)(a'), remote computer (30) or the BMS (53) may also adjust impedance measurement parameters (31) such as stimulus signal frequencies (13), stimulus signal amplitude (60), impedance measurement fidelity (14a . . . 14c), impedance measurement time period (61), impedance measurement decimation (62) based on impedance measurements (14), such as detected saturation of the analog to digital converter (43).

Low-Fidelity AC Impedance Measurement. Again, with primary reference to FIG. 3, in particular embodiments, impedance measurements (14) used as a diagnostic sensor in or with a BMS (53) can be performed on a pack (P), module (M) or individual cell (C) at low-fidelity impedance measurements (14c) at periodic intervals during pack (P), module (M), or individual cell (C) during battery use (4a) or battery storage conditions (4b). Low-fidelity impedance measurement (14c) can be conducted in a lesser amount of time compared to high-fidelity or mid-fidelity impedance measurements (14a)(14b). Very fast low-fidelity impedance measurements (14c) can be used to further characterize pack (P), module (M) or individual cell (C) condition when an AC impedance measurement (14) occurs outside pre-determined impedance measurement threshold value(s) (63). As illustrative examples, upon identification of an impedance measurement (14) which occurs outside of pre-determined impedance measurement threshold value(s) (63) the processor (19), the remote computer (30) or the BMS (53) can trigger a sequence of very fast low fidelity impedance measurements (14c), such as, impedance measurements (14) starting at about 0.8 Hz for about 1.2 sec for 11 frequencies up to 1638.4 Hz. The very fast low-fidelity impedance measurements (14c) can be used to further diagnose or characterize the pack (P), module (M) or cell (C) condition. In a first instance, the low-fidelity impedance measurements (14c) can be repeated to establish whether the prior impedance measurement (14) was an anomalous non-repeatable variation from the prior impedance measurement (14) (also referred to as an "anomaly condition")(64) or repeatable variation from the prior impedance measurement (14) (also referred to as "a deviant condition")(65). If not an anomalous condition (64), then repeated very fast low impedance measurements (14c) can be used to deduce the impedance rate of change (66) in the deviant condition (65) of the pack (P), module (M), or cell (C). The impedance change rate (66) in the impedance measurement (14) can be compared to pre-determined impedance change rate threshold value(s) (67), and if the impedance change rate (66) exceeds the pre-determined impedance change rate threshold value(s) (67), the processor (19), remote computer (30) or BMS (53) can trigger activation of a warning indicator (68) (whether visual, auditory, tactile, or a combination thereof) to service or abandon the battery (4), object, device or vehicle (54) in which the pack (P), module (M) or cell (C) resides.

Switch Network. Again, with primary reference to FIG. 3, in particular embodiments, a string of cells or cell string ("CS") electrically connected in series (CSs) or parallel (CSp) can be electrically connected to a switching circuit (8) (also referred to as "a switch network") including plurality of switches (S0, S1, S2 . . . $S_n$) switchable to electrically connect one or more of the cells (C1, C2, . . . $C_n$) in a series string of cells (C1s, C2s, . . . $C_{ns}$), or electrically connect the one or more cells (C1, C2, . . . $C_n$) in a parallel string of cells (C1p, C2p, . . . $C_{np}$), or electrically connect all of the plurality of cells (C1, C2, . . . $C_n$) interconnected in series (s) and/or in parallel (p), to an IMD (1), and in particular embodiments an iRIS device (1'). The switch network (8) can be operated under control of a smart switching algorithm (70) of the program code (21) to target impedance measurements (14) at the level of the pack (P) or module (M) and then at the level of the cell (C) to rapidly determine the source of impedance measurement(s) (14) which deviate in comparison with pre-determined impedance measurement threshold value(s) (63) or pre-determined impedance measurement change rate value(s) (67).

Switching Algorithm. A switching algorithm (70) (also referred to as the "SA") under control of the, processor (19), remote computer (3), or the BMS (53) can generate a switch signal (70') to initiate and enable drill-down impedance measurements (14) using high-fidelity (14a), mid-fidelity impedance measurements (14b) or low-fidelity impedance measurements (14c) to identify a specific pack (P), module (M), or cell string (CS) or cell (C) associated with a response signal that falls outside of the pre-determined impedance measurement threshold value(s) (63). In particular embodiments, the switch algorithm (70) can, but need not necessarily, initiate impedance measurement (14) at the pack (P) or module (M) level and then switch to impedance measurement of individual cells (C). Once the specific pack (P) or module (M) associated with impedance measurement (14) exhibiting a deviant condition (65) is identified, the switching algorithm (70) enables fast low fidelity impedance measurements (14c) of strings of cells (Cs) within the pack (P) or module (M). Once the specific string of cells (CS) associated with the deviant impedance measurement (14) is identified, then the switching algorithm (70) enables fast low-fidelity impedance measurements (14c) of the individual cells (C) within the cell string (CS).

In particular embodiments, the SA (70) can be executed to conduct high-fidelity impedance measurements (14a) of the pack (P), module (M), or individual cells (C) under controlled impedance measurement conditions (4c) to evaluate pack (P), module (M) or cell (C) SOH (4e). Controlled impedance measurement conditions (4c) means a known, and preferably consistent, test cell configuration (pack, module, cell string or cell) and test cell conditions (V, I, T, SOC or other conditions); however, not necessarily in real time. As an illustrative example, this could be implemented as part of a BMS charge algorithm (58).

The SA (70) can then be executed to conduct near real-time impedance measurements (14) of the same test cell configuration (pack, module, cell string or cell) whether the object or device (54) containing the pack (P), module (M) or cell (C) is in a use condition (4a) or in a rest condition (4b) or combinations thereof. Impedance measurements (14) conducted under no-load conditions (7a) and load conditions (7b), as needed, to diagnose battery (4) SOC (4d), SOH (4e), stability (4f), or similar conditions, or combinations thereof. These impedance measurements (14) can be used to adjust power supply (27) management and battery use conditions (4a) and can estimate remaining run time based on battery use conditions (4a).

In the event the impedance measurements (14) in comparison with pre-determined impedance measurement threshold value(s) (63) deviate from the pre-determined impedance measurement threshold value(s) (63), the SA (70) can be executed to trigger real time low-fidelity impedance measurements (14a) to determine if the impedance measurement (14) comprises an anomalous condition (64) or a deviant condition (65). If determined to be a deviant condition (65), the SA (70) can trigger additional impedance measurements (14) of each cell string (CS) within a pack (P) to identify the cell string (CS) associated with the deviant condition (65). Upon determination of the cell string (CS) associated with the deviant condition (65), then the SA (70) can trigger impedance measurements (14) of each cell (C) within the cell string (CS) associated with the deviant condition (65). Once the cell (C) associated with the deviant condition (65) is identified the SA (70) can trigger repeated impedance measurements (14) of the cell (C) associated with the deviant condition (65), to determine the impedance measurement rate of change (66) of the deviant condition (65). If the deviant condition (65) or the impedance measurement rate of change (66) of the deviant condition (65) exceeds corresponding pre-determined impedance measurement threshold value(s) (63) or pre-determined impedance measurement change rate threshold value(s) (67), the SA (70) can be executed to trigger warning indicators (68) associated with the detected deviant condition (65) or impedance measurement change rate (66) of the deviant condition (65).

Impedance Measurement of Series String of Cells. Now, with primary reference to FIG. 4, which illustrates a cell string (CS) electrically interconnected in a series (CSs) where the current through each of the components in the series circuit (5) is the same, and the voltage across the series circuit (5) is the sum of the voltages across each component. The series cell string (CSs) includes a plurality of cells (C1s, C2s . . . $C_{ns}$) electrically connected to a switch network (8) including plurality of switches (Ss0, Ss1, Ss2 . . . $Ss_n$) switchable to electrically connect one or more of the plurality of cells (C1s, C2s . . . $C_{ns}$) in the series cell string (CSs) to an IMD (1) or iRIS device (1').

In the illustrative example of FIG. 4, closing switches Ss0 and Ssn and opening Ss1 and Ss2 enables impedance measurements (14) of the entire series cell string (CSs). One or more plurality of cells (C1s, C2s . . . $C_{ns}$) in the series cell string (CSs) can be isolated for impedance measurement (14) by closing or opening certain of the plurality of Ss. As one example, closing switches Ss1 and Ss2 while opening Ss0 and Ssn allows impedance measurement (14) of only C2s in the plurality of cells (C1s, C2s . . . $C_{ns}$).

In particular embodiments, C1s, C2s . . . $C_{ns}$ may each comprise a pack (P), a module (M), or an individual cell (C) connected in series (CSs) in a battery (4). In an embodiment where cell C1s is a module (M) or sub-module, rather than an individual cell in a series string, a similar switching circuit (8) can be employed with the module (M) or sub-module to allow impedance measurement (14) of a series string of modules or sub-modules with impedance measurement (14) of one or more individual cells (C). The IMD (1)(1') and associated hardware can be configured to operate under the maximum voltage across the series string of cells (CS). In particular embodiments, a load (7) can be electrically connected to the series string of cells (CS) to provide power to the load (7). IMD (1)(1') measurements of the series string of cell (CS), or one or more cells (C) within the series string of cells (CS), can be conducted by operation of the switch circuit (8) without interrupting power to the load (7).

Impedance Measurement of Parallel String of Cells. Now, with primary reference to FIG. 5, which illustrates a parallel cell string (CSp) including plurality of cells (C1p, C2p . . . $C_{np}$) electrically interconnected in a parallel where the voltage across each of the components is the same, and the total current is the sum of the currents flowing through each component in the parallel circuit. The parallel string of cells (CSp) can be electrically connected to a switching circuit (8) including plurality of switches (Sp0, Sp1, Sp2 . . . $Sp_n$) switchable to electrically connect one or more of the plurality of cells (C1p, C2p . . . $C_{np}$) in the parallel cell string (CSp) to an IMD (1) or iRIS device (1').

In the illustrative example of FIG. 5, closing all the switches Sp0 . . . $Sp_n$ enables impedance measurements (14) of the entire parallel string of cells (CSp). One or of the plurality of cells C1p, C2p . . . $C_{np}$) in the parallel cell string (CSp) can be isolated for impedance measurement (14) by closing or opening certain of the plurality of switches (Sp0, Sp1, Sp2 . . . Sp$_n$). As one example, closing switches Sp0 and Sp2 while opening Sp1 and Spn provides access directly to C2p in the parallel string of cells (CSp). The IMD (1) and associated hardware can be configured to operate under the maximum voltage across the parallel string of cells (CSp). In particular embodiments, a load (7) can be electrically connected to the parallel string of cells (CSp) to provide power to the load (7). Impedance measurements (14) of the parallel cell string (CSp), or one or more cells (C) within the parallel string of cells, cannot be conducted by operation of the switch circuit (8) without temporarily switchably isolating the cell (C) under test from the load (7) provided that the load (7) can be supported by temporary reduction in current.

Impedance Measurement of Series and Parallel String of Cells. Now, with primary reference to FIG. 6, which illustrates a plurality of cells (C1$_1$, C1$_2$, . . . C1$_n$, C2$_1$, C2$_2$, . . . C2$_n$, C$_{N1}$, C$_{N2}$, . . . C$_{Nn}$) electrically interconnected in plurality of series cell strings (CSs1, CSs2, CSsn) and the plurality of series cell strings (CSs1, CSs2, CSsn) can be electrically interconnected in parallel to provide a plurality of parallel cell strings (CSp1, CSp2, CSpn) where the current through each of the components in a series circuit is the same, and the voltage across the series circuit is the sum of the voltages across each component and where each of the voltage across each of the components in the a parallel circuit is the same, and the total current is the sum of the currents flowing through each component in the parallel circuit. The string of cells connected in series and parallel can be electrically connected to a switching circuit (8) including plurality of switches (S) switchable to electrically connect one or more of the cells (C) in a series cell string (CSs1, CSs2, CSsn), or electrically connect the one or more cells in a parallel cell string (CSp1, CSp2, CSpn), or electrically connect all of the plurality of cells (C) interconnected in series and in parallel, to an IMD (1) or iRIS device (1').

In the illustrative example of FIG. 6, closing all the switches except S01, S02, S11, S12, Sn1, and Sn2 enables impedance measurements (14) across the entire plurality of cells electrically interconnected in series or in parallel. Alternatively, an entire series cell string (CSs1, CSs2, CSsn) can be measured by an IMD (1)(1'). For example, series cell string CSs2 can be measured by closing switches S00, S10, Sb1, Sb2, Sbn, S1n, and S0n and leaving the remaining switches open. Similarly, an entire parallel cell string (CSp1, CSp2, CSpn) electrically interconnected in parallel can be measured by an IMD (1). For example, parallel cell string (CSp2) the second row of cells electrically interconnected in parallel (C21, C22, and C2n) could be measured by an 1 MB (1)(1') by closing switches S01, Sa2, S11, Sb2, Sn1, Sm2, Sn2, S12, and S02. Similarly, other combinations of strings or cells whether electrically interconnected in series and/or parallel can be measured by various combinations of open and closed switches in the switching algorithm (70). Measurement of individual cells by an IMD (1)(1') can also be achieved. For example, closing switches S01, S11, Sb2, S12, and S02 while opening all the other switches provides isolated impedance measurement (14) of C22 in the system. Accordingly, the switching algorithm (70) can enable impedance measurement at the pack (P), module (M), cell string (CS), or cell (C) level. The 1 MB (1)(1') and associated hardware can be configured to operate under the maximum voltage across the series string of cells (CS$_s$). In particular embodiments, a load (7) can be electrically connected to the cells (C) to provide power to the load (7).

Method of Triggering iRIS Measurement. Now with primary reference to FIG. 7, which provides a block flow diagram of an illustrative method of triggering an impedance measurement (14) using the switching algorithm (79). The method can include setting the switching network (8) to measure a pack (P), module (M) or all, a portion of, or one of the individual cells (C) (block M1). The method can further include setting the impedance measurement trigger conditions (71) under which the IMD (1) will trigger a measurement of the pack (P), module (M) or individual cells (C) (block M2). Examples of trigger conditions (71), include, but are not necessarily limited to, time-based triggers (example, once per hour), trigger that are responsive to changes in pack, module or cell condition (example, voltage jump to a load condition or rest condition), or a combination of both time and system response. The method can further include monitoring the pack, module, or cell for occurrence of trigger conditions to initiate an IMD (1)(1') impedance measurement (1) (block M3). The method can further include monitoring the pack (P), module (M) or cell (C) to determine whether or not the IMD (1)(1') impedance measurement (14) should be performed upon occurrence of controlled conditions (4c) (block M4). Controlled conditions (4c) can include, as illustrative examples, an extended rest period (example, a parked car) with the system at electrochemical and/or thermal equilibrium, or during charge conditions (4d) of the pack (P), module (M), or cell (C), or the charge algorithm of the pack (P), module (M) or cell (C) could be periodically paused for impedance measurements (14) to allow the pack (P), module (M) or cells (C) suitable time to allow voltages to equilibrate. Alternatively, impedance measurements (14) could wait for a particular charge load based on SOC (4d), or the like. Upon determination of performing the impedance measurement (14) under controlled impedance measurement conditions (4c) or uncontrolled conditions, the method can further include, setting the impedance measurement parameters (31) to include one or more of high-fidelity (14a), mid-fidelity (14b) or low-fidelity (14c), number of frequencies (13) within the range, stimulus (10) level, load (7) detection, or the like (blocks M5 and M6). The method can further include triggering impedance measurement (14) of the pack (P), module (M) or cell (C) for the selected switch (S) settings and impedance measurement parameters (31) (blocks M7 and M8). In particular embodiments, the method can include triggering impedance measurement (14) under controlled impedance measurement conditions (4c) at high-fidelity impedance measurement (14a) which may include longer measurement durations (such as 80 sec), lower frequency measurements, and/or a higher number of frequencies within the measurement window for enhanced analytics and point-of-reference measurements (block M9). In particular embodiments, the method can further include triggering impedance measurements (14) under uncontrolled conditions at mid-fidelity impedance measurements (14b) of relatively shorter measurement durations (such as 10 sec), and/or fewer number of frequencies (13) within the measurement window (block M10). Reasonably lower frequency measurements may be possible to ensure that the IMD (1)(1') fully captures the charge transfer resistance (R$_{ct}$), but not so low that the measurement takes too long. The method can further include detecting an anomalous condition (64) in the impedance measurement time record (29) of the impedance measurement (14) (block M11). Each measurement conducted by the IMD (1) can, but need not necessarily, be associated with or combined with BMS (53) analytics such as voltage (V), current (I), temperature (T), or analytics derivable from any other sensor. If, based on the impedance measurement (14) and BMS (53) system analytics, an anomalous condition (64) is detected, the method can further include setting the switching network (8) to perform a series of low-fidelity impedance measurements (14c) at the pack (P), module (M) and cell (C) level (block M12), and can further include in various combinations, adjusting the impedance measurement parameters (block M13) and performing impedance measurements (14) of the pack, module or cell, typically at low-fidelity (block M14), and if an anomalous condition (64) is validated is detected, warning of the anomalous condition (block M15).

Method of Assessing Battery State of Health in a Pack or Module. Now, with primary reference to FIG. 8, which provides a block flow diagram of an illustrative method of performing an impedance measurement (14) of a pack (P), module (M) or cell (C) using the switching algorithm (70). The method can include determining if the battery is in use (block N1). As illustrative examples, the method can determine if there a load (7) placed on the battery (4), under a controlled charge or an extended charge. In particular embodiments, the method can include pause steps coordinated with the charge algorithm. The method can further include setting switches (S) in the switch network (8) as needed for impedance measurement (14) of the pack (P), module (M) or cell (C) (block N2). Depending on requirements, the switch network (8) can be set a plurality of times for impedance acquisitions to enable impedance measurements of the pack (P), module (M), cell (C) or other sub-system level. The method can further include triggering impedance measurements (14) under controlled conditions such as SOC, temperature, which may not need to be real-time impedance measurements (14) (block N3). If under a charge condition, iRIS measurement can be taken at a plurality of different SOC conditions (4c) under controlled conditions. In particular embodiments, the method can further include triggering impedance measurement (14) while the pack (P), module (M) or cell (C) is in use. If the pack (P), module (M) or cell (C) is under active use, or even during periodic rest intervals during active use (such as not under a controlled charge), trigger near real-time impedance measurements (14) for in-situ battery (4) assessment. In particular embodiments remote triggering can be performed if/when needed based on OEM (or other) determination (such as, performance metrics based on fleet data) (block N4). The method can further include assessing battery analytics to determine SOH (4e), RUL, or stability (for example, instability due to cyber attack), which in particular embodiments can be combined with one or more BMS (53) analytics as needed (such as, battery power assessment, battery power management, battery capacity or battery energy fade) or combined with V, T, I sensor data for in-situ assessments (block N5). The method can further include detecting an anomalous condition (64) relating to pack, module or cell performance, stability, charge (block N6). In the event of a detected anomalous condition (64), the method can further include triggering near real time impedance measurements (14) (block N7). The method can further include confirming whether anomalous condition (65) comprises a repeatable deviant condition (65). (block N8). In the event of a non-repeatable anomalous condition (64) the system can return to normal assessment mode (block N1). In the event of a repeatable deviant condition (65), the method can further include generating a warning of the deviant condition (65) (block N9). For example, the OEM could be notified with a wireless warning indicator (68), the device, object, or vehicle (54) operator could be notified with a warning indicator (68), such as illumination of a warning light, and the BMS (53) could receive a warning that initiates appropriate controls on battery operations (such as, shutdown battery use, limit battery power consumption). The method can further include determining the source of the deviant condition (65) (blocks N10). For example, the battery system could initiate a series of switch (S) settings of the switch network (8) to isolate the specific pack (P), module (M), cell string (CS), or individual cells (C) (block N11). The method can further include triggering near real-time impedance measurements (14) of isolated pack (P), module (M), cell string (CS), or individual cell (C) (block N12). The method can further include analysis of impedance measurements (14) by comparison to pre-determined impedance measurement threshold value(s) (63) or pre-determined impedance measurement change rate threshold value(s) (67), or combinations thereof, to determine the source pack (P), module (M), or cell (C) associated with the deviant condition (65) (block N13). Upon determination of the source pack (P), module (M) or cell (C) which is the source of the deviant condition (65) (block N14), the method can further include triggering action to ensure safety of the object, device or vehicle (54) or the user (block N15).

Example I

Three Cell Series String Impedance Measurement.

Figure 3A:
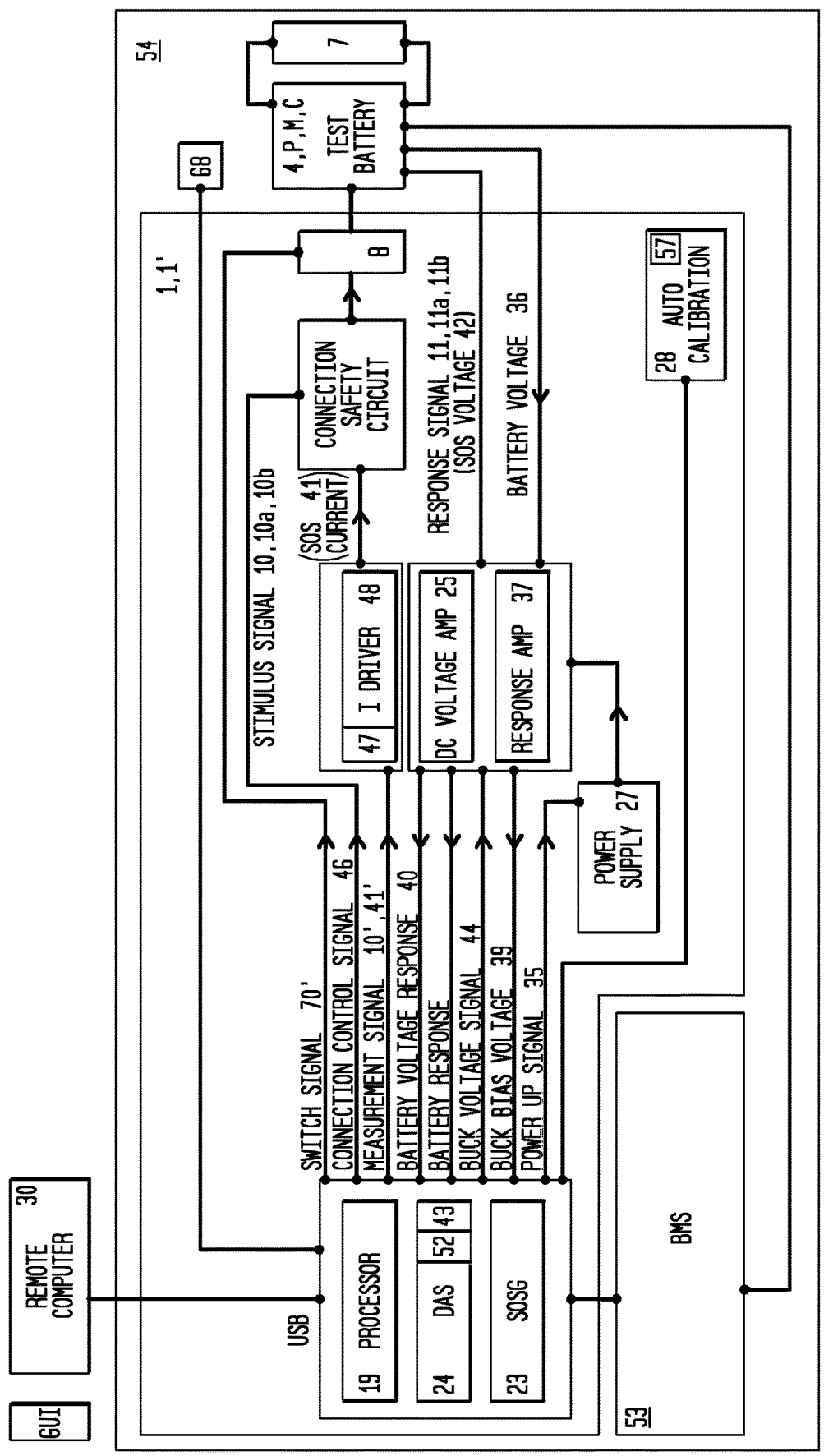
FIG. 3A depicts circuits of an illustrative impedance measurement device and battery management system disposed in a vehicle or other device.
Figure 3B:
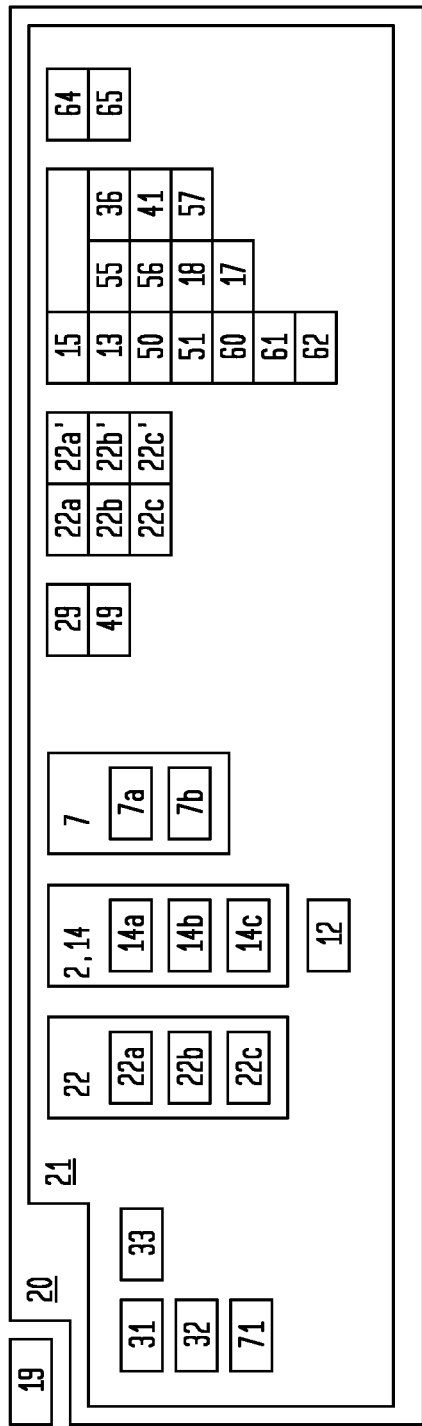
FIG. 3B is an enlargement of the processor and memory depicted in FIG. 3A.

FIG. 9A includes battery impedance plots (16) of real impedance (18) on the X axis versus imaginary impedance (17) on the Y axis obtained by performing a plurality of impedance measurements (14) of three cells electrically interconnected in series cell string ($CS_s$) at high-fidelity impedance measurement (14a) and at a mid-fidelity impedance measurement (14b)(as shown in the illustrative example of FIG. 3B). High-fidelity impedance measurements (14a) were conducted under normal conditions, without cell anomalous or deviant condition(s) (64)(65), under controlled conditions (4c) (Controlled Measurement A and Controlled Measurement B). In this case, the impedance measurement parameters (31) included a start frequency (50) of 0.0125 Hz and a stop frequency (51) of 1638.4 Hz with eighteen total frequencies included in the impedance measurement (14) of 80 sec. The HCSD analysis algorithm was to generate the impedance spectra (15). As shown by the battery impedance plots (16), during batter use over a period of time, the impedance spectra (15) for Controlled Measurement B has shifted to the right of Controlled Measurement A due to aging of the three cells electrically connected in series ($CS_s$). Additionally, during the period in which the three cells electrically connected in series ($CS_s$) was in use In-Use Measurements ("IUM") at mid-fidelity (14b) were conducted to assess aging and stability of the three cells electrically interconnected in series ($CS_s$). In-Use Measurements can be conducted under load conditions (7a) or no-load conditions (7b) depending on the setting for the impedance measurement trigger conditions (71). In the example of FIG. 9A, the impedance measurement parameters (31) included HDHCSD with a start frequency (50) of 0.1 Hz up to a stop frequency (51) of 409.6 Hz with 24 total frequencies included in a 10 sec impedance measurement (14). As shown by the In-Use Measurements, impedance of the three cells increases causing a shift to the right between In-Use Measurement impedance plots (IUM 1, IUM 2, IUM 3) during use of the three-cell series string ($CS_s$) and generally comports with the expected increase in impedance between Controlled Measurement A and Controlled Measurement B.

Example II

Three Cell Series String Impedance Measurement—Anomaly Detection.

FIG. 9B includes battery impedance plots (16) of a high-fidelity impedance measurement (14a)(Controlled Measurement B) across the series string of three cells ($CS_s$) as shown in FIG. 9A, and a subsequent mid-fidelity impedance measurement (14b) (In-Use Measurement 4 (IUM 4)) of the series string of three cells ($CS_s$) indicative of an anomalous condition (64) by the substantial comparative increase in the impedance of the series string of three cells ($CS_s$). This apparent deviation can be the basis for resetting impedance measurement parameters (31) and performance of a plurality of rapid low-fidelity impedance measurements (14c) and further determination if the anomalous condition (64) is a repeatable impedance measurement (65) indicating a deviation condition (65) relating to failure of the SOH (4e) or stability of the series string of three cells ($CS_s$).

Example III

Three Cell Series String Impedance Measurement—Anamoly Condition.

FIG. 9C includes battery impedance plots (16) of a high-fidelity impedance measurement (14a) (Controlled Measurement B) across the series string of three cells ($CS_s$) and IUM 4 as shown in FIG. 9B, and a subsequent plurality of low-fidelity impedance measurements (14c) (Rapid Verification Measurements 1 and 2 (RVM 1 and RVM 2)) of the series string of three cells ($CS_s$) indicative of non-repeatable anomaly condition (64) (IUM 4). After In-Use Measurement 4, a series of low-fidelity impedance measurements (14c) (RVM 1 and RVM 2) were triggered. In this example, the impedance measurement parameters (31) were HDHCSD with a start frequency (50) of 0.8 Hz and a stop frequency (51) of 409.6 Hz with 18 total frequencies included in the impedance measurement (14) over 1.2 sec. As shown in this example, the RVM 1 and RVM 2 shift to the left and approach the Controlled Measurement B indicating that In-Use Measurement 4 was a non-repeatable anomalous condition (64). Anomalous conditions (64) can be result from any one or a combination of sources including noisy data acquisition, interrupted impedance measurement, measurements during a transition from rest (7b) to load (7a) (or load to rest or change in load) of the series three cell string.

Example IV

Three Cell Series String Impedance Measuremant—Deviation Verification.

FIG. 9D includes battery impedance plots (16) of a high-fidelity impedance measurement (14a)(Controlled Measurement B) across the series string of three cells ($CS_s$) and IUM 4 as shown in FIG. 9C, and a subsequent plurality of low-fidelity impedance measurements (14c) (Rapid Verification Measurements (RVM 3 and RVM 4)) of the series string of three cells indicative of a impedance measurement IUM 4. After In-Use Measurement 4, a series of low-fidelity impedance measurements (14c)(RVM 3 and RVM 4) were triggered. In this example, the impedance measurement parameters (31) are HDHCSD with a start frequency (50) of 0.8 Hz and a stop frequency (51) of 409.6 Hz with 18 total frequencies included in the impedance measurement (14) over 1.2 sec. As shown in this example, the RVM 3 and RVM 4 shift to the right and away from IUM 4 indicating that In-Use Measurement 4 was a repeatable deviation in the impedance measurement (14). These data indicate a need to drill-down by adjusting switch network (8) settings) to identify the problematic cell (C). While this example is of a series three-cell string ($CS_s$), a drill-down on a greater number of cells can be conducted by subsequent adjusting the switch network (8) and additional impedance measurements (14).

Example V

Three Cell Series String Impedance Measurement—Failure Detection.

FIG. 9E includes battery impedance plots (16) of low-fidelity impedance measurement (14c) Rapid Failure Detection Measurements of each of Cell 1 (RFDM 1), Cell 2 (RFDM 2), and Cell 3 (RFDM 3) of the series string of three cells ($CS_s$) indicative of failure of Cell 2 in the series string of three cells ($CS_s$). Once a repeatable deviant condition (65) has been confirmed as shown in the example of FIG. 9D, the switch network (8) can be adjusted to serially perform low-fidelity impedance measurements (14c) of Cell 1, Cell 2, and Cell 3 within the three-cell series string ($CS_s$). While this example was conducted under no-load conditions (7b) of the three-cell series string, it can also be conducted under load conditions (7a). Impedance measurements (14) were conducted using the low-fidelity impedance measurement (14c) settings as used in the example of FIG. 9D. As shown in the impedance plots of Cells 1-3, Cell 2 has a significantly different impedance spectrum (15) as compared to Cell 1 and Cell 3. Cell 2 has failed. Once identified, appropriate warning indicators (68) can be generated and further IMD (1)(1') measurements or analytics initiated to determine if the failure is related to SOH (4e) cell stability, or other identifiable condition.

Example VI

Four Cell Parallel String Impedance Measurement.

FIG. 10A includes battery impedance plots (16) of real impedance (18) on the X axis versus imaginary impedance (17) on the Y axis obtained by performing a plurality of impedance measurements of four cells electrically interconnected in parallel ($CS_p$) at high-fidelity (14a) and at mid-fidelity (14b)(as shown in the illustrative example of FIG. 3B). High-fidelity impedance measurements (14a) were conducted under normal conditions, without cell anomalies, under controlled conditions (Controlled Measurement A and Controlled Measurement B). In this case, the impedance measurement parameters (31) included a start frequency (50) of 0.0125 Hz and a stop frequency (51) of 1638.4 Hz with eighteen total frequencies included in the impedance measurement (14) of 80 sec. HCSD analysis algorithm was used to determine the impedance spectra (15). As shown by the battery impedance plots (16), during use over a period of time, the impedance spectra (15) for Controlled Measurement B has shifted to the right of Controlled Measurement A due to aging of the four cells electrically connected in parallel ($CS_p$). Additionally, during the period in which the four cells electrically connected in parallel ($CS_p$) was in use In-Use Measurements ("IUM") at mid-fidelity (14b) were conducted to assess aging and stability of the four cells electrically interconnected in parallel ($CS_p$). In-Use Measurements can be conducted under load (7) or no-load conditions depending on the impedance measurement trigger conditions (71). In the example of FIG. 10A, the impedance measurement parameters (31) included HDHCSD with a start frequency (50) of 0.1 Hz and a stop frequency (51) of 409.6 Hz with 24 total frequencies included in a 10 sec impedance measurement (14). As shown by the In-Use Measurements, impedance of the parallel four cell string ($CS_p$) increases causing a shift to the right between In-Use Measurement impedance plots (IUM 1, IUM 2, IUM 3) during use of the parallel four cell string ($CS_p$) and generally comports with the expected increase in impedance between Controlled Measurement A and Controlled Measurement B.

Example VII

Four Cell Parallel String Impedance Measurement—Anomaly Detection.

FIG. 10B includes battery impedance plots (16) of a high-fidelity impedance measurement (14a) Controlled Measurement B across the parallel string of four cells ($CS_p$) as shown in FIG. 10A, and subsequent mid-fidelity impedance measurement (14b) In-Use Measurement 4 (IUM 4) of the parallel string of four cells ($CS_p$) indicative of an anomalous impedance measurement condition (64) by the substantial comparative increase in the impedance of the parallel string of four cells ($CS_p$). This apparent anomalous condition (64) can be the basis for resetting impedance measurement parameters (31) and performance of a plurality of rapid low-fidelity impedance measurements (14c) and further determination if the anomaly condition (64) is a non-repeatable anomaly or a repeatable deviant condition (65) relating to failure of the SOH (4e) of the parallel string of four cells.

Example VIII

Four Cell Parallel String Impedance Measurement—Anomaly Verification.

FIG. 10C includes battery impedance plots (16) of a high-fidelity impedance measurement (14a) Controlled Measurement B across the parallel string of three cells and IUM 4 as shown in FIG. 10B, and a subsequent plurality of low-fidelity impedance measurements (14c) Rapid Verification Measurements (RVM 1 and RVM 2) of the parallel string of four cells ($CS_p$) indicative of a non-repeatable anomaly condition (64) IUM 4. After In-Use Measurement 4, a series of low-fidelity impedance measurements (14c) RVM 1 and RVM 2 were triggered. In this example, the impedance measurement parameters (31) were HDHCSD with a start frequency (5)) of 0.8 Hz and a stop frequency (51) of 409.6 Hz with 18 total frequencies included in the impedance measurement (14) over 1.2 sec. As shown in this example, the RVM 1 and RVM 2 shift to the left and approach the Controlled Measurement B indicating that In-Use Measurement 4 was non-repeatable anomaly condition (64). Anomalous conditions (64) can be from any one or a combination of sources including noisy data acquisition, interrupted impedance measurement (14), impedance measurements (14) during a transition from rest to load (7) (or load to rest or change in load) of the parallel four cell string ($CS_p$).

Example IX

Four Cell Parallel String Impedance Measurement—Deviation Verification.

FIG. 10D includes battery impedance plots (16) of a high-fidelity impedance measurement (14a) Controlled Measurement B across the parallel string of four cells ($CS_p$) and IUM 4 as shown in FIG. 10C, and a subsequent plurality of low-fidelity impedance measurements (14c) Rapid Verification Measurements (RVM 3 and RVM 4) of the parallel string of four cells ($CS_p$). After In-Use Measurement 4, a series of low-fidelity impedance measurements RVM 3 and RVM 4 were triggered. In this example, the settings are HDHCSD with a starting frequency of 0.8 Hz up to 409.6 Hz with 18 total frequencies included in the measurement over 1.2 seconds. As shown in this example, the RVM 3 and RVM 4 shift to the right and away from IUM 4 indicating that In-Use Measurement 4 was repeatable impedance measurement (14) indicating a deviation condition (65). These impedance measurements (14) indicate a need to drill-down by adjustment of the switch network (8) to identify the cell (C) that is the source of the deviant condition (65) provided that the load can tolerate lower current with isolated cells, or a cell balancing scheme is not active. While this example is of a parallel four cell string ($CS_p$), a drill-down on a greater number of cells (C) can be conducted by subsequent adjusting the switch network (8) and additional impedance measurements (14).

Example X

Four Cell Parallel String Impedance Measurement—Failure Detection.

FIG. 10E includes battery impedance plots (16) of low-fidelity impedance measurements (14c) Rapid Failure Detection Measurements of each of Cell 1 (RFDM 1), Cell 2 (RFDM 2), Cell 3 (RFDM 3) and Cell 4 (RFDM 4) of the parallel string of fours cells ($CS_p$) indicative of failure of Cell 1 in the parallel string of four cells ($CS_p$). Once the deviant condition (65) has been confirmed as shown in the example of FIG. 10D, the switch network (8) can be serially adjusted to conduct low-fidelity impedance measurements (14c) and individually measure impedance of Cell 1, Cell 2, Cell 3, and Cell 4 within the four-cell parallel string ($CS_p$). While this example was conducted under no-load conditions (7a) of the four-cell parallel string ($CS_p$), it can also be conducted under load conditions (7b). IMD (1)(1') measurements were conducted using the low-fidelity measurement parameters (14b) as used in the example of FIG. 10D. As shown in the impedance plots (16) of Cells 1-4, Cell 1 has a significantly different impedance spectrum (15) as compared to Cell 2, Cell3 and Cell 4. Cell 1 has failed. Once identified, appropriate warning indicators (68) can be generated and further impedance measurements (14) or analytics initiated to determine if the failure is related to SOH (4e) or related to cell stability.

Example XI

Impedance Measurement of a Cell Under Load Conditions and Under No-Load Conditions at 0.1 Hz.

Figure 3C:
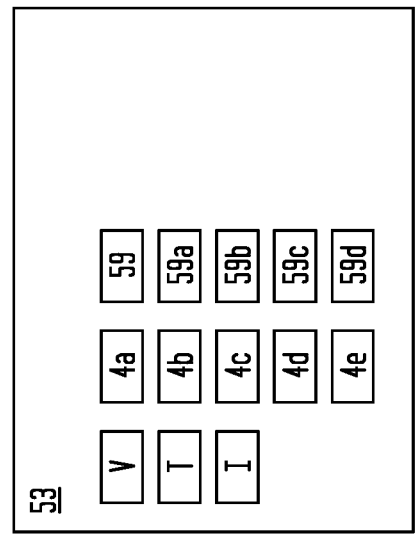
FIG. 3C is an enlargement of the BMS depicted in FIG. 3A.

FIG. 11A includes battery impedance plots (16) of mid-fidelity impedance measurements of a cell under load conditions (7a)(as shown in the example of FIG. 3) and under no load conditions (7b). As above described, the switching network (8) can be set to conduct impedance measurements under no-load (7b) or load conditions (7a) for advanced battery analytics, diagnostics and prognostics. In this example, two impedance measurements (14) (ULM1 and ULM2) of a cell (C) under load conditions (7a) were conducted with a start frequency (50) of 0.1 Hz for 10 sec and two impedance measurements (14) (NLM1 and NLM2) were conducted under no load conditions (7b) with a start frequency (50) of 0.1 Hz for 10 sec. These single-cell impedance measurements (14) were conducted when the cell (C) was being discharged from 3.67 V to 3.3 V (the measurement at 3.546 V was after the discharge to 3.3 V and subsequent rest where the voltage recovered). The impedance plots (16) evidence that the impedance measurements (16) of the cell (C) under load conditions (7a) and under no-load conditions (7b) are similar, but there are greater low-frequency effects under load due to the different rate of diffusion under load conditions.

Example XII

Impedance Measurement of a Cell Under Load Conditions and Under No-Load Conditions at 0.3 Hz.

FIG. 11B includes battery impedance plots (16) of low-fidelity impedance measurements (14c) of a cell (C) under load conditions (7a) and under no load conditions (7b). As above described, the switch network (8) can be set to conduct impedance measurements (14) under no-load or load conditions (7a) (7b) for advanced battery analytics, diagnostics and prognostics. In this example, two impedance measurements (14) (ULM1 and ULM2) of a cell (C) under load conditions (7a) were conducted with a start frequency (50) of 0.3 Hz for 3.3 sec and two impedance measurements (14) (NLM1 and NLM2) were conducted under no load conditions (7b) with a start frequency (50) of 0.3 Hz for 3.3 sec. These single-cell impedance measurements (14) were conducted when the cell (C) was being discharged from 3.67 V to 3.3 V (the measurement at 3.546 V was after the discharge to 3.3 V and subsequent rest where the voltage recovered). The impedance plots (16) evidence that the impedance measurements (16) of the cell (C) under load conditions (7a) and under no-load conditions (7b) are similar, but there are greater low-frequency effects under load due to the different rate of diffusion under load conditions.

Example XIII

Impedance Measurement of a Cell Under Load Conditions and Under No-Load Conditions at 0.8 Hz.

FIG. 11C includes battery impedance plots (16) of low-fidelity impedance measurements (14c) of a cell (C) under load conditions (7a) and under no load conditions (7b). As above described, the switch network (8) can be set to conduct impedance measurements (14) under no-load conditions (7b) or load conditions (7a) for advanced battery analytics, diagnostics and prognostics. In this example, two under impedance measurements (14) (ULM1 and ULM2) of a cell (C) under load conditions (7a) were conducted with a start frequency (50) of 0.8 Hz for 1.2 seconds and two impedance measurements (NLM1 and NLM2) were conducted under no load conditions (7b) with a start frequency (50) of 0.8 Hz for 1.2 seconds. These single-cell impedance measurements (14) were conducted when the cell (c) was being discharged from 3.67 V to 3.3 V (the measurement at 3.546 V was after the discharge to 3.3 V and subsequent rest where the voltage recovered). The impedance plots (16) evidence that the impedance measurements (14) of the cell (C) under load conditions (7a) and under no-load conditions (7b) are similar, but there are greater low-frequency effects under load due to the different rate of diffusion under load conditions.

Example XIV

Impedance Measurement of a Four Cell Series String Under Load Conditions and Under No-Load Conditions at 0.1 Hz.

FIG. 12A is a battery impedance plot (16) of mid-fidelity impedance measurements (14) of four cells electrically connected in series ($CS_s$) under load conditions (7a) and under no load conditions (7b). In this example, two impedance measurements (ULM1 and ULM2) of a cell (C) were conducted under load conditions (7a) with a start frequency (50) of 0.1 Hz for 10 sec and two impedance measurements (14) (NLM1 and NLM2) were conducted under no load conditions (7b) with a start frequency (50) of 0.1 Hz for 10 sec. In this example, the four cell series string ($CS_s$), has one cell within the string subjected to a discharge condition to simulate, for example, a soft short condition if the four cell series string ($CS_s$) was under no load conditions (7b). With only one cell (C) subjected to a load condition (7a), the four-cell string (Cs) still clearly shows a change in the low-frequency tail which can be used an indicator to trigger low-fidelity impedance measurements (14c). Otherwise, the impedance spectra (15) are very similar for the ohmic and charge transfer resistances. If there is no load condition (7b), but the low-frequency Warburg tail droops, indicating the presence of a load (7), that can be an indication of a soft short condition which can trigger rapid low-fidelity impedance measurements. (14c)

As can be easily understood from the foregoing, the basic concepts of the present invention may be embodied in a variety of ways. The invention involves numerous and varied embodiments of an IMD configured to perform in-line rapid impedance spectroscopy to provide rapid, broadband impedance measurements of battery packs, modules or cells using targeted frequency ranges under the operation of a switch network and switching algorithm to rapidly identify the source of anomalous impedance measurements which indicates failing or failure of one or more cells in a pack or module and methods for making and using such IMD, switch networks and switching algorithms including the best mode.

As such, the particular embodiments or elements of the invention disclosed by the description or shown in the figures or tables accompanying this application are not intended to be limiting, but rather illustrative of the numerous and varied embodiments generically encompassed by the invention or equivalents encompassed with respect to any particular element thereof. In addition, the specific description of a single embodiment or element of the invention may not explicitly describe all embodiments or elements possible; many alternatives are implicitly disclosed by the description and figures.

It should be understood that each element of an apparatus or each step of a method may be described by an apparatus term or method term. Such terms can be substituted where desired to make explicit the implicitly broad coverage to which this invention is entitled. As but one example, it should be understood that all steps of a method may be disclosed as an action, a means for taking that action, or as an element which causes that action. Similarly, each element of an apparatus may be disclosed as the physical element or the action which that physical element facilitates. As but one example, the disclosure of a "impedance measure" should be understood to encompass disclosure of the act of "impedance measuring"—whether explicitly discussed or not—and, conversely, were there effectively disclosure of the act of "impedance measuring", such a disclosure should be understood to encompass disclosure of a "impedance measure" and even a "means for impedance measuring." Such alternative terms for each element or step are to be understood to be explicitly included in the description.

In addition, as to each term used it should be understood that unless its utilization in this application is inconsistent with such interpretation, common dictionary definitions should be understood to be included in the description for each term as contained in Merriam-Webster's Collegiate Dictionary, each definition hereby incorporated by reference.

All numeric values herein are assumed to be modified by the term "about", whether or not explicitly indicated. For the purposes of the present invention, ranges may be expressed as from "about" one particular value to "about" another particular value. When such a range is expressed, another embodiment includes from the one particular value to the other particular value. The recitation of numerical ranges by endpoints includes all the numeric values subsumed within that range. A numerical range of one to five includes for example the numeric values 1, 1.5, 2, 2.75, 3, 3.80, 4, 5, and so forth. It will be further understood that the endpoints of each of the ranges are significant both in relation to the other endpoint, and independently of the other endpoint. When a value is expressed as an approximation by use of the antecedent "about," it will be understood that the particular value forms another embodiment. The term "about" generally refers to a range of numeric values that one of skill in the art would consider equivalent to the recited numeric value or having the same function or result. Similarly, the antecedent "substantially" means largely, but not wholly, the same form, manner or degree and the particular element will have a range of configurations as a person of ordinary skill in the art would consider as having the same function or result. When a particular element is expressed as an approximation by use of the antecedent "substantially," it will be understood that the particular element forms another embodiment.

Moreover, for the purposes of the present invention, the term "a" or "an" entity refers to one or more of that entity unless otherwise limited. As such, the terms "a" or "an", "one or more" and "at least one" can be used interchangeably herein.

Thus, the applicant(s) should be understood to claim at least: i) each of the IMD, switch networks, and switching algorithms herein disclosed and described, ii) the related methods disclosed and described, iii) similar, equivalent, and even implicit variations of each of these devices and methods, iv) those alternative embodiments which accomplish each of the functions shown, disclosed, or described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) methods and apparatuses substantially as described hereinbefore and with reference to any of the accompanying examples, x) the various combinations and permutations of each of the previous elements disclosed.

The background section of this patent application provides a statement of the field of endeavor to which the invention pertains. This section may also incorporate or contain paraphrasing of certain United States patents, patent applications, publications, or subject matter of the claimed invention useful in relating information, problems, or concerns about the state of technology to which the invention is drawn toward. It is not intended that any United States patent, patent application, publication, statement or other information cited or incorporated herein be interpreted, construed or deemed to be admitted as prior art with respect to the invention.

The claims set forth in this specification, if any, are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent application or continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

Additionally, the claims set forth in this specification, if any, are further intended to describe the metes and bounds of a limited number of the preferred embodiments of the invention and are not to be construed as the broadest embodiment of the invention or a complete listing of embodiments of the invention that may be claimed. The applicant does not waive any right to develop further claims based upon the description set forth above as a part of any continuation, division, or continuation-in-part, or similar application.

The invention claimed is:

1. A device, comprising:
  a processor communicatively coupled to a non-transitory computer readable media containing a program code including:
    a high-fidelity cell impedance spectrum algorithm, a mid-fidelity cell impedance spectrum algorithm, and a low fidelity cell impedance spectrum algorithm; and
    a switching algorithm;
  a switching circuit controlled by said switching algorithm under control of said processor to connect a plurality of cells to said impedance measurement device, said switching circuit switchable to electrically connect said plurality of cells ($C1, C2, \ldots C_n$) in a series string of cells ($C1s, C2s, \ldots C_{ns}$), or electrically connect said plurality of cells ($C1, C2, C_n$) in a parallel string of cells ($C1p, C2p, \ldots C_{np}$) or electrically connect all of said plurality of cells ($C1, C2, \ldots C_n$) interconnected in a series string of cells (s) and/or in a parallel string of cells (p); and
  an impedance measurement device controlled by said program code to:
    apply one or more of a high-fidelity stimulus signal, a mid-fidelity stimulus signal, or a low fidelity cell stimulus signal to said plurality of cells;
    detect a response signal to said one or more of said high-fidelity stimulus signal, said mid-fidelity stimulus signal or said low fidelity stimulus signal applied to said plurality of cells;
    process said response signal to said one or more of said high-fidelity stimulus signal, said mid-fidelity stimulus signal, or said low fidelity stimulus signal applied to said plurality of cells; and correspondingly generate a high-fidelity impedance measurement spectrum, a mid-fidelity impedance measurement spectrum, or a low-fidelity impedance measurement spectrum.

2. The device of claim 1, wherein said plurality of cells can comprise a pack, a module, sub-module, or individual cells within a pack, a module or a sub-module.

3. The device of claim 1, said program code further executable to assess a controlled in-use cell condition or a controlled rest cell condition of said plurality of cells.

4. The device of claim 3, wherein said program code executable to:

perform a high-fidelity impedance measurement of said plurality of cells;

detect an anomalous condition in said plurality of cells based on a deviation of said high-fidelity impedance measurement to a preselected impedance measurement threshold; and repeatedly perform a low-fidelity impedance measurement of said plurality of cells within a pack or module to identify a cell string or a cell within said plurality of cells associated said deviation of said high-fidelity impedance measurement to said preselected impedance measurement threshold.

5. The device of claim 4, wherein said high-fidelity impedance measurement includes a greater number of stimulus signal frequencies than said low-fidelity stimulus signal.

6. The device of claim 5, wherein said high-fidelity impedance measurement includes a longer measurement duration than said low-fidelity impedance measurement.

7. The device of claim 1, wherein said program code further executable to:

analyze said one or more of said high-fidelity impedance measurement spectrum, said mid-fidelity impedance measurement spectrum, or said low-fidelity impedance measurement spectrum; and update a stability of said plurality of cells.

* * * * *